(12) United States Patent
Hioka et al.

(10) Patent No.: US 11,158,388 B2
(45) Date of Patent: Oct. 26, 2021

(54) SEMICONDUCTOR MEMORY DEVICE

(71) Applicant: Toshiba Memory Corporation, Tokyo (JP)

(72) Inventors: Takeshi Hioka, Machida (JP); Tsukasa Kobayashi, Machida (JP); Koji Kato, Yokohama (JP); Yuki Shimizu, Kamakura (JP); Hiroshi Maejima, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 17/103,230

(22) Filed: Nov. 24, 2020

(65) Prior Publication Data

US 2021/0082523 A1 Mar. 18, 2021

Related U.S. Application Data

(63) Continuation of application No. 16/429,680, filed on Jun. 3, 2019, now Pat. No. 10,892,020.

(30) Foreign Application Priority Data

Jun. 26, 2018 (JP) .............................. JP2018-121151

(51) Int. Cl.
| | |
|---|---|
| *G11C 16/26* | (2006.01) |
| *G11C 16/24* | (2006.01) |
| *G11C 16/08* | (2006.01) |
| *H01L 27/11568* | (2017.01) |
| *G11C 16/10* | (2006.01) |
| *H01L 27/11582* | (2017.01) |
| *G11C 16/30* | (2006.01) |

(52) U.S. Cl.
CPC .............. *G11C 16/26* (2013.01); *G11C 16/08* (2013.01); *G11C 16/10* (2013.01); *G11C 16/24* (2013.01); *G11C 16/30* (2013.01); *H01L 27/11568* (2013.01); *H01L 27/11582* (2013.01)

(58) Field of Classification Search
CPC .......... G11C 16/26; G11C 16/08; G11C 16/24
See application file for complete search history.

(56) References Cited

U.S. PATENT DOCUMENTS

| | | |
|---|---|---|
| 2002/0031027 A1 | 3/2002 | Suematsu et al. |
| 2002/0036317 A1 | 3/2002 | Matsui et al. |
| 2009/0267128 A1 | 10/2009 | Maejima |
| 2009/0268522 A1 | 10/2009 | Maejima |
| 2009/0316494 A1 | 12/2009 | Uehara et al. |
| 2010/0034023 A1 | 2/2010 | Shingu et al. |
| 2010/0182844 A1 | 7/2010 | Han |

(Continued)

FOREIGN PATENT DOCUMENTS

JP 2002-074960 3/2002

*Primary Examiner* — Han Yang
(74) *Attorney, Agent, or Firm* — Oblon, McClelland, Maier & Neustadt, L.L.P.

(57) ABSTRACT

According to one embodiment, a semiconductor memory device includes first and second memory cells; a first word line connected to the first and second memory cells; a first bit line connected to the first memory cell; a second bit line connected to the second memory cell; a first sense amplifier connected to the first bit line; a second sense amplifier connected to the second bit line; a voltage generation circuit; and a first row decoder which supplies a voltage to the first word line.

21 Claims, 30 Drawing Sheets

(56) References Cited

U.S. PATENT DOCUMENTS

| | | |
|---|---|---|
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2012/0201083 A1 | 8/2012 | Fujiu |
| 2017/0110186 A1 | 4/2017 | Sasaki |
| 2017/0140814 A1 | 5/2017 | Puthenthermadam |
| 2018/0182447 A1* | 6/2018 | Lee ................. G11C 11/4085 |
| 2019/0122710 A1* | 4/2019 | Shin ..................... G11C 7/08 |
| 2020/0051622 A1 | 2/2020 | Wang |

\* cited by examiner

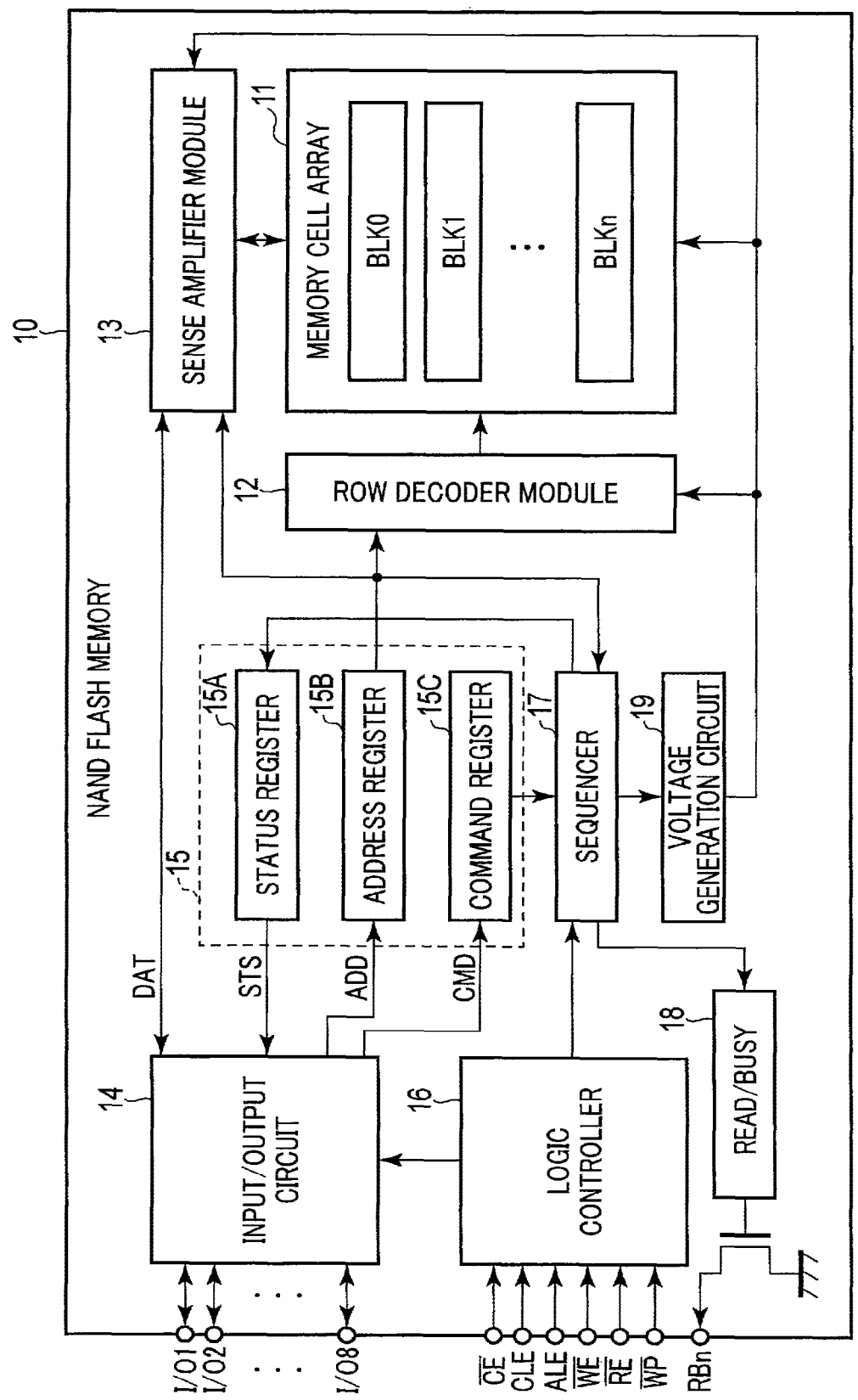
F I G. 1

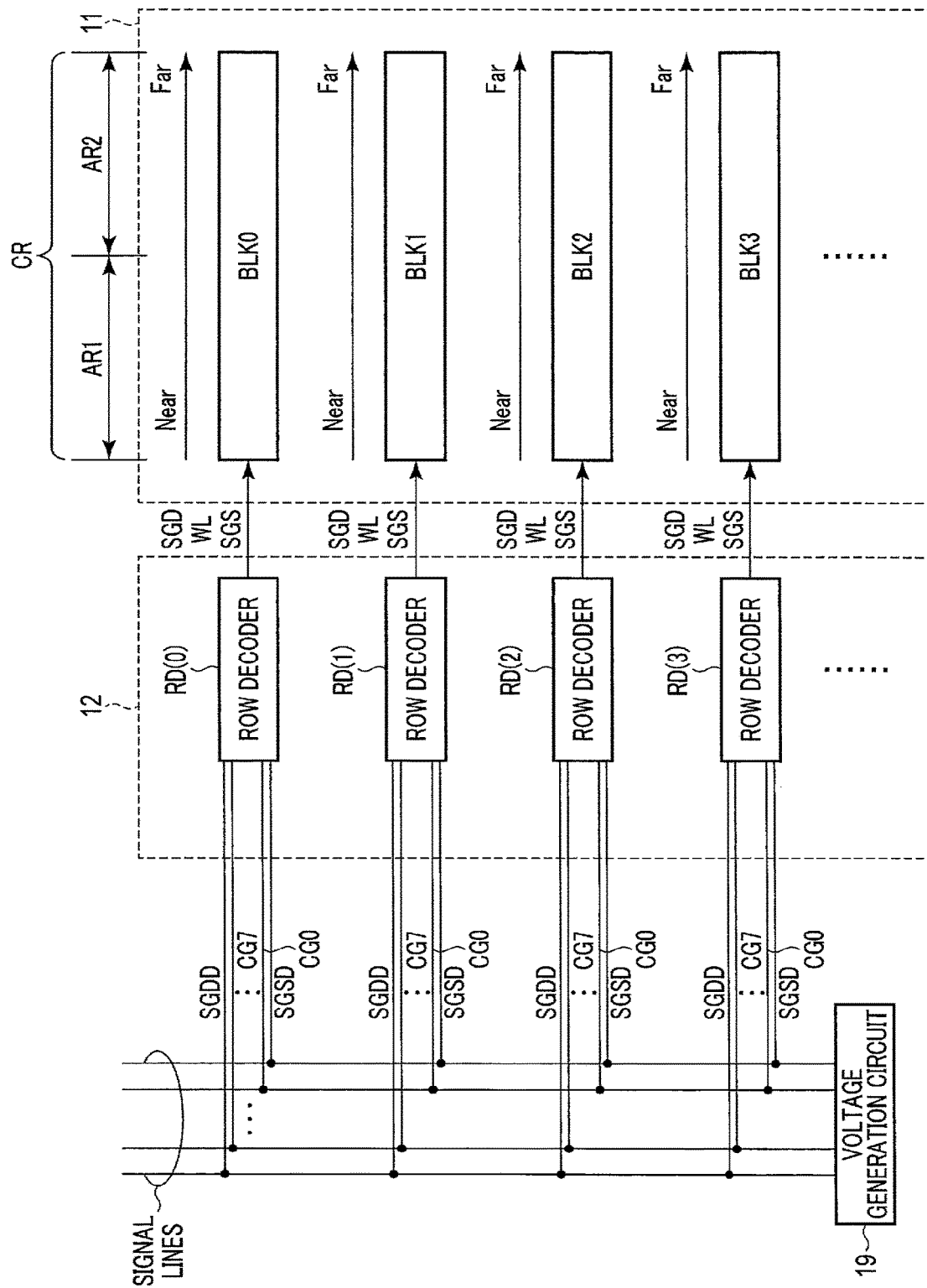
F I G. 3

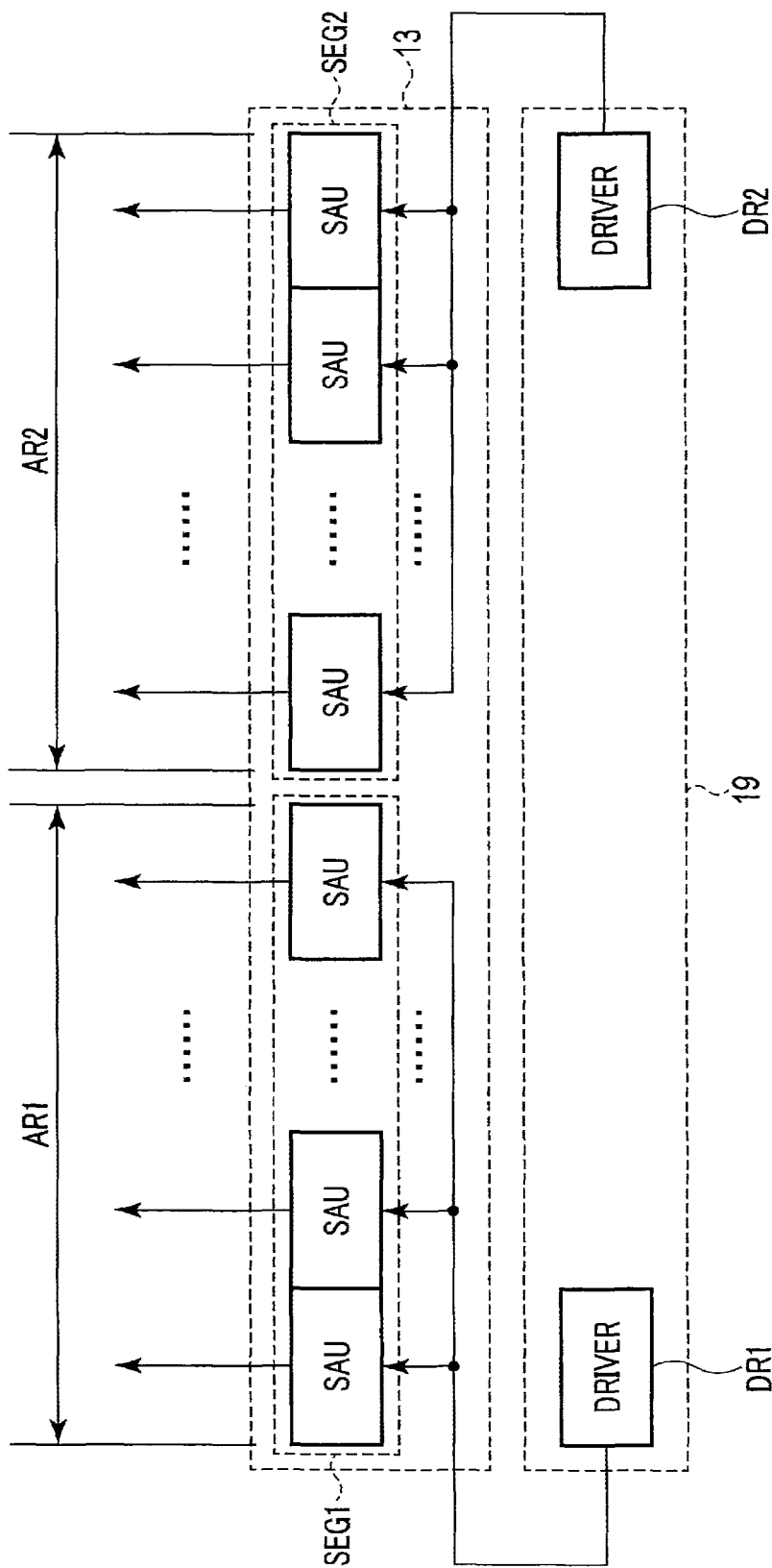
F I G. 4

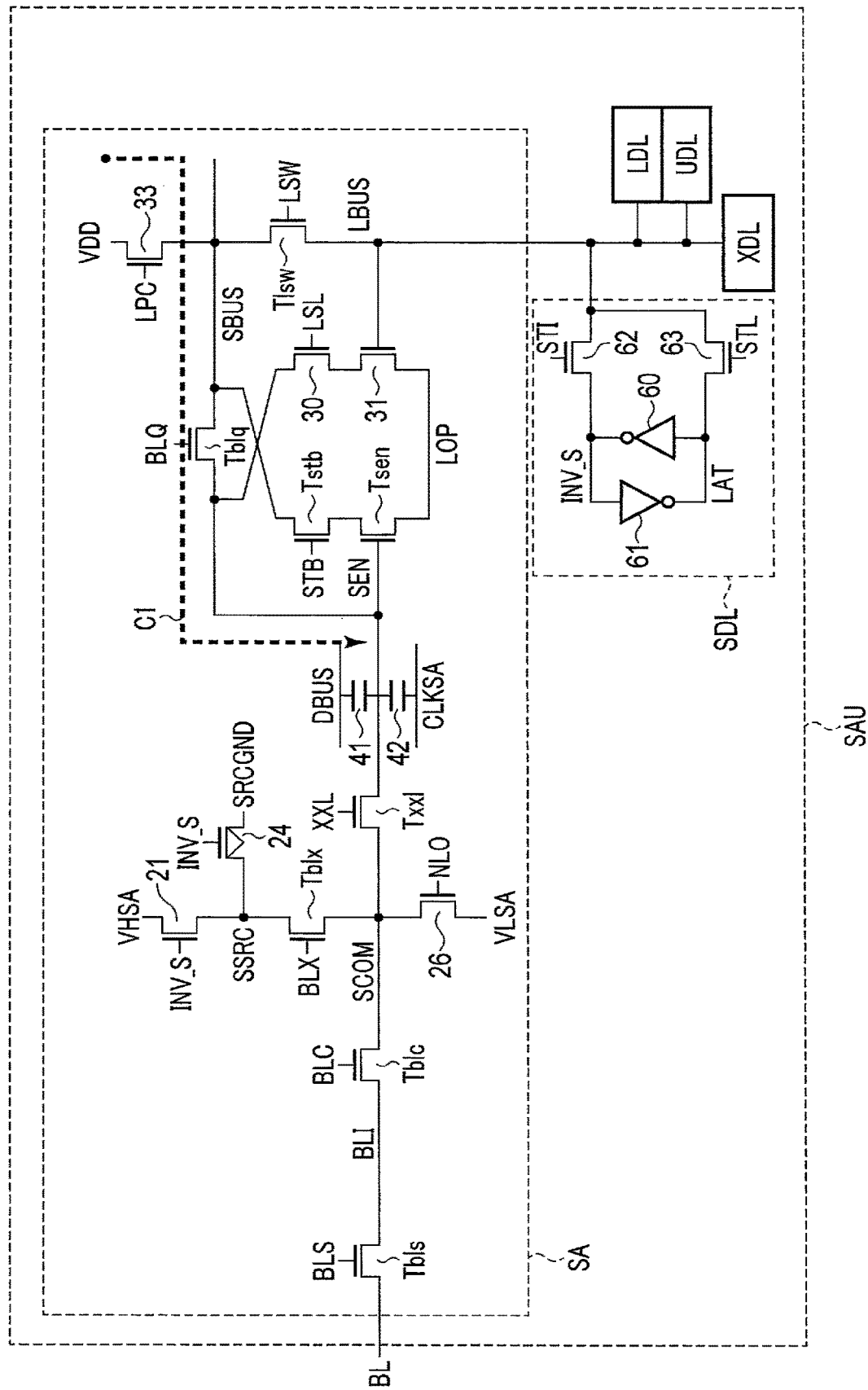
F I G. 5

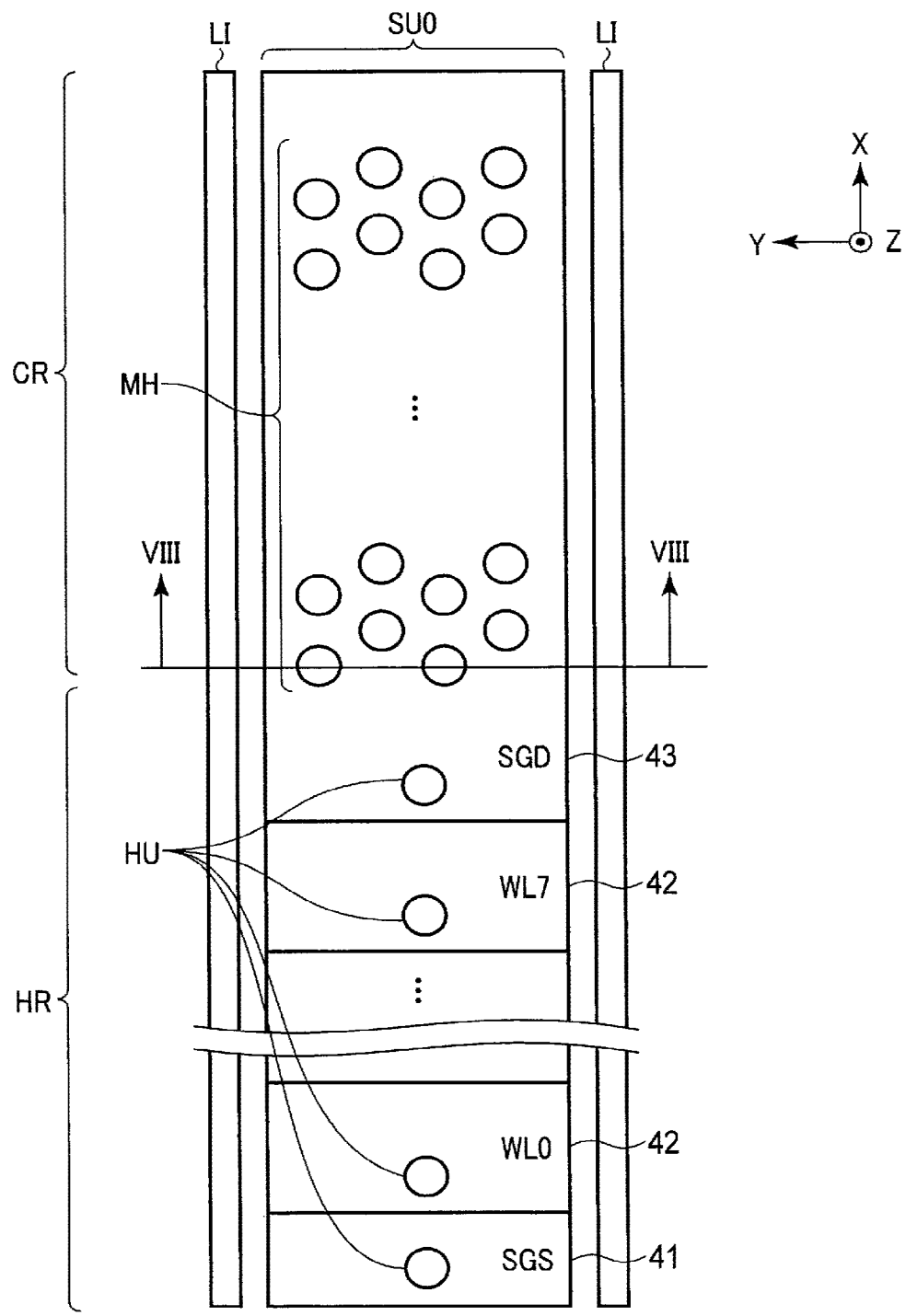
F I G. 6

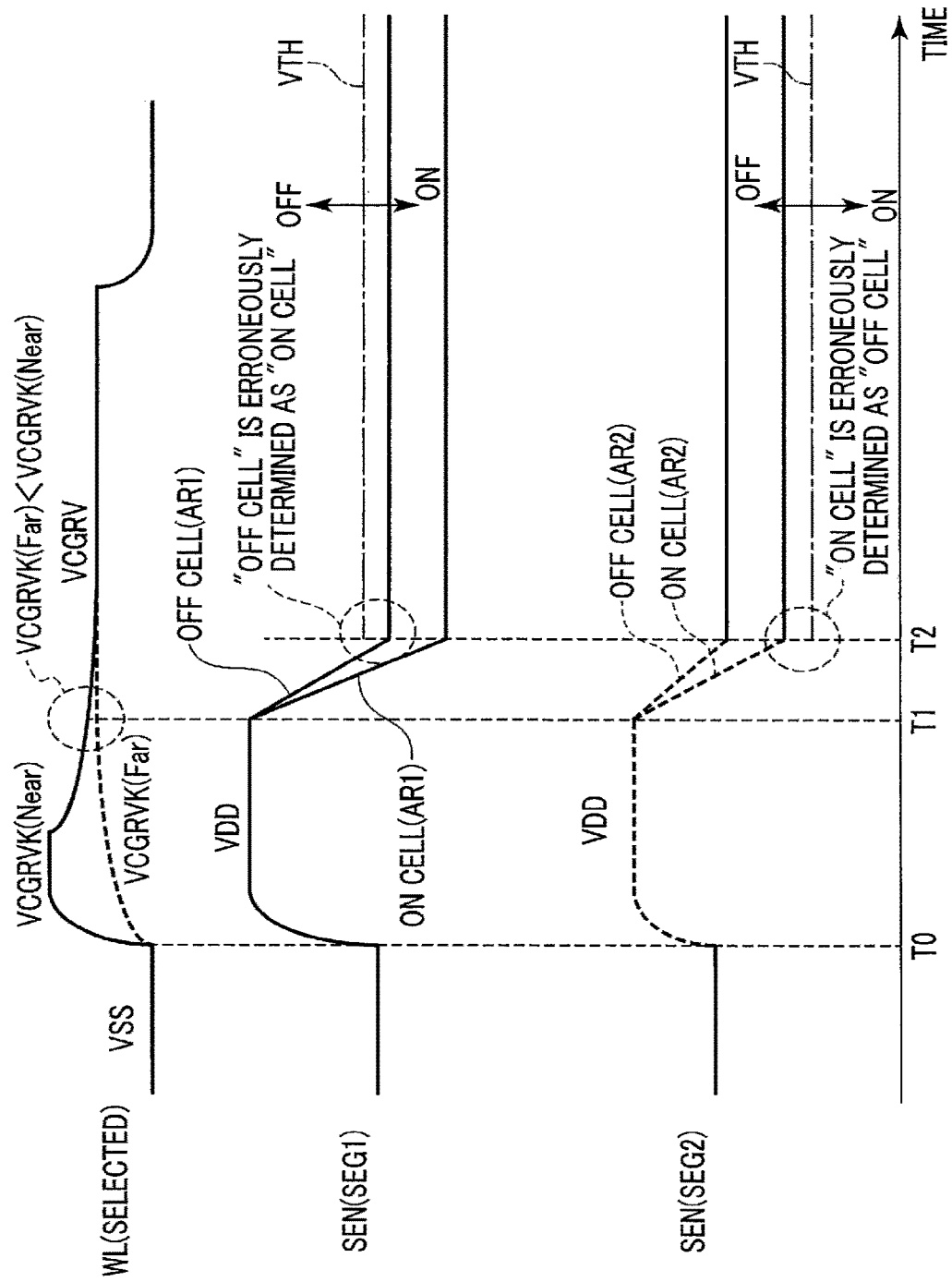
F I G. 11

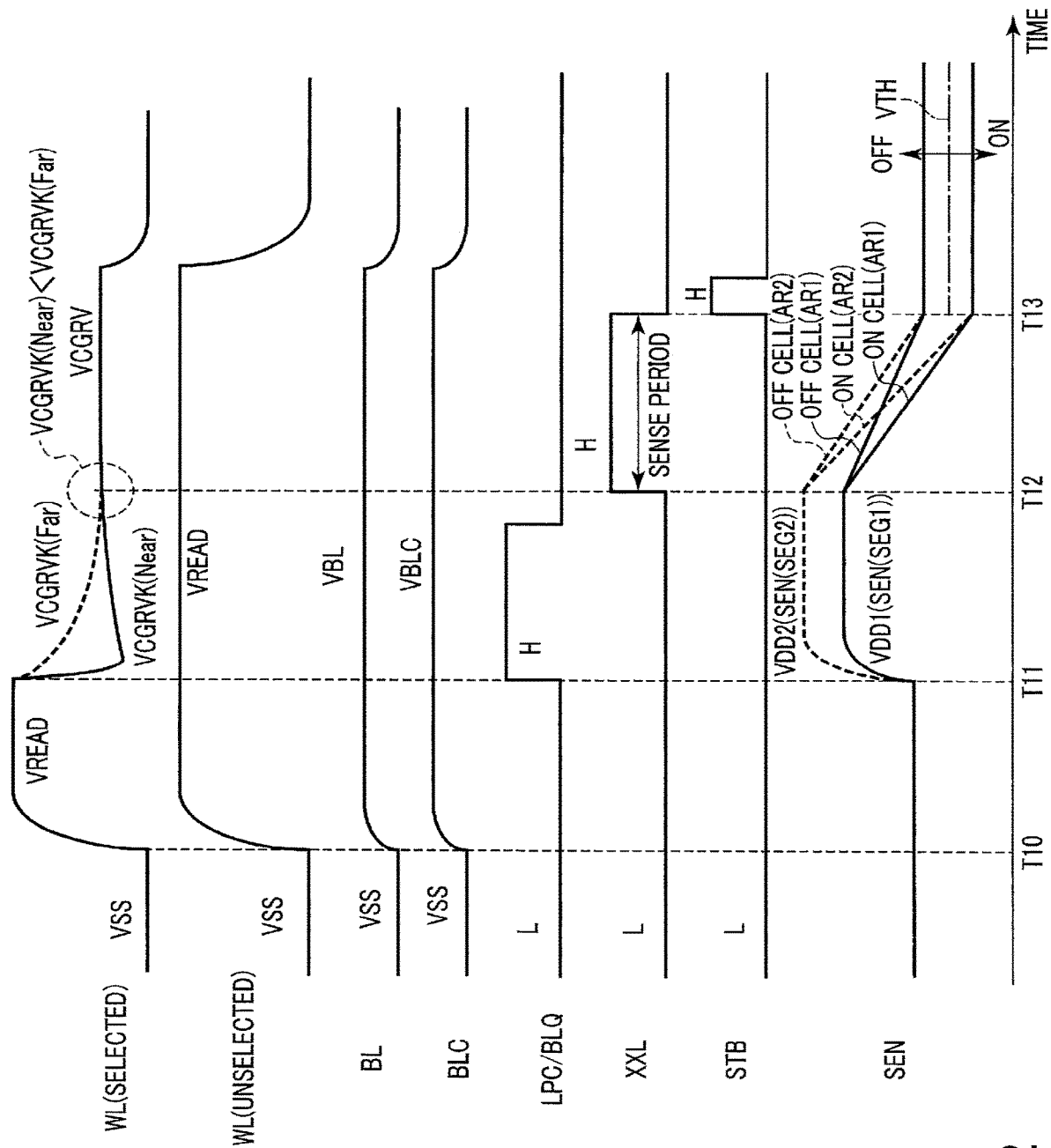
F I G. 12

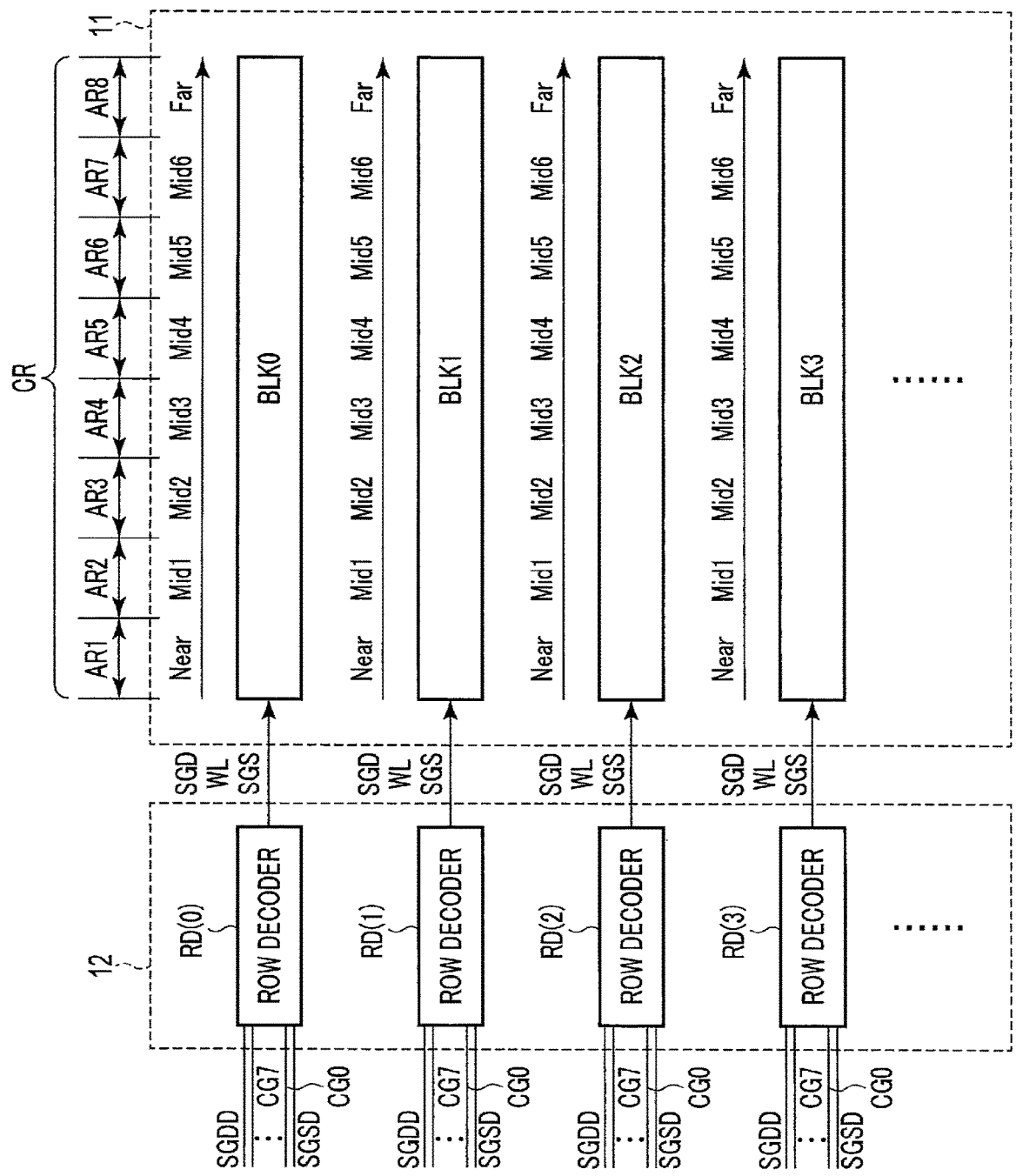
F I G. 16

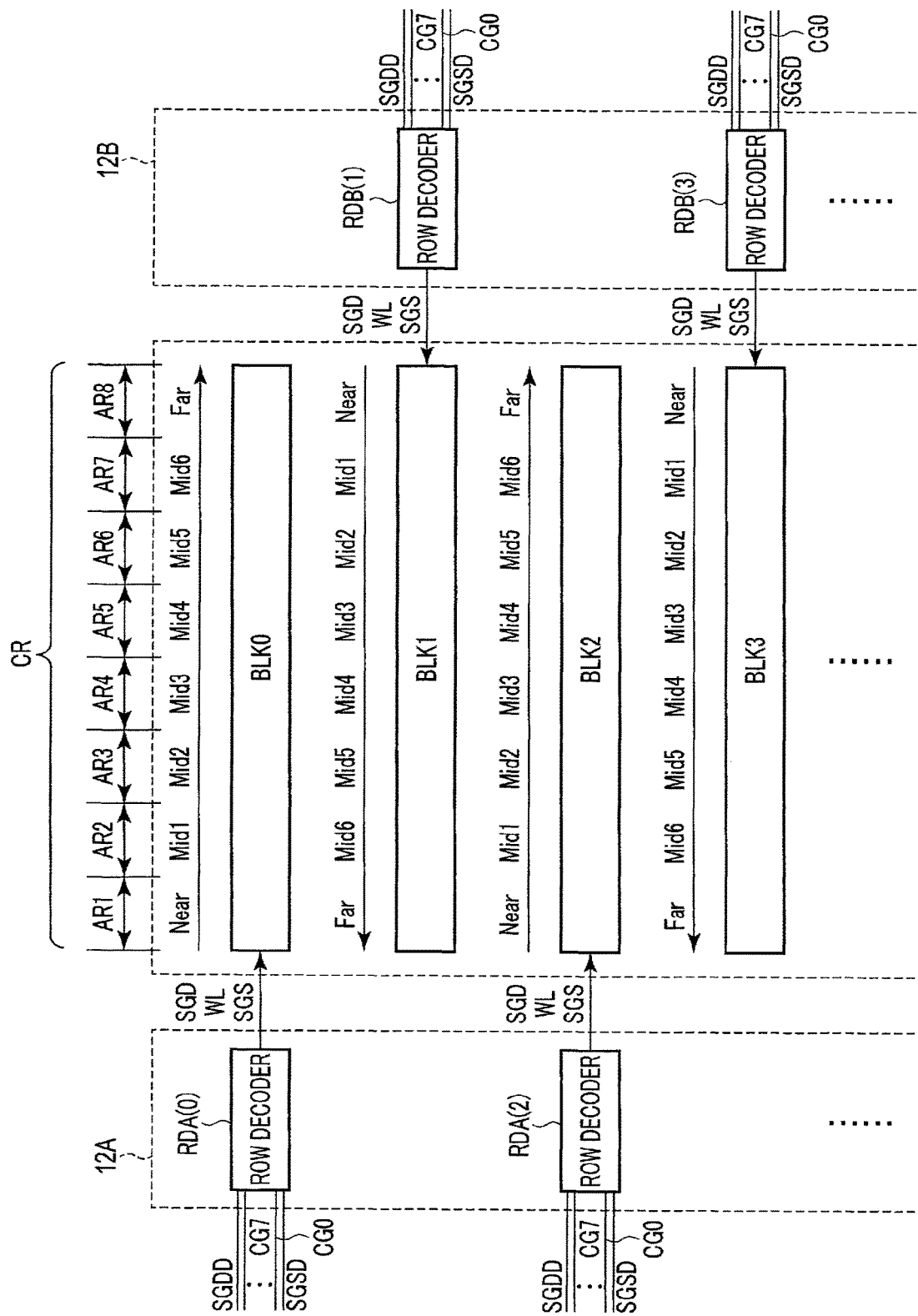
F I G. 20

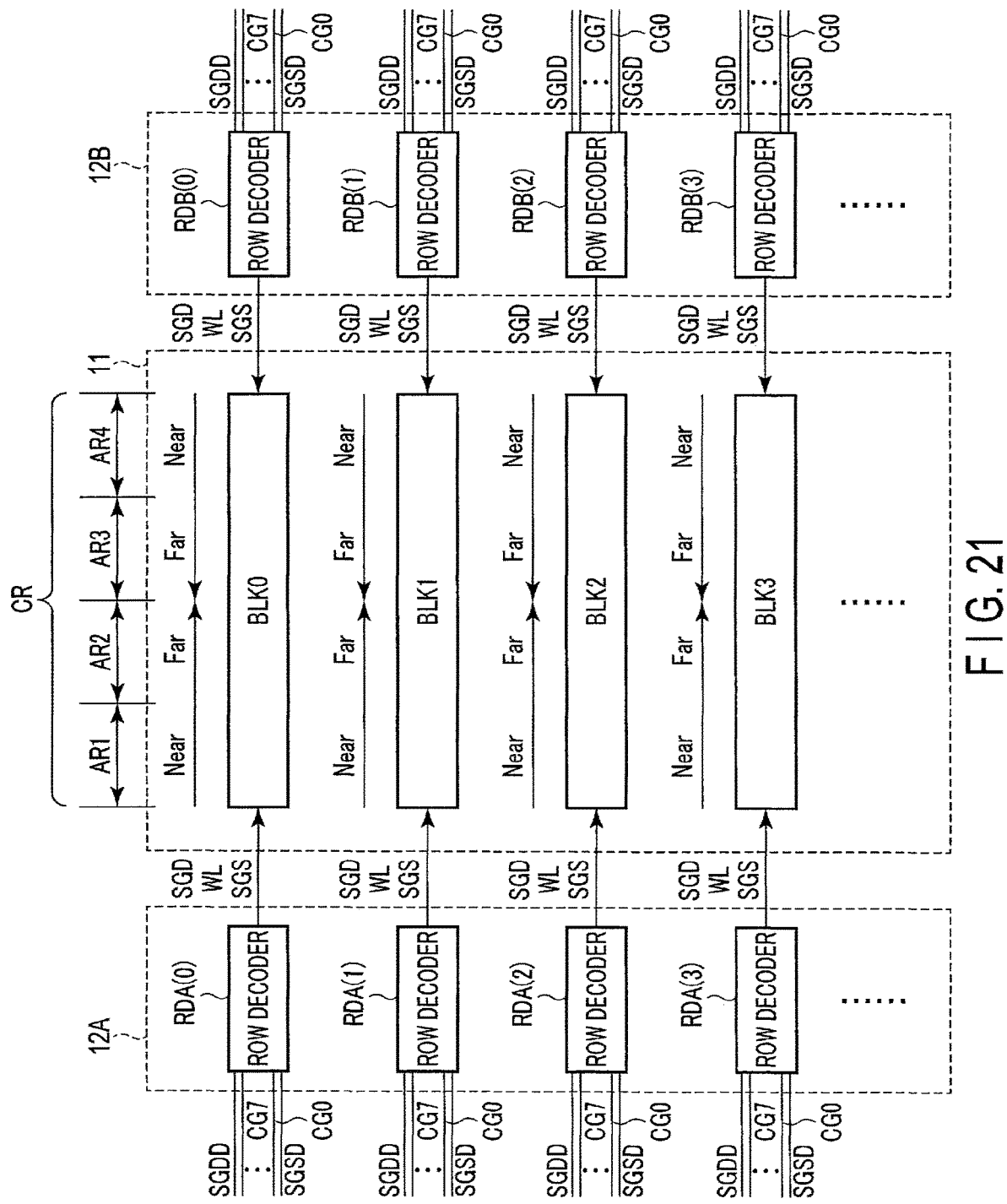
F I G. 21

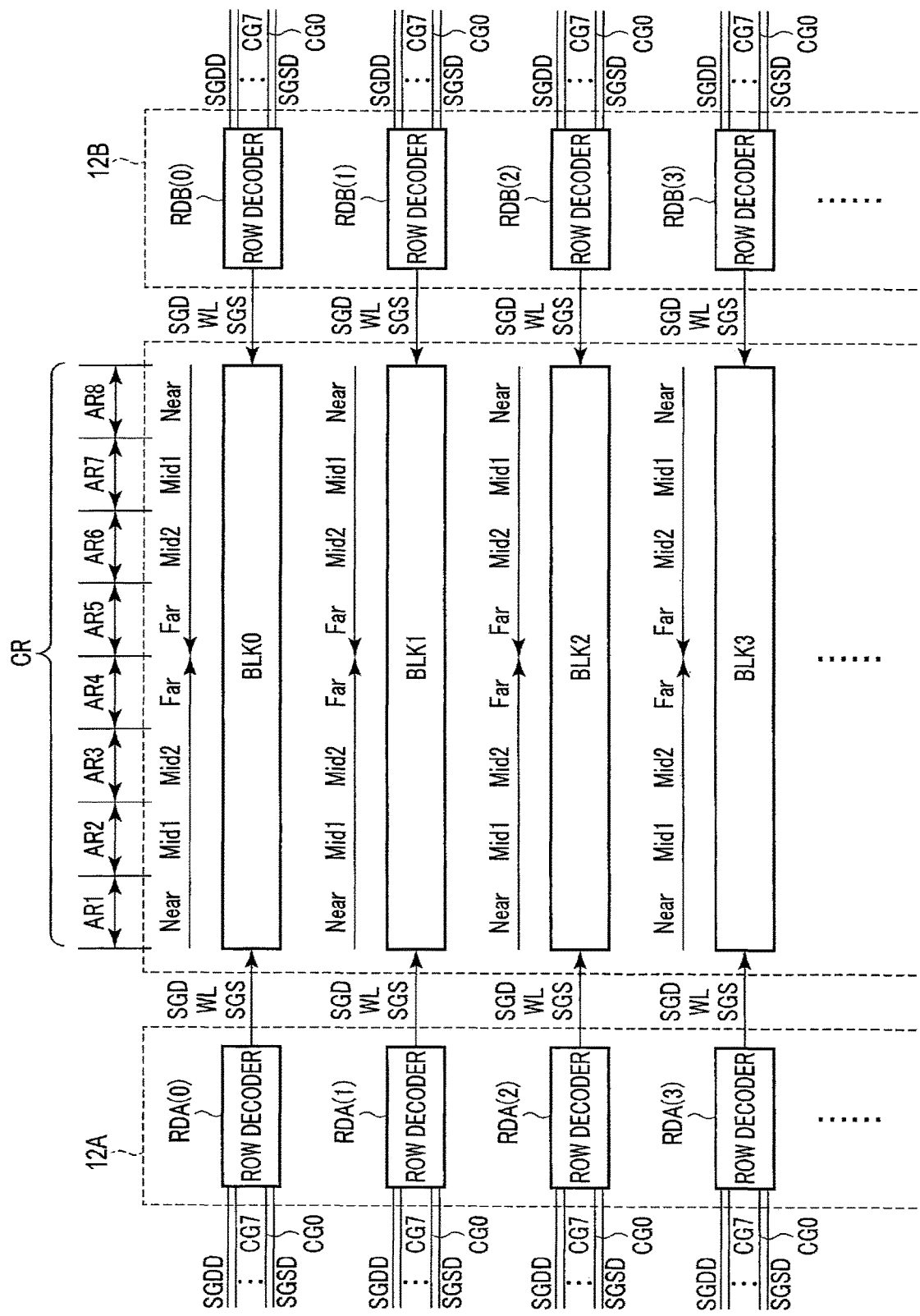
F I G. 22

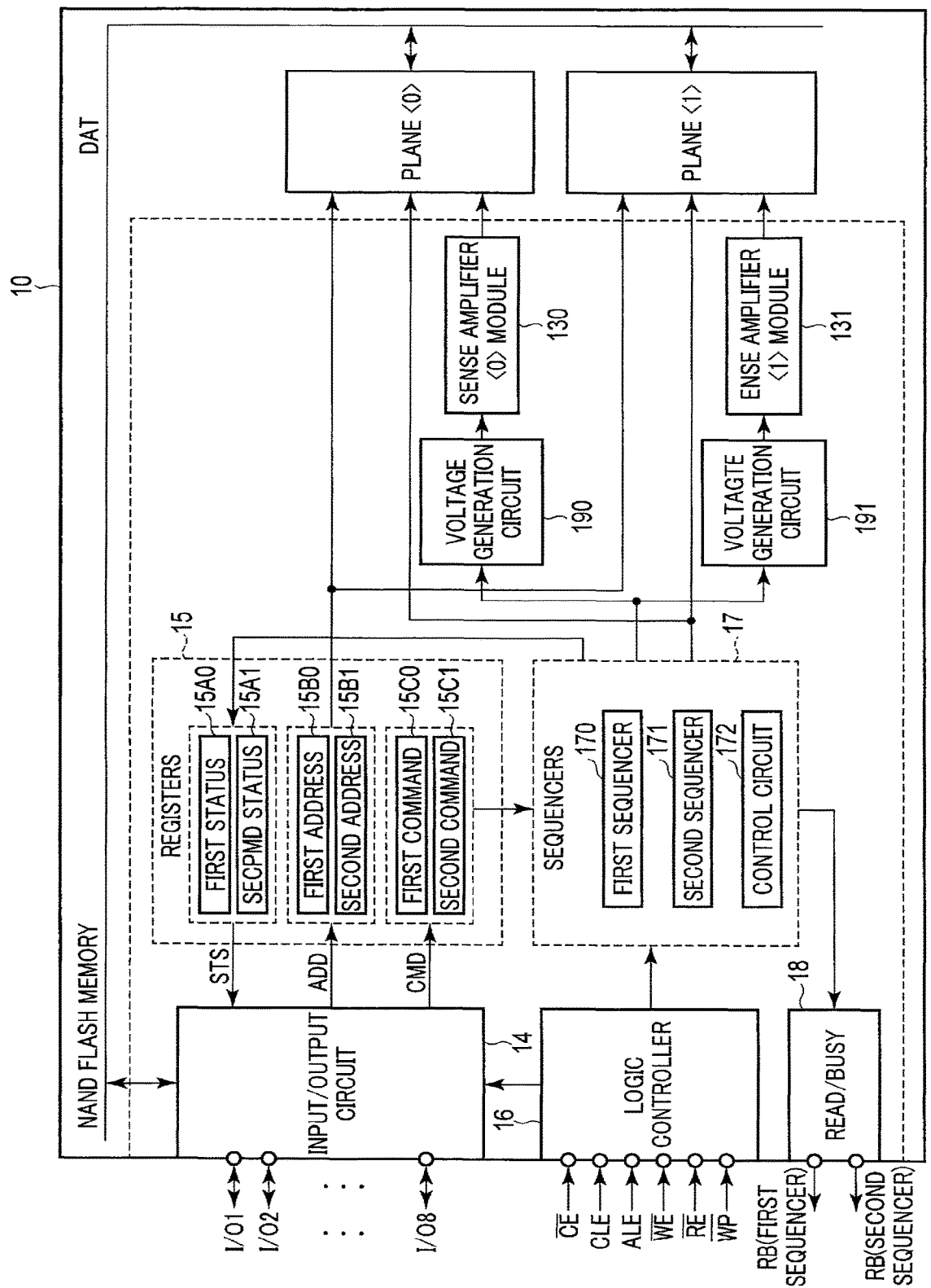
F I G. 23

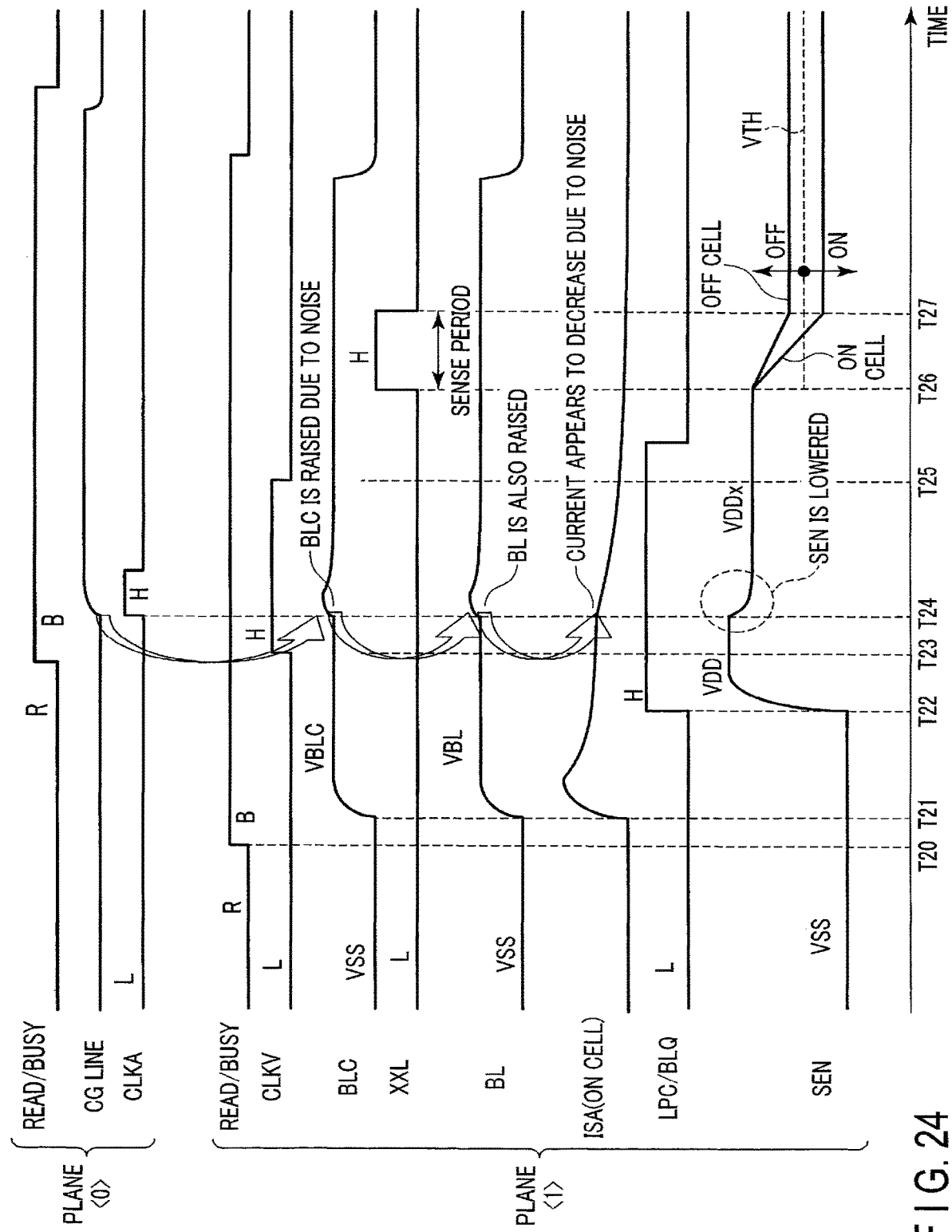
F I G. 24

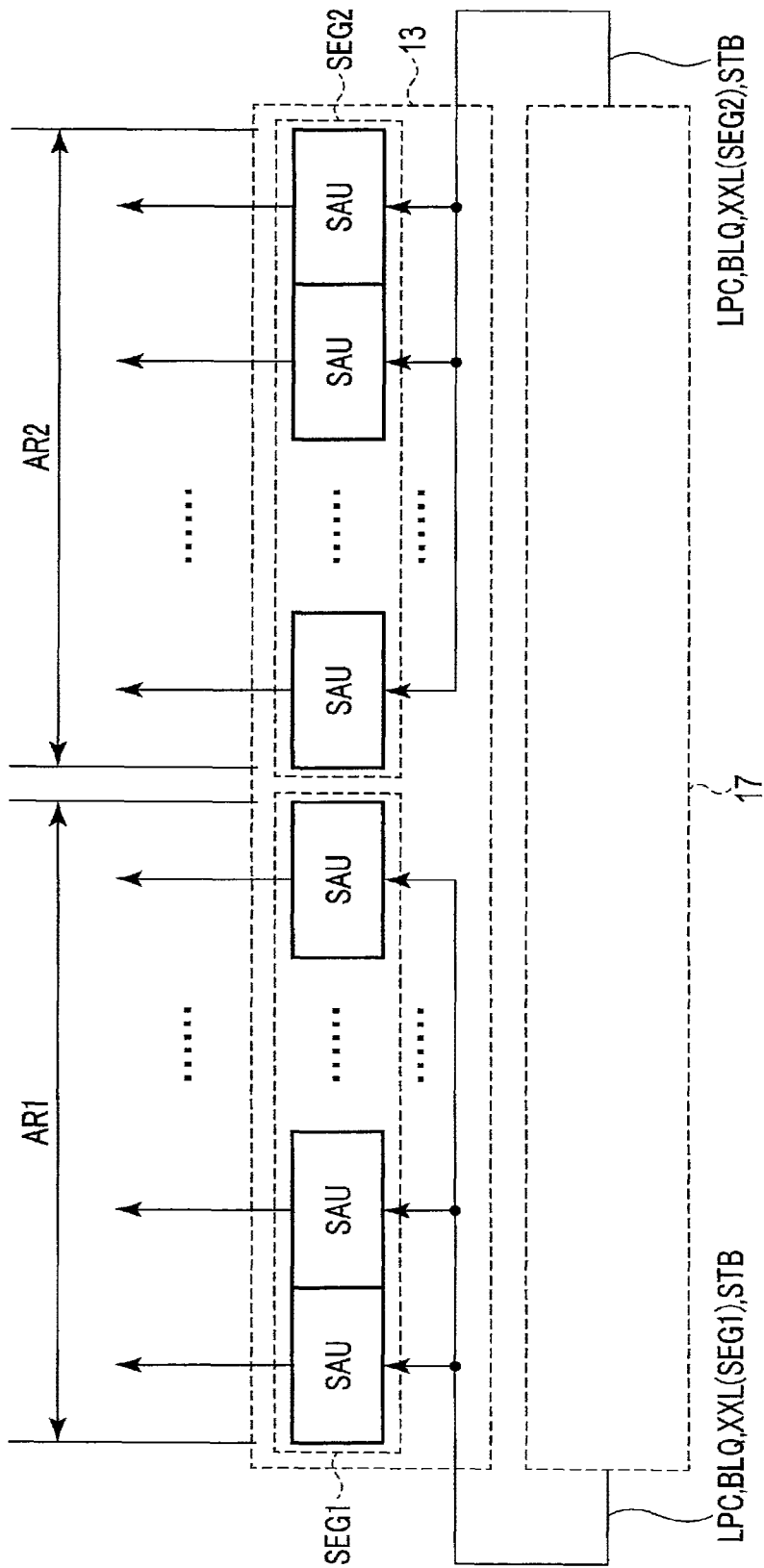
F I G. 26

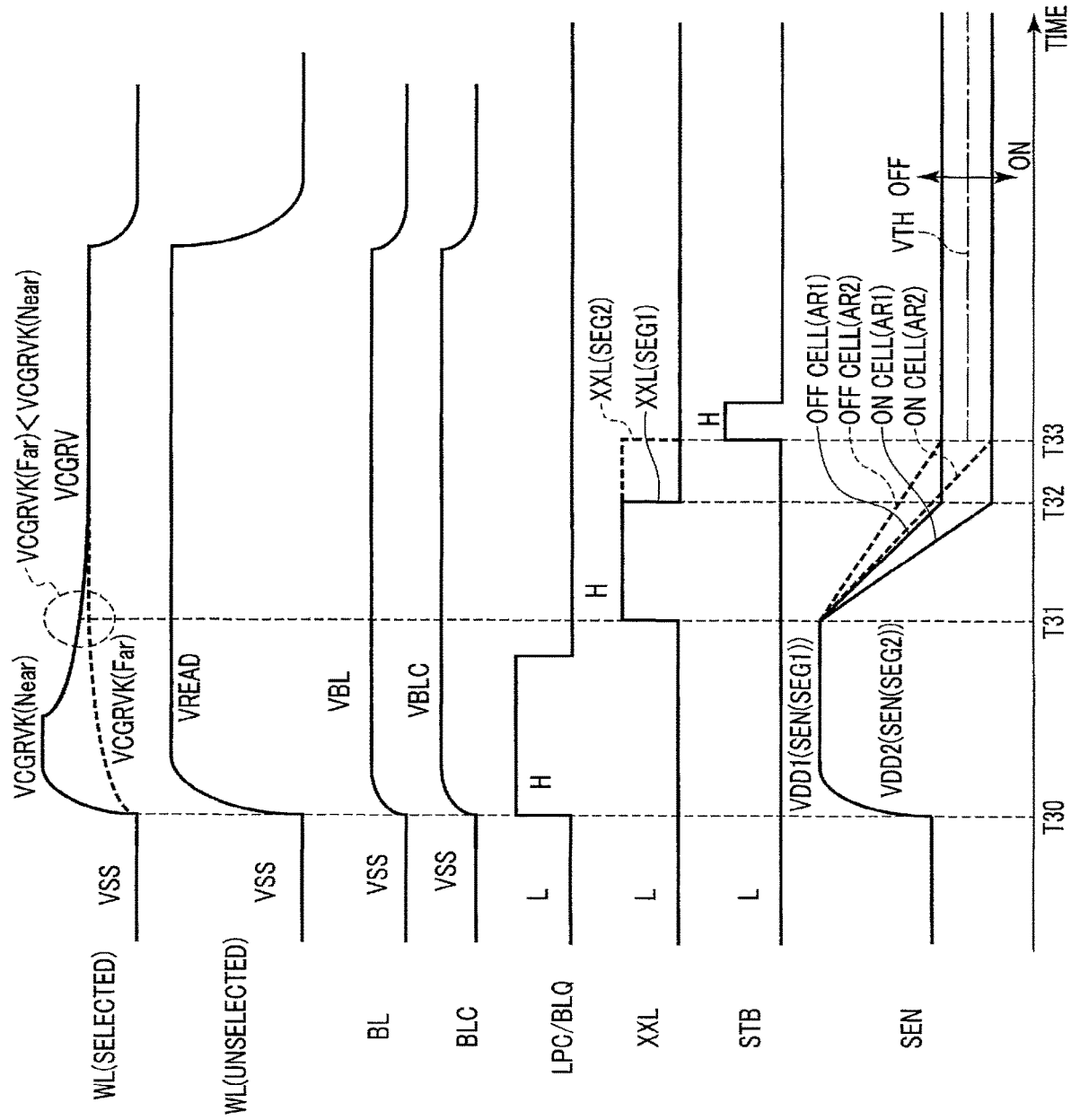
F I G. 27

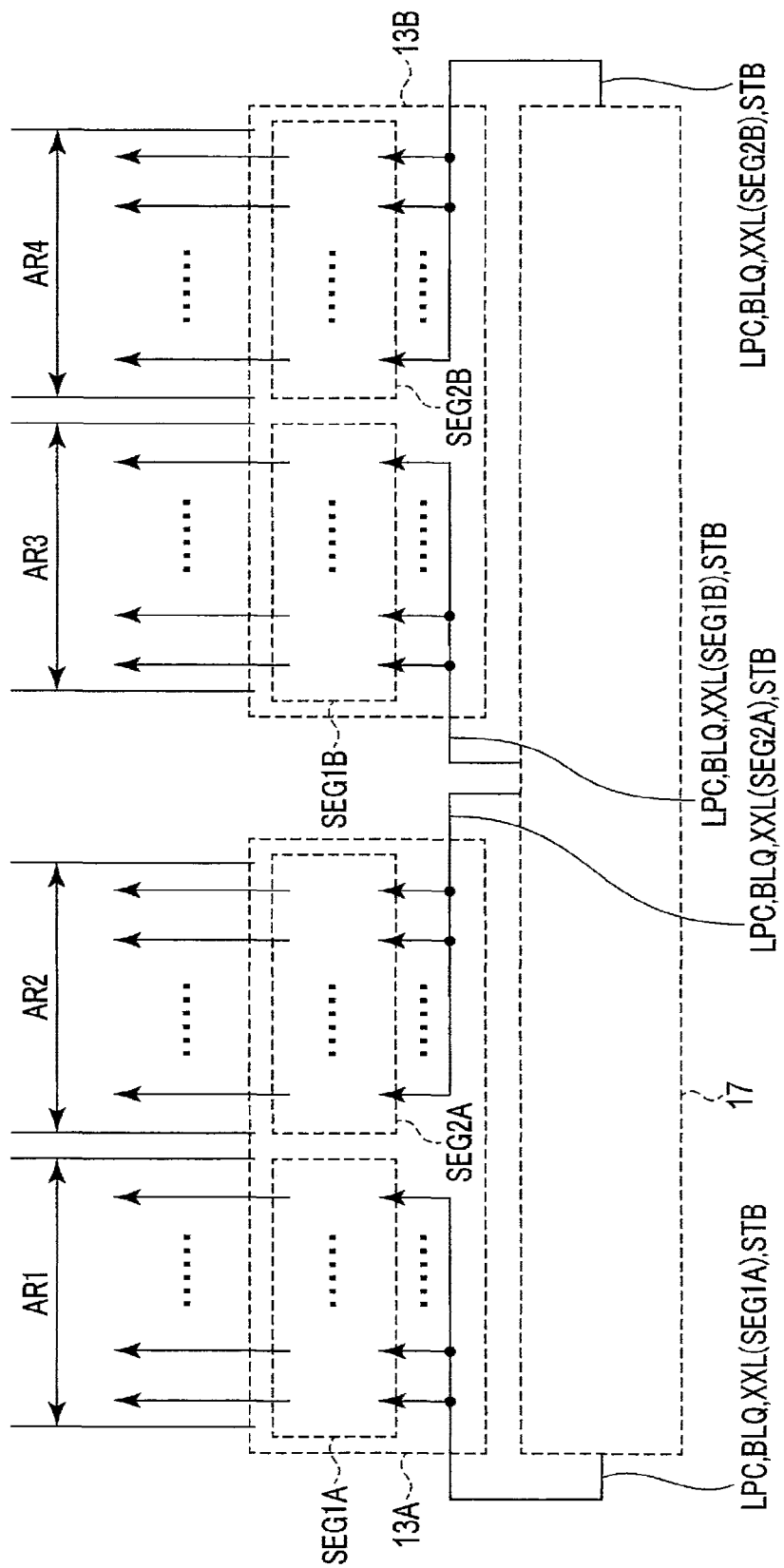
F I G. 29

SEMICONDUCTOR MEMORY DEVICE

CROSS-REFERENCE TO RELATED APPLICATIONS

This application is a continuation application of U.S. application Ser. No. 16/429,680, filed Jun. 3, 2019, which is based upon and claims the benefit of priority from prior Japanese Patent Application No. 2018-121151, filed Jun. 26, 2018, the entire contents of which are incorporated herein by reference.

FIELD

The embodiments described herein relate a semiconductor memory device.

BACKGROUND

A NAND flash memory in which memory cells are three-dimensionally arranged is known.

BRIEF DESCRIPTION OF THE DRAWINGS

FIG. 1 is a block diagram showing an example of an overall configuration of a semiconductor memory device according to a first embodiment.

FIG. 3 is block diagram showing a configuration example of a row decoder module included in the semiconductor memory device of the first embodiment.

FIG. 4 is a block diagram showing a configuration example of a sense amplifier module and a voltage generation circuit included in the semiconductor memory device of the first embodiment.

FIG. 5 is a circuit diagram showing a configuration example of a sense amplifier module included in the semiconductor memory device of the first embodiment.

FIG. 6 is a diagram showing an example of a planar layout of a memory cell array included in the semiconductor memory device of the first embodiment.

FIG. 11 is a diagram showing part of waveforms in read operations performed in the first embodiment and the comparative example.

FIG. 12 is a diagram showing an example of waveforms in a read operation performed by the semiconductor memory device according to modification 1 of the first embodiment.

FIG. 16 is block diagram showing a configuration example of a row decoder module included in a semiconductor memory device according to modification 3 of the first embodiment.

FIG. 20 is block diagram showing a configuration example of a row decoder module included in a semiconductor memory device according to modification 6 of the first embodiment.

FIG. 21 is block diagram showing a configuration example of a row decoder module included in a semiconductor memory device according to modification 7 of the first embodiment.

FIG. 22 is block diagram showing a configuration example of a row decoder module included in a semiconductor memory device according to modification 8 of the first embodiment.

FIG. 23 is a block diagram showing an example of an overall configuration of a semiconductor memory device according to a second embodiment.

FIG. 24 is a diagram showing an example of waveforms in a read operation performed by the semiconductor memory device of the second embodiment.

FIG. 26 is a block diagram showing a configuration example of a sense amplifier module and a sequencer included in a semiconductor memory device according to a third embodiment.

FIG. 27 is a diagram showing an example of waveforms in a read operation performed by the semiconductor memory device of the third embodiment.

FIG. 29 is a block diagram showing a configuration example of a sense amplifier module and a sequencer included in a semiconductor memory device according to modification 2 of the third embodiment.

DETAILED DESCRIPTION

Figure 2:
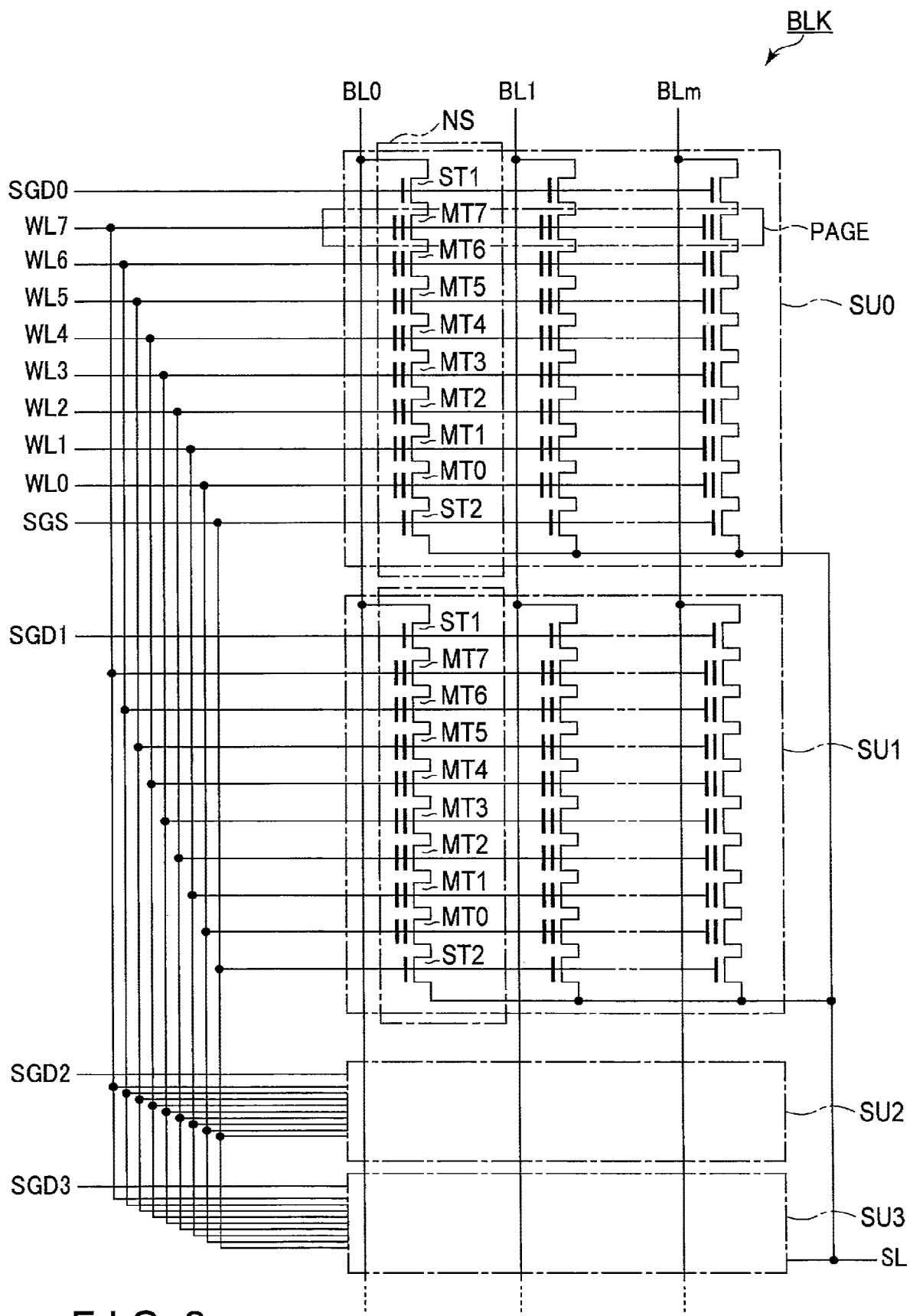
FIG. 2 is a circuit diagram showing a configuration example of a memory cell array included in the semiconductor memory device of the first embodiment.

In general, according to one embodiment, a semiconductor memory device includes first and second memory cells;

a first word line connected to the first and second memory cells; a first bit line connected to the first memory cell; a second bit line connected to the second memory cell; a first sense amplifier connected to the first bit line, the first sense amplifier having a first node to determine data; a second sense amplifier connected to the second bit line, the second sense amplifier having a second node to determine data; a voltage generation circuit; and a first row decoder which supplies a voltage to the first word line, wherein in a read operation, the first row decoder applies, before application of a first voltage, a second voltage different from the first voltage to the first word line, the first node of the first sense amplifier is charged to a third voltage by the voltage generation circuit and is then connected to the first bit line, and the second node of the second sense amplifier is charged to a fourth voltage different from the third voltage by the voltage generation circuit and is then connected to the second bit line.

Hereinafter, embodiments will be described with reference to the accompanying drawings. The drawings are schematic. In the description below, elements having the same functions and configurations will be denoted by the same reference symbols. The numerals suffixed to the letters constituting reference symbols and the letters suffixed to the numerals constituting reference symbols are referenced by reference symbols containing the same letters and numbers and are used to distinguish between elements having the same configuration. Where elements denoted by reference symbols containing the same letters or numerals need not be discriminated from each other, they will be denoted by reference symbols including only letters or numerals.

<1> First Embodiment

A semiconductor memory device according to the first embodiment will be described.
<1-1> Configuration
<1-1-1> Overall Configuration of Semiconductor Memory Device 10.

FIG. 1 is a block diagram showing an example of an overall configuration of the semiconductor memory device 10 according to the first embodiment. As shown in FIG. 1, the semiconductor memory device 10 includes a memory cell array 11, a row decoder module 12, a sense amplifier module 13, an input/output circuit 14, registers 15, a logic controller 16, a sequencer 17, a ready/busy control circuit 18, and a voltage generation circuit 19.

The memory cell array 11 includes blocks BLK0 to BLKn (n is a natural number of 1 or more). The block BLK is a set of nonvolatile memory cells associated with a bit line and a word line, and is, for example, a data erase unit. The semiconductor memory device 10 can store data of 2 bits or more in each memory cell by applying the MLC (Multi-Level Cell) method, for example.

The row decoder module 12 can select a block BLK to be used for various operations, based on a block address held in an address register 15B. The row decoder module 12 can transfer the voltage supplied from the voltage generation circuit 19 to the selected block BLK. Details of the row decoder module 12 will be described later.

The sense amplifier module 13 can output data DAT read from the memory cell array 11 to an external controller via the input/output circuit 14. Also, the sense amplifier module 13 can transfer write data DAT received from the external controller to the memory cell array 11 via the input/output circuit 14.

The input/output circuit 14 can transmit and receive input/output signals I/O (I/O1 to I/O8), for example, of 8 bit width, to and from the external controller. For example, the input/output circuit 14 transfers write data DAT included in the input/output signal I/O received from the external controller to the sense amplifier module 13, and transmits read data DAT transferred from the sense amplifier module 13 to the external controller as an input/output signal I/O.

The registers 15 include a status register 15A, an address register 15B, and a command register 15C. The status register 15A holds, for example, status information STS of the sequencer 17, and transfers the status information STS to the input/output circuit 14 based on an instruction from the sequencer 17. The address register 15B holds address information ADD transferred from the input/output circuit 14. The block address, column address and page address included in the address information ADD are respectively used by the row decoder module 12, the sense amplifier module 13, and the voltage generation circuit 19. The command register 15C holds command CMD transferred from the input/output circuit 14.

The logic controller 16 can control the input/output circuit 14 and the sequencer 17, based on various control signals received from the external controller. As the various control signals, for example, a chip enable signal /CE, a command latch enable signal CLE, an address latch enable signal ALE, a write enable signal /WE, a read enable signal /RE, and a write protect signal /WP are used. Signal /CE is a signal for enabling the semiconductor memory device 10. Signal CLE is a signal for informing the input/output circuit 14 that a signal input to the semiconductor memory device 10 in parallel with an asserted signal CLE is a command CMD. Signal ALE is a signal for informing the input/output circuit 14 that a signal input to the semiconductor memory device 10 in parallel with an asserted signal ALE is address information ADD. Signals /WE and /RE are, for example, signals instructing the input/output circuit 14 to input and output input/output signal I/O, respectively. Signal /WP is a signal for setting the semiconductor memory device 10 in a protected state, for example, when the power supply is turned on/off.

The sequencer 17 can control the operation of the entire semiconductor memory device 10 based on the command CMD stored in the command register 15C. For example, the sequencer 17 controls the row decoder module 12, the sense amplifier module 13, the voltage generation circuit 19 and the like to execute various operations such as a write operation and a read operation.

The ready/busy control circuit 18 can generate a ready/busy signal RBn based on the operation state of the sequencer 17. Signal RBn is a signal for notifying the external controller whether the semiconductor memory device 10 is in a ready state in which it accepts an instruction from the external controller or in a busy state in which it cannot accept an instruction.

The voltage generation circuit 19 can generate a desired voltage under the control of the sequencer 17 and supply the generated voltage to the memory cell array 11, the row decoder module 12, the sense amplifier module 13, etc. For example, the voltage generation circuit 19 applies desired voltages to a signal line corresponding to a selected word line and a signal line corresponding to an unselected word line, respectively, based on a page address held in the address register 15B.

<1-1-2> Configuration of Memory Cell Array 11

FIG. 2 is a circuit diagram showing a configuration example of the memory cell array 11 included in the semiconductor memory device 10 of the first embodiment, and illustrates an example of a detailed circuit configuration of one block BLK of the memory cell array 11. As shown in FIG. 2, the block BLK includes, for example, string units SU0 to SU3.

Each string unit SU includes a plurality of NAND strings NS respectively associated with bit lines BL0 to BLm (m is a natural number of 1 or more). Each NAND string NS includes, for example, memory cell transistors MT0 to MT7 and selection transistors ST1 and ST2.

Each memory cell transistor MT includes a control gate and a charge storage layer and can store data in a nonvolatile manner. The memory cell transistors MT0 to MT7 included in each NAND string NS are connected in series between the source of the selection transistor ST1 and the drain of the selection transistor ST2. The control gates of the memory cell transistors MT0 to MT7 included in the same block BLK are commonly connected to word lines WL0 to WL7, respectively. In the description below, a set of 1-bit data stored in a plurality of memory cell transistors MT connected to a common word line WL of each string unit SU will be referred to as a "page". Therefore, where two-bit data is stored in one memory cell transistor MT, a set of a plurality of memory cell transistors MT connected to the common word line WL of one string unit SU stores two page data.

The selection transistors ST1 and ST2 are used for selection of the string units SU during various operations. The drains of the selection transistors ST1 included in the NAND string NS corresponding to the same column address are commonly connected to the corresponding bit line BL. The gates of the selection transistors ST1 included in the string units SU0 to SU3 are commonly connected to the select gate lines SGD0 to SGD3, respectively. In the same block BLK, the sources of the selection transistors ST2 are commonly connected to the source line SL, and the gates of the selection transistors ST2 are commonly connected to the select gate line SGS.

In the circuit configuration of the memory cell array 11 described above, the word lines WL0 to WL7 are provided for each block BLK. The bit lines BL0 to BLm are shared by a plurality of blocks BLK. A source line SL is shared by a plurality of blocks BLK. The number of string units SU included in each block BLK and the number of memory cell transistors MT and selection transistors ST1 and ST2 included in each NAND string NS are merely examples and can be designed to optional numbers. The number of word lines WL and the number of select gate lines SGD and SGS are changed based on the number of memory cell transistors MT and the number of selection transistors ST1 and ST2.

<1-1-3> Configuration of Row Decoder Module 12

FIG. 3 is a block diagram showing a detailed configuration example of the row decoder module 12 included in the semiconductor memory device 10 of the first embodiment, and illustrates how each of the blocks BLK included in the memory cell array 11 is related to the row decoder module 12. As shown in FIG. 3, the row decoder module 12 includes a plurality of row decoders RD.

The row decoders RD are provided correspondingly with the respective blocks (for example, BLK0, BLK1, . . . ).

That is, one row decoder RD is associated with one block BLK.

The row decoder RD controls the connection between various signal lines (SGDD, CG0 to CG7, SGSD) extending from the voltage generation circuit 19 and the wirings (SGD, WL, SGS) of the block BLK associated with the row decoder RD.

When the block BLK associated with the row decoder RD is selected, the row decoder RD connects signal line SGDD and wiring SGD to each other, signal lines CG0 to CG7 and wirings WL0 to WL7 to each other, and signal line SGSD and wiring SGS to each other.

The voltage supplied from the voltage generation circuit 19 is applied to each block BLK via the corresponding row decoder RD. The row decoder RD applies a voltage to the word line WL of the block from one side of the extending direction of the word line WL, and areas AR1 and AR2 are defined for the above-described configuration, as shown in FIG. 3.

Areas AR1 and AR2 are areas defined, with the memory cell array 11 divided in the extending direction of the word line WL (extending direction of the block BLK). The area AR1 corresponds to one side in the extending direction of the word line WL. The area AR2 corresponds to the other side of the extending direction of the word line WL. In the description below, an area of each block BLK close to the connection position with the corresponding row decoder RD will be referred to as "Near", and an area of each block BLK far away from the connection position with the corresponding row decoder RD will be referred to as "Far".

The areas AR1 and AR2 are included in a substantive data storing region CR of the memory cell array 11.

<1-1-4> Configurations of Sense Amplifier Module 13 and Voltage Generation Circuit 19

FIG. 4 is a block diagram showing a detailed configuration example of the sense amplifier module 13 and the voltage generation circuit 19 included in the semiconductor memory device 10 of the first embodiment. As shown in FIG. 4, the sense amplifier module 13 includes a plurality of sense amplifier units SAU, and the voltage generation circuit 19 includes drivers DR1 and DR2.

One bit line BL is connected to each sense amplifier unit SAU. That is, the number of sense amplifier units SAU included in the sense amplifier module 13 corresponds to, for example, the number of bit lines BL. In the description below, a set of sense amplifier units SAU connected to the bit lines BL corresponding to the NAND strings NS provided in the area AR1 will be referred to as sense amplifier segment SEG1, and a set of sense amplifier units SAU connected to the bit lines BL corresponding to the NAND strings NS provided in the area AR2 will be referred to as sense amplifier segment SEG2.

The drivers DR1 and DR2 generate a first power supply voltage VDD1 and a second power supply voltage VDD2, respectively, based on a voltage generated by a charge pump (not shown). The driver DR1 supplies the generated first power supply voltage VDD1 to the sense amplifier units SAU included in the segment SEG1. The driver DR2 supplies the generated second power supply voltage VDD2 to the sense amplifier units SAU included in the segment SEG2.

A detailed circuit configuration of each of the sense amplifier units SAU described above is as shown in FIG. 5, for example. FIG. 5 shows an example of a detailed circuit configuration of one sense amplifier unit SAU included in the sense amplifier module 13. As shown in FIG. 5, the sense amplifier unit SAU includes a sense amplifier unit SA and latch circuits SDL, LDL, UDL and XDL. The sense amplifier unit SA and the latch circuits SDL, LDL, UDL and XDL are connected such that data can be transmitted and received to and from each other.

For example, in a read operation, the sense amplifier unit SA senses the data read to the corresponding bit line BL and determines whether the read data is "0" or "1".

As shown in FIG. 5, each sense amplifier unit SAU includes p-type MOSFETs (metal oxide semiconductor field effect transistors) 21 and 24, n-type MOSFETs Tbls, Tblc, Tblx, 26, Txxl, Tstb, Tsen, 30, 31, Tblq, 33 and Tlsw, and capacitors 41 and 42.

One bit line BL is connected to a node SCOM via series-connected transistors Tbls and Tblc. The transistors Tbls and Tblc receive, for example, signals BLS and BLC supplied from the sequencer 17 at their respective gates. The node SCOM is connected to the node of a potential VHSA via the transistors Tblx and Tblx connected in series. The transistor 21 is connected to a node INV_S of the latch circuit SDL at the gate, and the transistor Tblx receives a signal BLX from the sequencer 17 at the gate.

A node SSRC to which the transistor 21 and the transistor Tblx are connected is connected to a node SRCGND via the transistor 24. The transistor 24 is connected to the node INV_S at the gate.

The node SCOM is connected to the node of a potential VLSA via the transistor 26. The transistor 26 receives a signal NLO from the sequencer 17 at the gate.

The node SCOM is further connected to the node SEN (sense node) via the transistor Txxl. The transistor Txxl receives a signal XXL from the sequencer 17 at the gate. The node SEN receives the signal CLKSA via the capacitor 42. The signal CLKSA is controlled, for example, by the sequencer 17. The node SEN is capacitively coupled to a bus DBUS to be described later by the capacitor 41.

Also, the node SEN is connected to a bus SBUS via the transistor Tblq. The transistor Tblq receives, for example, a signal BLQ supplied from the sequencer 17 at the gate. The node SEN is further connected to a node LOP via the series-connected transistors 30 and 31. The node (source) of the transistor 31 opposite to the transistor 30 may be grounded instead of being connected to the node LOP. The transistor 30 receives, for example, a signal LSL supplied from the sequencer 17 at the gate.

The voltage of the node LOP is controlled by the voltage generation circuit 19.

The bus SBUS is connected to the node LOP via the series-connected transistors Tstb and Tsen. The transistor Tstb receives, for example, a signal STB supplied from the sequencer 17 at the gate. The transistor Tsen is connected to the node SEN at the gate.

The bus SBUS is also connected to the node of a power supply voltage VDD (VDD1 or VDD2) via the transistor 33. The transistor 33 receives, for example, a signal LPC supplied from the sequencer 17 at the gate, and transfers the power supply voltage VDD to the bus SBUS.

That is, the power supply voltage VDD is supplied to the node SEN via the transistor Tblq and the transistor 33 (see arrow C1).

The latch circuits SDL, LDL, UDL and XDL temporarily hold read data. The latch circuit XDL is connected to the input/output circuit 14 and is used for inputting/outputting data between the sense amplifier unit SAU and the input/output circuit 14.

Latch circuit SDL includes, for example, inverters 60 and 61 and n-channel MOS transistors 62 and 63. The input node of the inverter 60 is connected to node LAT and the output node of the inverter 60 is connected to the node INV_S. The input node of the inverter 61 is connected to the node INV_S, and the output node of the inverter 61 is connected to the node LAT. One end of the transistor 62 is connected to the node INV_S, the other end of the transistor 62 is connected to bus LBUS, and a control signal STI is input to the gate of the transistor 62. One end of the transistor 63 is connected to the node LAT, the other end of the transistor 63 is connected to the bus LBUS, and a control signal STL is input to the gate of the transistor 63. For example, the data held in the node LAT corresponds to the data held in the latch circuit SDL, and the data held in the node INV_S corresponds to inverted data of the data held in the node LAT. The circuit configurations of the latch circuits LDL, UDL and XDL are similar, for example, to the circuit configuration of the latch circuit SDL, and therefore the description thereof will be omitted.

The various control signals described above are generated by the sequencer 17, for example.

The configuration of the sense amplifier module 13 of the first embodiment is not limited to the configuration described above. For example, the number of latch circuits included in the sense amplifier unit SAU can be designed to an optional number. In this case, the number of latch circuits is designed based on, for example, the number of bits of data held by one memory cell transistor MT. In the above description, reference was made to an example in which sense amplifier unit SAU and bit line BL have one-to-one correspondence, but this is not restrictive. For example, a plurality of bit lines BL may be connected to one sense amplifier unit SAU via a selector.

<1-1-5> Configuration of Semiconductor Memory Device 10

A description will now be given of the configurations of the memory cell array 11, row decoder module 12 and sense amplifier module 13 which are included in the semiconductor memory device 10 of the first embodiment.

FIG. 6 shows an example of a planar layout of the memory cell array 11 of the first embodiment, and shows an example of a planar layout of one string unit SU0 of the memory cell array 11. In the drawings, the X axis corresponds to the extending direction of word lines WL, the Y axis corresponds to the extending direction of bit lines BL, and the Z axis corresponds to the vertical direction perpendicular to the substrate surface.

As shown in FIG. 6, string unit SU0 is provided between contact plugs LI extending in the X direction and adjacent in the Y direction. The contact plugs LI are provided in slits that insulate adjacent string units SU. That is, in the memory cell array 11, a plurality of contact plugs LI are arranged in the Y direction in regions that are not shown, and a string unit SU is provided between the adjacent ones of the contact plugs LI. Two or more string units may be provided between the adjacent ones of the contact plugs LI such that at least select gate lines of the string units are insulated one another.

In the string unit SU0 of this configuration, regions CR and HR are defined in the X direction. The region CR functions as a substantive data storing region, and a plurality of semiconductor pillars MH are provided in region CR. One semiconductor pillar MH corresponds to, for example, one NAND string NS. The region HR functions as a hook up region, and wirings of the memory cell array 11 are connected to the row decoder module 12. Specifically, in the string unit SU0, for example, a conductor 41 functioning as a select gate line SGS, eight conductors 42 functioning as word lines WL0 to WL7 and a conductor 43 functioning as a select gate line SGD are provided such that they each has a portion not overlapping with a conductor of the respective upper layer. The ends of the conductors 41 to 43 are connected to the row decoder module 12 via respective conductive via contacts HU.

Figure 7:
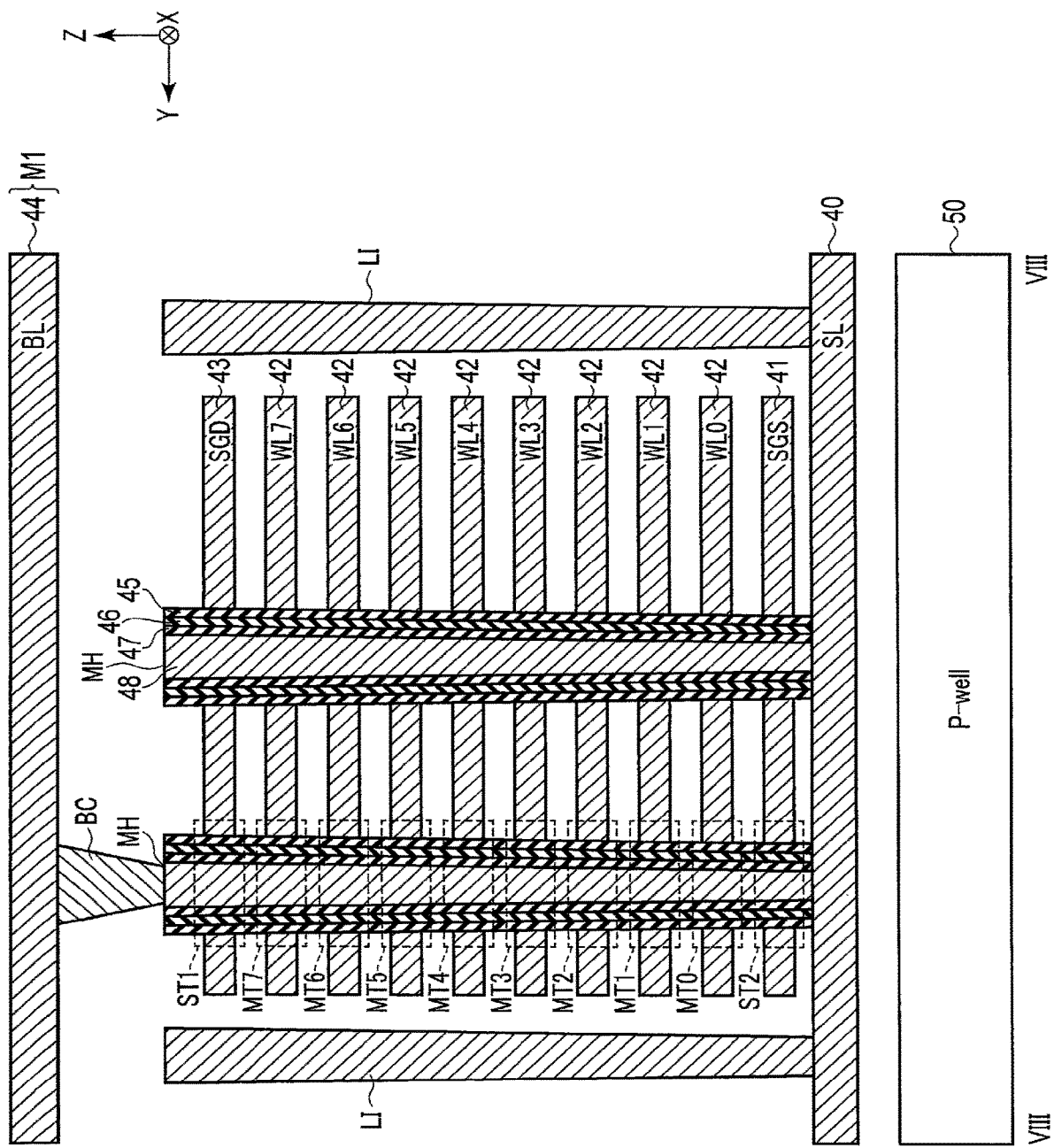
FIG. 7 is a cross-sectional view of the memory cell array taken along VIII-VIII shown in FIG. 6.
Figure 8:
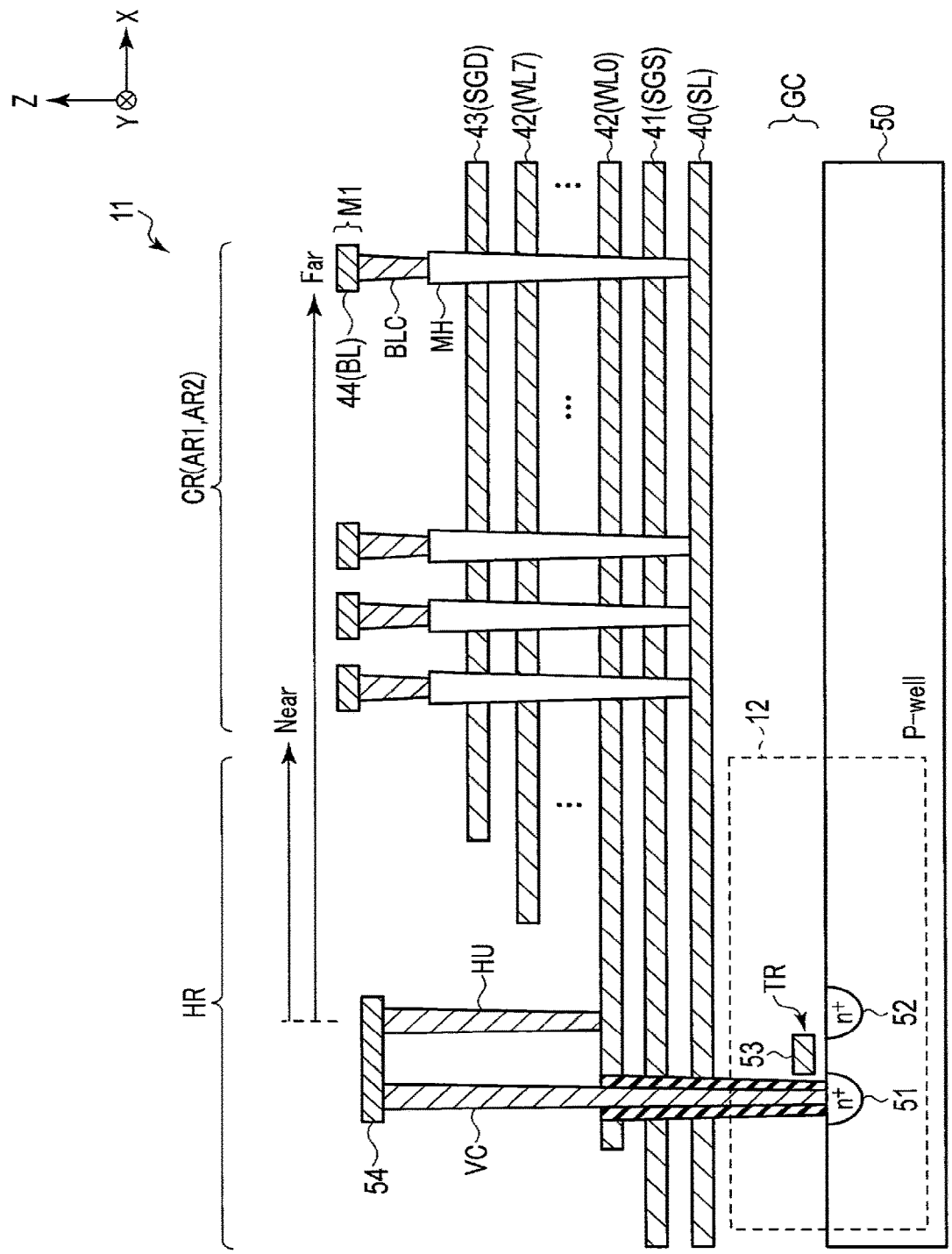
FIG. 8 is a diagram showing an example of a cross-sectional structure of a memory cell array and a row decoder module included in the semiconductor memory device of the first embodiment.

An example of a sectional structure of the memory cell array 11 described above is shown in FIGS. 7 and 8. FIGS. 7 and 8 show an example of a cross-sectional structure of one string unit SU0 of the memory cell array 11. FIG. 7 shows a cross section taken along line VIII-VIII in FIG. 6. FIG. 8 shows a cross section taken along the X direction of FIG. 6 and shows an example connection between the word line WL0 (conductor 42) and the related element in the hook up region HR. In the drawings, illustration of interlayer insulating films is omitted. In FIG. 8, illustration of the semiconductor pillars MH in the region CR is omitted. In FIG. 6, illustration of the contact VC and a conductor 54 which are connected to the contact HU is omitted.

As shown in FIG. 7, in the memory cell array 11, a conductor 40 functioning as a source line SL is provided above a P-type well region 50 formed on a semiconductor substrate. A plurality of contact plugs LI are provided on conductor 40. Between the adjacent contact plugs LI and above the conductor 40, for example, one conductor 41, eight conductors 42 and one conductor 43 are provided in order in the Z direction.

The conductors 40 to 43 each has a plate shape spreading in both the X direction and the Y direction, and the contact plug LI has a plate shape spreading in both the X direction and the Z direction. A plurality of semiconductor pillars MH are provided passing through the conductors 41 to 43. Specifically, the semiconductor pillars MH extend from the upper face of the conductor 43 to the upper surface of the conductor 40.

Each semiconductor pillar MH includes, for example, a block insulating film 45, an insulating film (charge storage layer) 46, a tunnel oxide film 47, and a conductive semiconductor material 48. Specifically, the tunnel oxide film 47 is provided around the semiconductor material 48, the insulating film 46 is provided around the tunnel oxide film 47, and the block insulating film 45 is provided around the insulating film 46. Different materials may be contained in the semiconductor material 48.

With this structure, the intersection between the conductor 41 and the semiconductor pillar MH functions as a select transistor ST2, the intersections between the conductors 42 and the semiconductor pillar MH function as memory cell transistors MT, and the intersection between the conductor 43 and the semiconductor pillar MH functions as a selection transistor ST1.

On the semiconductor material 48 of the semiconductor pillar MH, a conductive via contact BC is provided. On the via contact BC, a conductor 44 functioning as a bit line BL is provided extending in the Y direction. In each string unit SU, the semiconductor pillar MH are connected respectively to the conductor 44 one by one. That is, in each string unit SU, for example, different semiconductor pillars MH are connected to the conductors 44 arranged in the X direction.

As shown in FIG. 8, the row decoder module 12 includes a transistor TR. in region HR, n+ impurity diffusion regions 51 and 52 are formed in the surface region of the P type well region 50. Between the diffusion regions 51 and 52 and on the P-type well region 50, a conductor 53 is provided, with a gate insulation film (not shown) interposed. The diffusion regions 51 and 52 and the conductor 53 function as a source, a drain and a gate electrode of the transistor TR, respectively. A via contact VC is provided on diffusion region 51. The via contact VC passes through the conductors 40 to 42 and is connected to the conductor 54, and the via contact VC and the conductors 40 to 42 are insulated from each other by an insulating film. The conductor 54 is provided, for example, in a wiring layer between the wiring layer of the conductor 43 and the wiring layer of the conductor 44, and is connected to the conductor 42 corresponding to the word line WL0 via the conductive via contact HU. The distance between the via contact HU and each semiconductor pillar MH differs depending upon the position of the semiconductor pillar MH in the X direction. The Near side and Far side described with reference to FIG. 3 are defined in accordance with the distance between the via contact HU and the semiconductor pillar MH.

With this configuration, the row decoder module 12 supplies a voltage to the conductor 42 corresponding to word line WL0 via its transistor TR. In the semiconductor memory device 10, the transistor TR and the conductor 54 (not shown) are provided in plurality correspondingly with the conductors 41 to 43, and the row decoder module 12 supplies voltages to the respective conductors corresponding to various wirings via these transistors TR. In the description below, the wiring layer of the conductor 53 as the gate electrode of the transistor TR will be referred to as a wiring layer GC, and the wiring layer of the conductor 44 as the bit line BL will be referred to as a wiring layer M1.

It should be noted that the configuration of the memory cell array 11 of the first embodiment is not limited to the configuration described above. For example, in the above description, select gate lines SGS and SGD are mentioned as being constituted by single-layer conductors 41 and 43, but select gate lines SGS and SGD may be constituted by plural-layered conductors. In addition, the number of conductors 42 through which one semiconductor pillar MH passes is not limited to the number mentioned above. For example, the number of conductors 42 through which one semiconductor pillar MH passes may be nine or more. By so doing, the number of memory cell transistors MT included in one NAND string NS can be increased to nine or more.

<1-2> Operation

The semiconductor memory device 10 of the first embodiment executes a first kick operation in a read operation. The first kick operation is a voltage application method in which the drive voltage of a driver is temporarily set to a value higher than a target voltage value and is decreased to the target voltage value after the elapse of a predetermined period of time. The first kick operation is performed, for example, on the word line WL. For example, when the first kick operation is performed on the word line WL, the amount of current supplied to the word line WL increases, and the word line WL is charged thereby. In the description below, a voltage higher than a target voltage applied before the application of the target voltage during the first kick operation will be referred to as a first kick voltage, and the difference between the target voltage and the first kick voltage will be referred to as a first kick amount.

Figure 9:
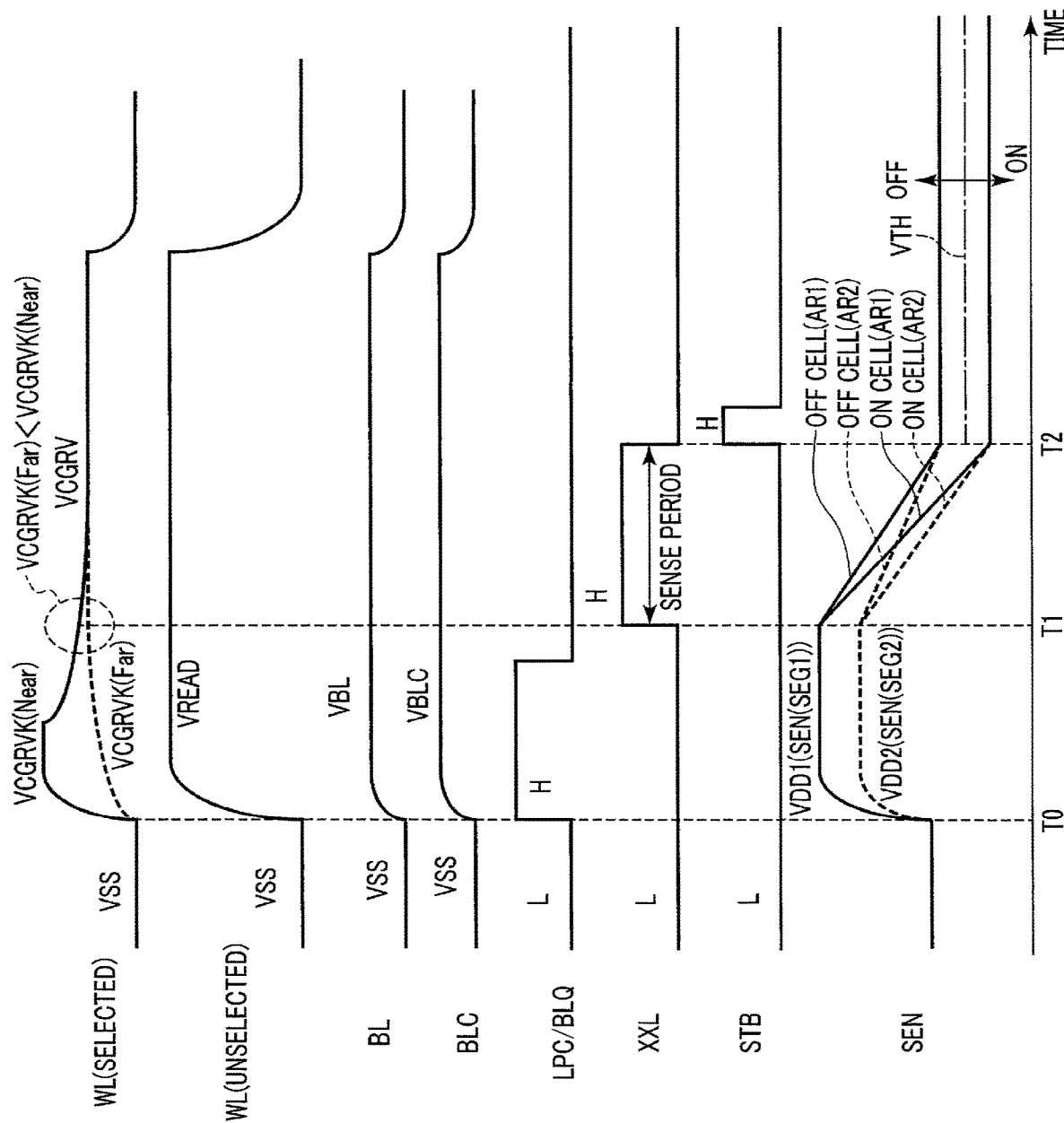
FIG. 9 is a diagram showing an example of waveforms in a read operation performed by the semiconductor memory device of the first embodiment.

FIG. 9 shows an example of waveforms at the time of the read operation performed by the semiconductor memory device 10 of the first embodiment. In FIG. 9, the waveforms at the Near side portion of the word line WL are indicated by solid lines and the waveforms at the Far side portion of the word line WL are indicated by broken lines. Further, in FIG. 9, the power supply voltage VDD1 corresponding to the Near side portion of the word line WL is indicated by solid lines and the power supply voltage VDD2 corresponding to the Far side portion of the word line WL is indicated by broken lines.

In the description below, it is assumed that the N channel MOS transistor to which various control signals are input is turned on when an "H" level voltage is applied to the gate of that transistor, and is turned off when an "L" level voltage is applied to the gate. The memory cell transistor MT corresponding to a selected the word line WL will be referred to as a selected memory cell.

[Before Time T0]

As shown in FIG. 9, in the initial state before time T0, for example, the voltage of the word line WL and a control signal BLC is set to voltage VSS, the voltage of control signals LPC, BLQ, XXL and STB is set to the "L" level, and the voltage of bit line BL is set to voltage VSS.

[Time T0 to Time T1]

When a read operation is started at time T0, the row decoder module 12 performs a first kick operation on a selected word line WL (also referred to as WL (selected)). In this case, for example, a first kick voltage VCGRVK higher than a desired voltage is temporarily applied to the selected word line WL. The first kick voltage VCGRVK appears, for example, as a voltage on the Near side of the word line WL. On the other hand, on the Far side of the word line WL, an RC delay of the wiring occurs, so that the voltage rises, for example, to a voltage VCGRV and does not exceed this voltage VCGRV. The magnitude of the first kick amount can be set to an optional value.

The row decoder module 12 applies a read pass voltage VREAD, for example, to an unselected word line WL (also referred to as WL (not selected)).

The sequencer 17 sets the voltage of control signal BLC to voltage VBLC. Accordingly, a current is supplied from the sense amplifier module 13 to bit line BL, and the voltage of the bit line BL rises to voltage VBL.

Further, the sequencer 17 sets control signals LPC and BLQ to the "H" level. When control signals LPC and BLQ rise to the "H" level, transistor 33 and Tblq are turned on, and the node SEN is charged thereby. When the charging of the node SEN is completed, the sequencer 17 sets control signals LPC and BLQ to the "L" level.

As can be seen from the above, the first power supply voltage VDD1 generated by the driver DR1 is supplied to the node of power supply voltage VDD in the sense amplifier unit SAU included in the segment SEG1. The second power supply voltage VDD2 generated by the driver DR2 is supplied to the node of power supply voltage VDD in the sense amplifier unit SAU included in the segment SEG2. Therefore, in the sense amplifier unit SAU included in the segment SEG1, the node SEN is charged to the first power supply voltage VDD1. In the sense amplifier unit SAU included in the segment SEG2, the node SEN is charged to the second power supply voltage VDD2. Note that the power supply voltage VDD1 is higher than the power supply voltage VDD2 (VDD1>VDD2)

[Time T1 to Time T2]

At time T1, the sequencer 17 sets the control signal XXL to the "H" level. When the control signal XXL is at the "H" level, the potential of the node SEN varies based on the state of a selected memory cell. Note that time T1 is a time before the voltage of the selected word line WL stabilizes to VCGRV.

[Time T2 and After]

The sequencer 17 sets the control signal XXL to the "L" level and control signal STB to the "H" level at time T2 at which the variation in the potential of the node SEN has settled, and based on the state of the node SEN, the sequencer 17 determines the threshold voltage of the selected memory cell and holds the determination result in the latch circuit of the sense amplifier unit SAU.

After the determination result is held in the latch circuit of the sense amplifier unit SAU, the row decoder module 12 and the sequencer 17 return the word line WL and the control signal BLC to the initial state, thereby completing the read operation for the page.

<1-3> Advantages

The semiconductor memory device 10 of the first embodiment described above can perform a read operation at high speed. Detailed advantages of the semiconductor memory device 10 of the first embodiment will be described.

In a semiconductor memory device in which memory cells are three-dimensionally arranged, plate-like conductors 42 are used as word lines WL, as shown in FIGS. 6 and 7, for example. The word lines WL of this structure tend to have a long RC delay, and when a voltage is applied from one end of the word lines WL, the rising speed of the voltage may differ between an area close to the driver (Near side) and an area far from the driver (Far side). In such a case, it takes time until the voltage of the word lines WL stabilizes. Therefore, the semiconductor memory device may execute, for example, a first kick operation in order to assist the voltage rise on the Far side of the word lines WL where the voltage rise is relatively slow.

Figure 10:
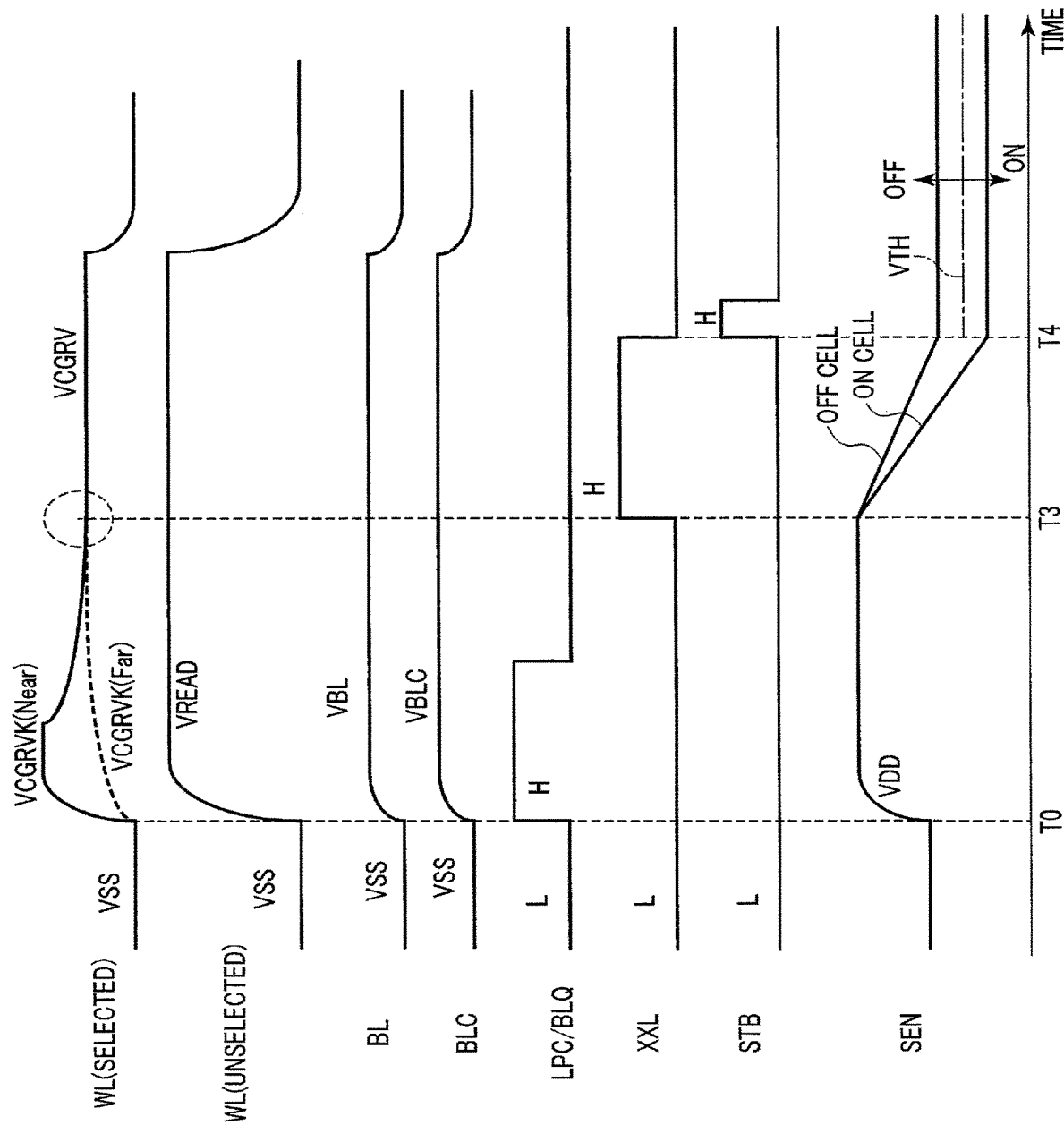
FIG. 10 is a diagram showing an example of waveforms in a read operation performed by a semiconductor memory device according to a comparative example of the first embodiment.

As shown in FIG. 10, even where a kick operation is performed, sensing may be started after the voltage of the word lines WL stabilizes. In the operation example shown in FIG. 10, sensing starts at time T3 later than the sensing start time T1 shown in FIG. 9 (T1<T3). That is, even where the kick operation is performed, it still takes time before the voltage of the word lines WL stabilizes, though the time needed for stabilization is short as compared with the case where the kick operation is not at all performed. Therefore, it is not possible to speed up the read operation.

In order to speed up the read operation, it is conceivable to start sensing at time T1, which is before the voltage of the selected word line WL stabilizes to VCGRV.

A description will be given with reference to FIG. 11 of an example of a read operation which a semiconductor memory device according to the comparative example of the first embodiment performs. FIG. 11 shows an example of how a waveform of the word line WL is on the Near side and the Far side and an example of how a waveform of the node SEN is. The waveforms shown in FIG. 11 differ from the waveforms of the read operation described with reference to FIG. 9, in that a common charge voltage is used at nodes SEN of the segments SEG1 and SEG2. In FIG. 11, the waveforms at the Near side portion of the word line WL are indicated by solid lines and the waveforms at the Far side portion of the word line WL are indicated by broken lines. Further, in FIG. 11, the power supply voltage VDD1 corresponding to the Near side portion of the word line WL is indicated by a solid line and the power supply voltage VDD2 corresponding to the Far side portion of the word line WL is indicated by a broken line.

A description will be given of the case where the nodes SEN of all sense amplifier units SAU are charged to voltage VDD, as shown in FIG. 11.

At time T1, the voltage is higher than the voltage VCGRV at the Near side portion of the word line WL and lower than the voltage VCGRV at the Far side portion of the word line WL. Therefore, in the memory cells on the Near side, the voltage of the word line WL appears high, and in the memory cells on the Far side, the voltage of the word line WL appears low. Accordingly, the cell current Icell flowing to the memory cells on the Near side increases and the cell current Icell flowing to the memory cells on the Far side decreases.

As a result, if the nodes SEN of all sense amplifier units SAU are charged with the same voltage VDD, the Near side is faced with the possibility that the potential of the nodes SEN(SEG1) will be lower than a determination voltage VTH in both the case where a memory cell is turned on (ON CELL) and the case where a memory cell is turned off (OFF CELL). In this case, a memory cell is erroneously determined as being turned on though it should be determined as being turned off. The Far side is faced with the possibility that the potential of the nodes SEN(SEG2) will be higher than the determination voltage VTH in both the case where a memory cell is turned on (ON CELL) and the case where a memory cell is turned off (OFF CELL). In this case, a memory cell is erroneously determined as being turned off though it should be determined as being turned on.

Where sensing is started at time T1, which is before the voltage of the selected word line WL stabilizes to VCGRV, measures should be taken to avoid the erroneous determination described above.

According to the present embodiment, in the sense amplifier units SAU included in the segment SEG1 related to the memory cells on the Near side, the nodes SEN are charged to a somewhat high voltage, namely, the first power supply voltage VDD1. Likewise, in the sense amplifier units SAU included in the segment SEG2 related to the memory cells on the Far side, the nodes SEN are charged to a somewhat low voltage, namely, the second power supply voltage VDD2. Thus, the potentials of the nodes SEN in the segment SEG1 and the segment SEG2 can both be set to appropriate potentials at the time of sensing. As a result, as described with reference to FIG. 9, even if the control signal XXL is set to the "H" level at time T1 before the voltage of the selected word line WL stabilizes to VCGRV, the threshold voltage of the selected memory cell can be appropriately determined, and the possibility as explained with reference to FIG. 11 can be suppressed.

In the above-described embodiment, the charge level of the nodes SEN is switched by setting the power supply to be supplied to the nodes SEN of the sense amplifier to VDD1 or VDD2. On the other hand, one kind of power supply is supplied to the nodes SEN. As in the above-described embodiment, the charge level of the nodes SEN can be switched by changing the magnitudes of control signals LPC and BLQ for each of the areas AR1 and AR2.

<1-4> Modification 1 of First Embodiment
<1-4-1> Operation

A description will be given as to how a read operation is performed according to modification 1 of the first embodiment.

The semiconductor memory device 10 according to modification 1 of the first embodiment executes a second kick operation in a read operation. The second kick operation is a voltage application method in which the drive voltage of a driver is temporarily set to a value lower than a target voltage value and is increased to the target voltage value after the elapse of a predetermined period of time. The second kick operation is performed, for example, on the word line WL. For example, when the second kick operation is performed on the word line WL, the amount of current supplied to the word line WL decreases, and the word line WL is discharged thereby. In the description below, a voltage lower than a target voltage applied before the application of the target voltage during the second kick operation will be referred to as a second kick voltage, and the difference between the target voltage and the second kick voltage will be referred to as a second kick amount.

FIG. 12 shows an example of waveforms at the time of the read operation performed by the semiconductor memory device 10 of modification 1 of the first embodiment. FIG. 12 shows an example of how waveforms of word lines WL, a waveform of the bit line BL, and waveforms of various control signals are on the Near side and the Far side.

[Before Time T10]

As shown in FIG. 12, in the initial state before time T0, for example, the voltage of the word line WL and the control signal BLC is set to voltage VSS, the voltage of control signals LPC, BLQ, XXL and STB is set to "L", and the voltage of the bit line BL is set to voltage VSS.

[Time T10 to Time T11]

When a read operation is started at time T0, the row decoder module 12 applies, for example, a read pass voltage VREAD to the word line WL.

The sequencer 17 sets the voltage of the control signal BLC to the voltage VBLC. Accordingly, a current is supplied from the sense amplifier module 13 to the bit line BL, and the voltage of the bit line BL rises to voltage VBL.

[Time T11 to Time T12]

When a read operation is started at time T11, the row decoder module 12 performs a second kick operation on a selected word line. In this case, for example, a second kick voltage VCGRVLK lower than a desired voltage is temporarily applied to the selected word line WL. The second kick voltage VCGRVK appears, for example, as a voltage on the Near side of the word line WL. On the other hand, on the Far side of the word line WL, an RC delay of the wiring occurs, so that the voltage lowers, for example, to the voltage VCGRV and does not become lower than this voltage VCGRV. The magnitude of the second kick amount can be set to an optional value.

Further, the sequencer 17 sets control signals LPC and BLQ to the "H" level. When control signals LPC and BLQ rise to the "H" level, transistor 33 and Tblq are turned on, and the node SEN is charged thereby. When the charging of the node SEN is completed, the sequencer 17 sets control signals LPC and BLQ to the "L" level.

In the sense amplifier unit SAU included in the segment SEG1, the node SEN is charged to the second power supply voltage VDD2. In the sense amplifier unit SAU included in the segment SEG2, the node SEN is charged to the first power supply voltage VDD1. In the first embodiment, VDD1>VDD2, while in the present modification VDD1<VDD2.

[Time T12 and After]

At time T12, the sequencer 17 sets the control signal XXL to the "H" level. When the control signal XXL is at the "H" level, the potential of the node SEN varies based on the state of a selected memory cell. The sequencer 17 sets the control signal XXL to the "L" level and control signal STB to the "J" level at time T3 at which the variation in the potential of the node SEN has settled, and based on the state of the node SEN, the sequencer 17 determines the threshold voltage of the selected memory cell and holds the determination result in the latch circuit of the sense amplifier unit SAU. Note that time T12 is a time before the voltage of the selected word line WL stabilizes to VCGRV.

After the determination result is held in the latch circuit of the sense amplifier unit SAU, the row decoder module 12 and the sequencer 17 return the word line WL and the control signal BLC to the initial state, thereby completing the read operation for the page.

<1-4-2> Advantage

The semiconductor memory device 10 of modification 1 of the first embodiment described above can perform a read operation at high speed. Detailed advantages of the semiconductor memory device 10 of modification 1 of the first embodiment will be described.

Figure 13:
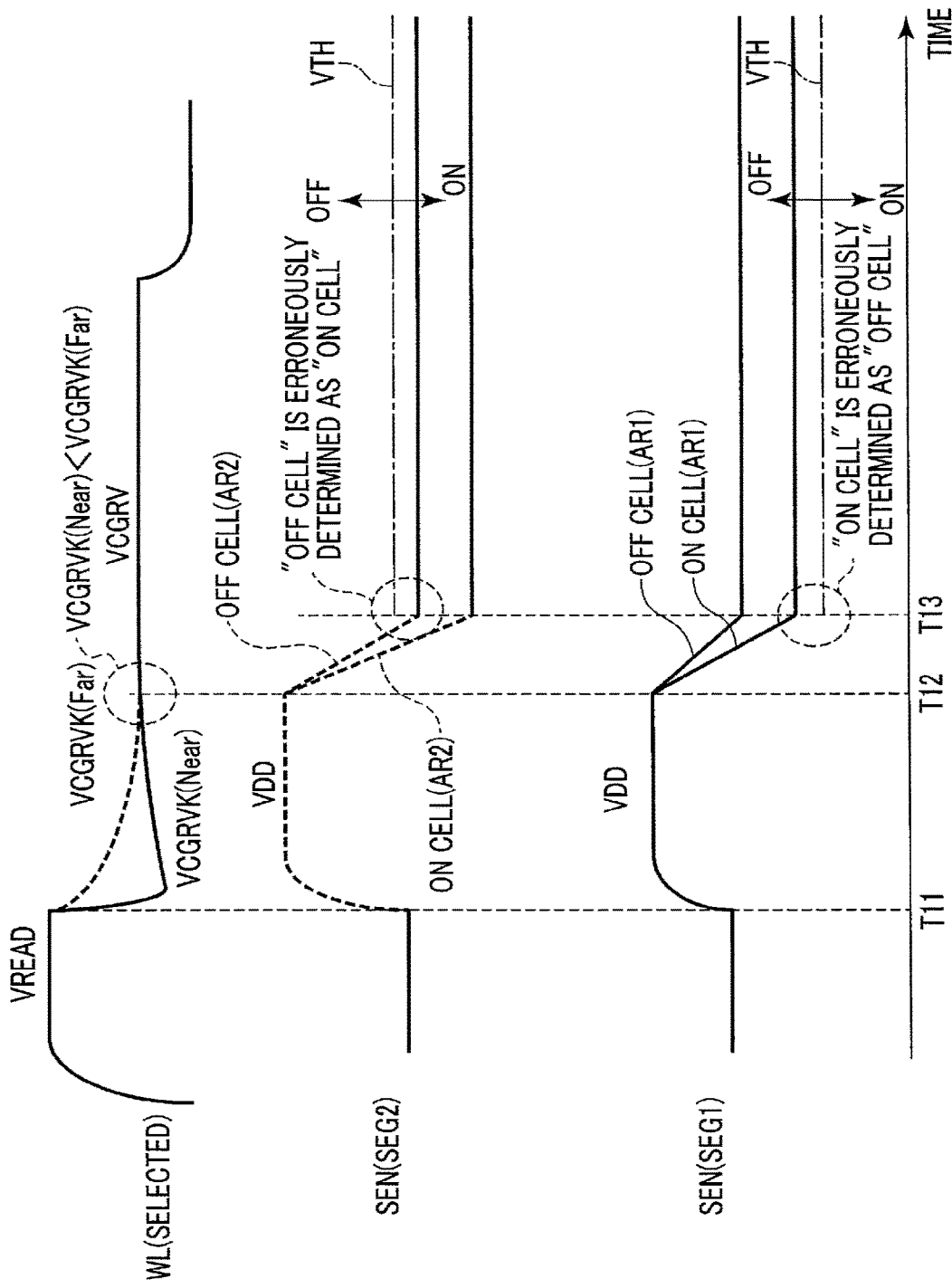
FIG. 13 is a diagram showing part of waveforms in read operations performed in modification 1 of the first embodiment and in the comparative example of the first embodiment.

A description will be given with reference to FIG. 13 of an example of a read operation which a semiconductor memory device according to modification 1 of the first embodiment performs. FIG. 13 shows an example of how a waveform of the word line WL is on the Near side and the Far side and an example of how a waveform of the node SEN is. The waveforms shown in FIG. 11 differ from the waveforms of the read operation described with reference to FIG. 12, in that a common charge voltage is used at the nodes SEN of the segments SEG1 and SEG2.

A description will be given of the case where the nodes SEN of all sense amplifier units SAU are charged to voltage VDD, as shown in FIG. 13.

At time T12, the word line WL on the Far side is higher than the voltage VCGRV. Therefore, in the memory cells on the Far side, the voltage of the word line WL appears high. Accordingly, the cell current Icell flowing to the memory cells increases. As a result, the potential of the nodes SEN(SEG2) may be lower than the determination voltage VTH in both the case where a memory cell is turned on (ON CELL) and the case where a memory cell is turned off (OFF CELL). In this case, a memory cell is erroneously determined as being turned on though it should be determined as being turned off.

At time T12, the word line WL on the Near side is lower than the voltage VCGRV. Therefore, in the memory cells on the Near side, the voltage of the word line WL appears low. Accordingly, the cell current Icell flowing to the memory cells decreases. As a result, the potential of the nodes SEN(SEG1) may be higher than the determination voltage VTH in both the case where a memory cell is turned on (ON CELL) and the case where a memory cell is turned off (OFF CELL). In this case, a memory cell is erroneously determined as being turned off though it should be determined as being turned on.

As described above, if sensing is started at time T12, which is before the voltage of the selected word line WL stabilizes to VCGRV, measures should be taken.

According to the present modification, in the sense amplifier units SAU included in the segment SEG1 related to the memory cells on the Near side, the nodes SEN are charged to a somewhat low voltage, namely, the second power supply voltage VDD2. Likewise, in the sense amplifier units SAU included in the segment SEG2 related to the memory cells on the Far side, the nodes SEN are charged to a somewhat high voltage, namely, the first power supply voltage VDD1. Thus, the potentials of the nodes SEN in the segment SEG1 and the segment SEG2 can both be set to appropriate potentials at the time of sensing. As a result, the possibility as described with reference to FIG. 13 can be suppressed.

<1-5> Modification 2 of First Embodiment

In the semiconductor memory device 10 according to modification 2 of the first embodiment, the sense amplifier module 13 is divided into four areas, and the charge voltage of the nodes SEN is controlled for each of these areas. A description will be given of the points in which the semiconductor memory device 10 according to modification 2 of the first embodiment differs from that according to the first embodiment.

<1-5-1> Configuration

Figure 14:
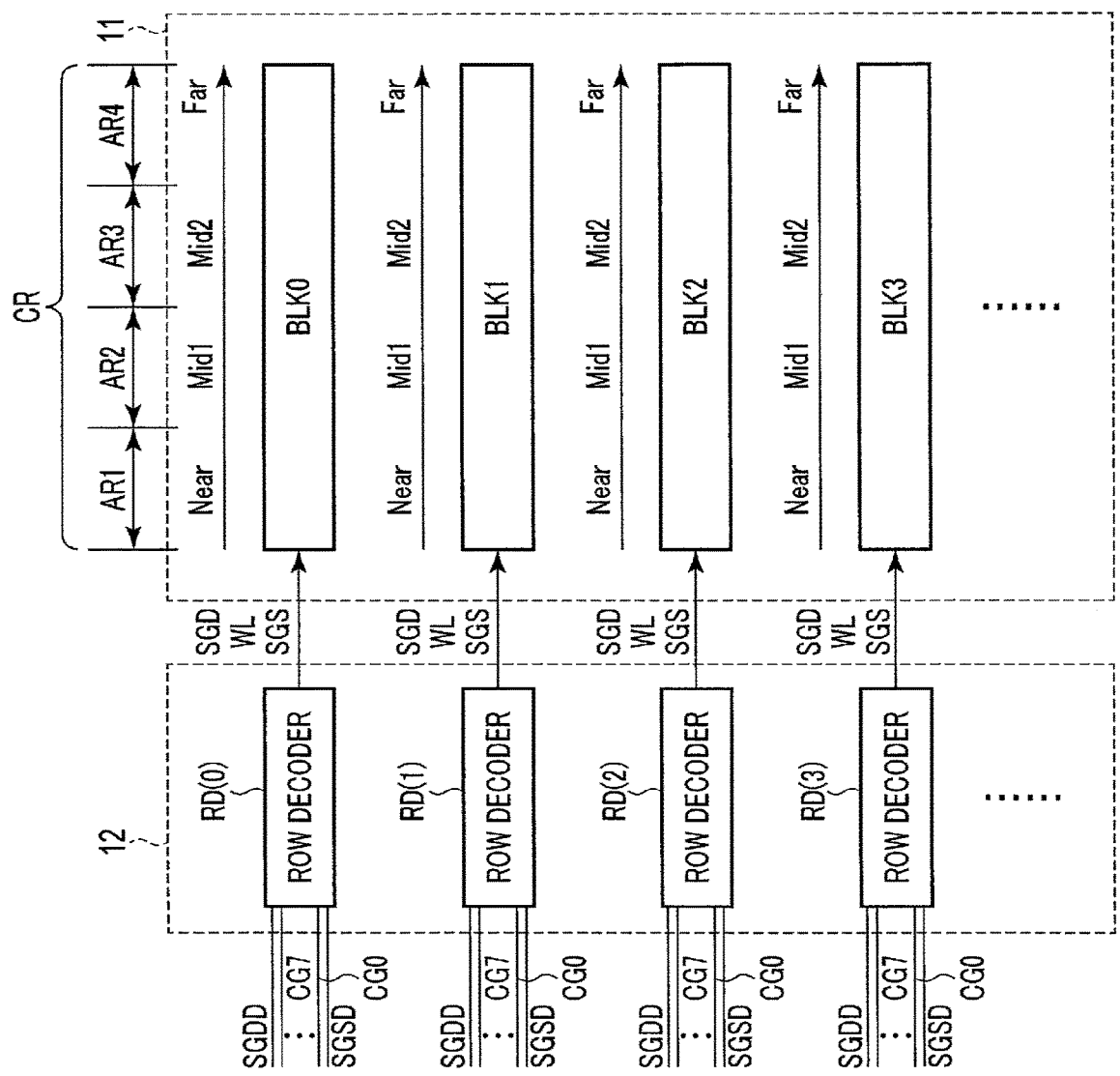
FIG. 14 is block diagram showing a configuration example of a row decoder module included in a semiconductor memory device according to modification 2 of the first embodiment.

FIG. 14 is a block diagram showing a configuration example of a memory cell array 11 and a row decoder module 12 included in the semiconductor memory device 10 according to modification 2 of the first embodiment. The configuration differs from the configuration of the first embodiment described with reference to FIG. 3 in terms of the ranges of the defined areas.

Specifically, in the memory cell array 11 according to modification 2 of the first embodiment, the area AR1, the area AR2, the area AR3 and the area AR4 are defined, as shown in FIG. 14. The area AR1, the area AR2, the area AR3 and the area AR4 are areas that are defined, with the memory cell array 11 being divided in the extending direction of the word lines WL (extending direction of the blocks BLK). In the extending direction of word lines WL (extending direction of blocks BLK), "Near", "Mid1", "Mid2" and "Far" are sequentially defined in a direction away from the region where the row decoders RD are connected. Therefore, the area AR1, the area AR2, the area AR3 and the area AR4 correspond to "Near", "Mid1", "Mid2" and "Far", respectively.

Figure 15:
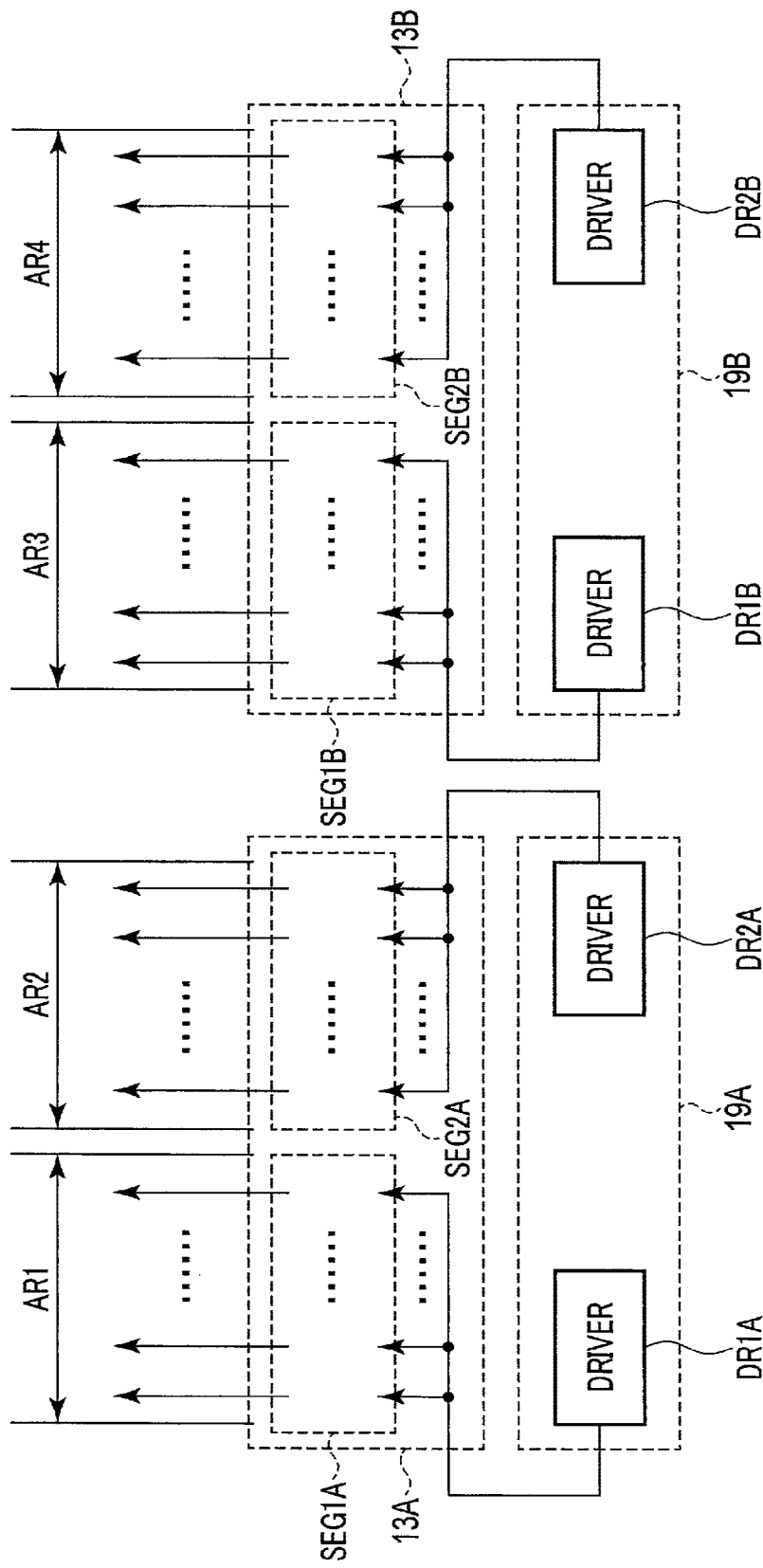
FIG. 15 is a block diagram showing a configuration example of a sense amplifier module and a voltage generation circuit included in the semiconductor memory device of modification 2 of the first embodiment.

FIG. 15 is a block diagram showing a detailed configuration example of the sense amplifier modules 13 (13A and 13B) and voltage generation circuits 19 (19A and 19B) included in the semiconductor memory device 10 of modification 2 of the first embodiment.

As shown in FIG. 15, the semiconductor memory device 10 according to modification 2 of the first embodiment is provided with the sense amplifier module 13A corresponding to the areas AR1 and AR2 and the sense amplifier module 13B corresponding to the areas AR3 and AR4.

The sense amplifier module 13A includes a sense amplifier segment SEG1A corresponding to the area AR1 and a sense amplifier segment SEG2A corresponding to the area AR2.

The sense amplifier units SAU included in the segment SEG1A are connected to the bit line BL corresponding to the NAND string NS provided in the area AR1. The sense amplifier units SAU included in the segment SEG2A are connected to the bit line BL corresponding to the NAND string NS provided in the area AR2.

The sense amplifier module 13A includes a sense amplifier segment SEG1B corresponding to the area AR3 and a sense amplifier segment SEG2B corresponding to the area AR4.

The sense amplifier units SAU included in the segment SEG1B are connected to the bit line BL corresponding to the NAND string NS provided in the area AR3. The sense amplifier units SAU included in the segment SEG2B are connected to the bit line BL corresponding to the NAND string NS provided in the area AR4.

As shown in FIG. 15, the semiconductor memory device 10 according to modification 2 of the first embodiment includes the voltage generation circuit 19A corresponding to the sense amplifier module 13A and the voltage generation circuit 19B corresponding to the sense amplifier module 13B.

The voltage generation circuit 19A includes drivers DR1A and DR2A. The drivers DR1A and DR2A generate first power supply voltage VDD1 and second power supply voltage VDD2, respectively, based on a voltage generated by a charge pump (not shown). The driver DR1A supplies the generated first power supply voltage VDD1 to the sense amplifier units SAU included in the segment SEG1A, and a driver DR2A supplies the generated second power supply voltage VDD2 to the sense amplifier units SAU included in the segment SEG2A.

The voltage generation circuit 19B includes drivers DR1B and DR2B. The drivers DR1B and DR2B generate a third power supply voltage VDD3 and a fourth power supply voltage VDD4, respectively, based on a voltage generated by a charge pump (not shown). The driver DR1B supplies the generated third power supply voltage VDD3 to the sense amplifier units SAU included in the segment SEG1B, and the driver DR2B supplies generated the second power supply voltage VDD4 to the sense amplifier units SAU included in the segment SEG2B.

<1-5-2> Operation

The read operation performed by the semiconductor memory device 10 according to modification 2 of the first embodiment is basically the same as the read operation described with reference to FIGS. 9 and 12.

In the read operation performed by the semiconductor memory device 10 according to modification 2 of the first embodiment, as well as in the read operation according to the above-described first embodiment, a first kick operation is performed on a selected word line WL, and sensing can be performed before the voltage of the word line WL stabilizes (at the rise timing of signal XXL). Where sensing is performed before the voltage of the selected word line WL stabilizes, the charge voltage of the node SEN is controlled in accordance with the potential of the word line WL.

Specifically, at the start of sensing, the potential of the selected word line WL may decrease in the order of "Near", "Mid1", "Mid2", and "Far". In this case, the driver DR1A related to the bit line BL corresponding to the "Near" side supplies the first power supply voltage VDD1, which is the highest voltage among the first power supply voltage VDD1 to the fourth power supply voltage VDD4. The driver DR2A related to the bit line BL corresponding to the "Mid1" side supplies the second power supply voltage VDD2, which is next lower than the first power supply voltage VDD1 (VDD2<VDD1) among the first power supply voltage VDD1 to the fourth power supply voltage VDD4. The driver DRIB related to the bit line BL corresponding to the "Mid2" side supplies the third power supply voltage VDD3, which is next lower than the second power supply voltage VDD2 (VDD3<VDD2) among the first power supply voltage VDD1 to the fourth power supply voltage VDD4. The driver DR2B related to the bit line BL corresponding to the "Far" side supplies the fourth power supply voltage VDD4, which is the lowest voltage (VDD4<VDD3) among the first power supply voltage VDD1 to the fourth power supply voltage VDD4.

In the read operation performed by the semiconductor memory device 10 according to modification 2 of the first embodiment, as well as in the read operation according to the above-described first embodiment, a second kick operation is performed on a selected word line WL, and sensing can be performed before the voltage of the word line WL stabilizes. Where sensing is performed before the voltage of the selected word line WL stabilizes, the charge voltage of the node SEN is controlled in accordance with the potential of the word line WL.

Specifically, at the start of sensing, the potential of the selected word line WL may increase in the order of "Near", "Mid1", "Mid2", and "Far". In this case, the driver DR1A related to the bit line BL corresponding to the "Near" side supplies the first power supply voltage VDD1, which is the lowest voltage among the first power supply voltage VDD1 to the fourth power supply voltage VDD4. The driver DR2A related to the bit line BL corresponding to the "Mid1" side supplies the second power supply voltage VDD2, which is next higher than the first power supply voltage VDD1 (VDD1<VDD2) among the first power supply voltage VDD1 to the fourth power supply voltage VDD4. The driver DRIB related to the bit line BL corresponding to the "Mid2" side supplies the third power supply voltage VDD3, which is next higher than the second power supply voltage VDD2 (VDD2<VDD3) among the first power supply voltage VDD1 to the fourth power supply voltage VDD4. The driver DR2B related to the bit line BL corresponding to the "Far" side supplies the fourth power supply voltage VDD4, which is the highest voltage (VDD3<VDD4) among the first power supply voltage VDD1 to the fourth power supply voltage VDD4.

It should be noted that the potential of the selected word line WL at the start of sensing does not necessarily increase or decrease in the above-mentioned arrangement order of the areas. Even in such a case, it is sufficient that the potential of the selected word line WL at the start of sensing is made to correspond to the charge voltage of the corresponding node SEN.

As described above, the voltage generation circuits 19A and 19B control the first power supply voltage VDD1 to the fourth power supply voltage VDD4, in accordance with the potential of the selected word line WL at the start of sensing. Since the other operations are similar to those of the semiconductor memory device 10 of the first embodiment, a description of such operations will be omitted.

<1-5-3> Advantages of Modification 2 of First Embodiment

As described above, the semiconductor memory device 10 of modification 2 of the first embodiment uses smaller divided areas than those of the semiconductor memory device 10 of the first embodiment, so that the read operation can be performed at high speed and yet the charge voltage of the node SEN can be finely controlled.

<1-6> Modification 3 of First Embodiment

In the semiconductor memory device 10 according to modification 3 of the first embodiment, the sense amplifier module 13 is divided into eight areas, and the charge voltage of the nodes SEN is controlled for each of these areas. A description will be given of the points in which the semiconductor memory device 10 according to modification 3 of the first embodiment differs from that according to the first embodiment.

<1-6-1> Configuration

FIG. 16 is a block diagram showing a configuration example of a memory cell array 11 and a row decoder module 12 included in the semiconductor memory device 10 according to modification 3 of the first embodiment. The configuration differs from the configuration of the first embodiment described with reference to FIG. 3 in terms of the ranges of the defined areas.

Specifically, in the memory cell array 11 according to modification 3 of the first embodiment, areas AR1 to AR8 are defined, as shown in FIG. 16. The areas AR1 to AR8 are areas defined, with the memory cell array 11 being divided in the extending direction of the word lines WL (extending direction of the blocks BLK). In the extending direction of word lines WL (extending direction of the blocks BLK), "Near", "Mid1", "Mid2", "Mid3", "Mid4", "Mid5", "Mid6" and "Far" are sequentially defined in a direction away from the region where the row decoders RD are connected. Areas AR1 to AR8 correspond to "Near", "Mid1", "Mid2", "Mid3", "Mid4", "Mid5", "Mid6", and "Far", respectively.

Figure 17:
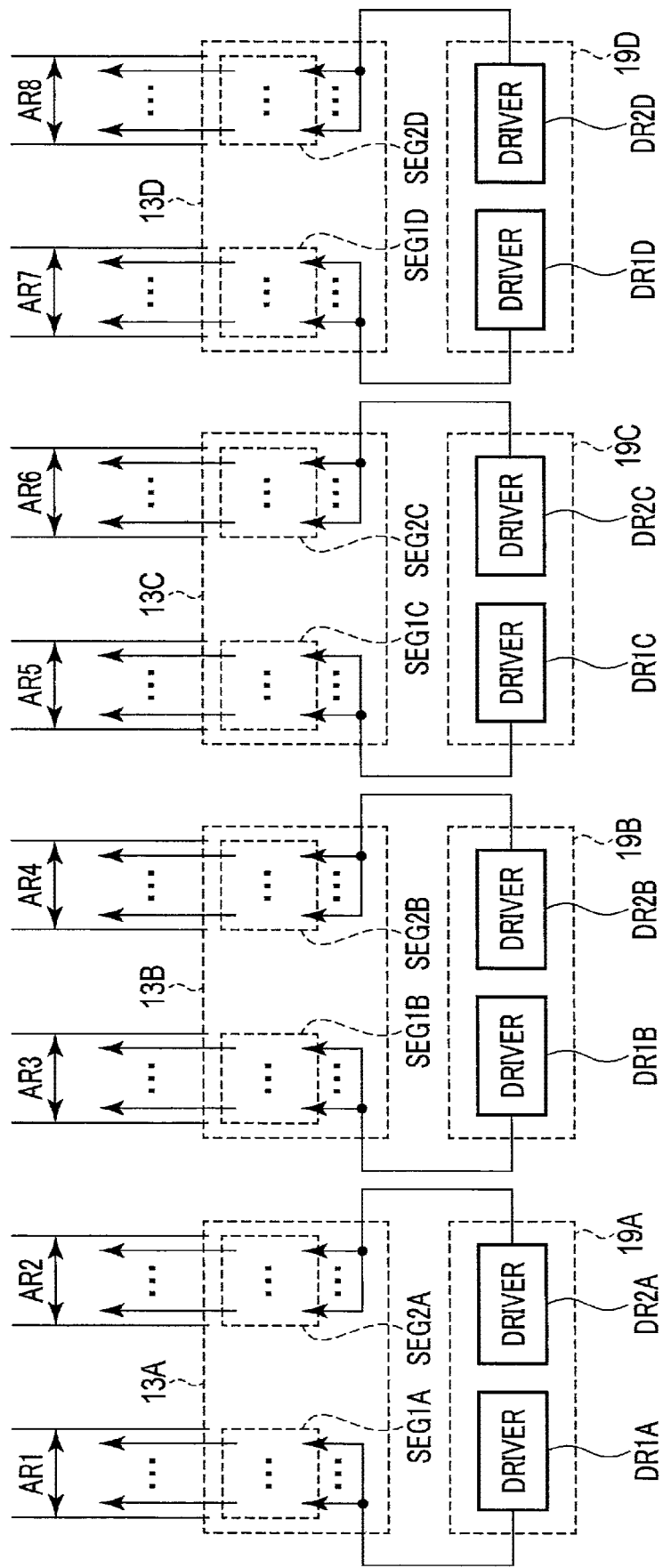
FIG. 17 is a block diagram showing a configuration example of a sense amplifier module and a voltage generation circuit included in the semiconductor memory device of modification 3 of the first embodiment.

FIG. 17 is a block diagram showing a detailed configuration example of the sense amplifier modules 13 (13A, 13B, 13C and 13D) and the voltage generation circuits 19 (19A, 19B, 19C and 19D) included in the semiconductor memory device 10 of modification 3 of the first embodiment.

As shown in FIG. 17, the semiconductor memory device 10 according to modification 3 of the first embodiment includes the sense amplifier module 13A corresponding to the areas AR1 and AR2, the sense amplifier module 13B corresponding to the areas AR3 and AR4, the sense amplifier module 13C corresponding to the areas AR5 and AR6, and the sense amplifier module 13D corresponding to the areas AR7 and AR8.

The sense amplifier modules 13A and 13B have a configuration similar to that described in connection with modification 2 of the first embodiment.

The sense amplifier module 13C includes a sense amplifier segment SEG1C corresponding to the area AR5 and a sense amplifier segment SEG2C corresponding to the area AR6.

The sense amplifier units SAU included in the segment SEG1C are connected to the bit line BL corresponding to the NAND string NS provided in the area AR5. The sense amplifier units SAU included in the segment SEG2C are connected to the bit line BL corresponding to the NAND string NS provided in the area AR6.

The sense amplifier module 13D includes a sense amplifier segment SEG1D corresponding to the area AR7 and a sense amplifier segment SEG2D corresponding to the area AR8.

The sense amplifier units SAU included in the segment SEG1D are connected to the bit line BL corresponding to the NAND string NS provided in the area AR7. The sense amplifier units SAU included in the segment SEG2D are connected to the bit line BL corresponding to the NAND string NS provided in the area AR8.

As shown in FIG. 15, the semiconductor memory device 10 according to the first embodiment includes the voltage generation circuit 19A corresponding to the sense amplifier module 13A, the voltage generation circuit 19B corresponding to the sense amplifier module 13B, the sense amplifier module 13C corresponding the voltage generation circuit 19C, and the voltage generation circuit 19D corresponding to the sense amplifier module 13D.

The voltage generation circuits 19A and 19B have a configuration similar to that described in connection with modification 2 of the first embodiment.

The voltage generation circuit 19B includes drivers DR1C and DR2C. The drivers DR1C and DR2C generate a fifth power supply voltage VDD5 and a sixth power supply voltage VDD6, respectively, based on a voltage generated by a charge pump (not shown). The driver DR1C supplies the generated fifth power supply voltage VDD5 to the sense amplifier units SAU included in the segment SEG1C, and the driver DR2C supplies the generated sixth power supply voltage VDD6 to the sense amplifier units SAU included in the segment SEG2C.

The voltage generation circuit 19D includes drivers DR1D and DR2D. The drivers DR1D and DR2D generate a seventh power supply voltage VDD7 and an eighth power supply voltage VDD8, respectively, based on a voltage generated by a charge pump (not shown). The driver DR1D supplies the generated seventh power supply voltage VDD7 to the sense amplifier units SAU included in the segment SEG1D, and the driver DR2D supplies the generated eighth power supply voltage VDD8 to the sense amplifier units SAU included in the segment SEG2D.

<1-6-2> Operation

The read operation performed by the semiconductor memory device 10 according to modification 3 of the first embodiment is basically the same as the read operation described with reference to FIGS. 9 and 12.

In the read operation performed by the semiconductor memory device 10 according to modification 3 of the first embodiment, as well as in the read operation according to the above-described first embodiment, a first kick operation is performed on a selected word line WL, and sensing can be performed before the voltage of the word line WL stabilizes (at the rise timing of signal XXL). Where sensing is performed before the voltage of the selected word line WL stabilizes, the charge voltage of the node SEN is controlled in accordance with the potential of the word line WL.

Specifically, at the start of sensing, the potential of the selected word line WL may decrease in the order of "Near", "Mid1", "Mid2", "Mid3", "Mid4", "Mid5", "Mid6", and "Far". In this case, the driver DR1A related to the bit line BL corresponding to the "Near" side supplies the first power supply voltage VDD1, which is the highest voltage among the first power supply voltage VDD1 to the eighth power supply voltage VDD8. The driver DR2A related to the bit line BL corresponding to the "Mid1" side supplies the second power supply voltage VDD2, which is next lower than the first power supply voltage VDD1 (VDD2<VDD1) among the first power supply voltage VDD1 to the eighth power supply voltage VDD8. The driver DR1B related to the bit line BL corresponding to the "Mid2" side supplies the third power supply voltage VDD3, which is next lower than the second power supply voltage VDD2 (VDD3<VDD2) among the first power supply voltage VDD1 to the eighth power supply voltage VDD8. The driver DR2B related to the bit line BL corresponding to the "Mid3" side supplies the fourth power supply voltage VDD4, which is next lower than the third power supply voltage VDD3 (VDD4<VDD3) among the first power supply voltage VDD1 to the eighth power supply voltage VDD8. The driver DR1C related to the bit line BL corresponding to the "Mid4" side supplies the fifth power supply voltage VDD5, which is next lower than the fourth power supply voltage VDD4 (VDD5<VDD4) among the first power supply voltage VDD1 to the eighth power supply voltage VDD8. The driver DR2C related to the bit line BL corresponding to the "Mid5" side supplies the sixth power supply voltage VDD6, which is next lower than the fifth power supply voltage VDD5 (VDD6<VDD5) among the first power supply voltage VDD1 to the eighth power supply voltage VDD8. The driver DR1D related to the bit line BL corresponding to the "Mid6" side supplies the seventh power supply voltage VDD7, which is next lower than the sixth power supply voltage VDD6 (VDD7<VDD6) among the first power supply voltage VDD1 to the eighth power supply voltage VDD8. The driver DR2D related to the bit line BL corresponding to the "Far" side supplies the eighth power supply voltage VDD8, which is the lowest voltage (VDD8<VDD7) among the first power supply voltage VDD1 to the eighth power supply voltage VDD8.

In the read operation performed by the semiconductor memory device 10 according to modification 3 of the first embodiment, as well as in the read operation according to the above-described first embodiment, a second kick operation is performed on a selected word line WL, and sensing can be performed before the voltage of the word line WL stabilizes. Where sensing is performed before the voltage of the selected word line WL stabilizes, the charge voltage of the node SEN is controlled in accordance with the potential of the word line WL.

Specifically, at the start of sensing, the potential of the selected word line WL may increase in the order of "Near", "Mid1", "Mid2", "Mid3", "Mid4", "Mid5", "Mid6", and "Far". In this case, the driver DR1A related to the bit line BL corresponding to the "Near" side supplies the first power supply voltage VDD1, which is the lowest voltage among the first power supply voltage VDD1 to the eighth power supply voltage VDD8. The driver DR2A related to the bit line BL corresponding to the "Mid1" side supplies the second power supply voltage VDD2, which is next higher than the first power supply voltage VDD1 (VDD1<VDD2) among the first power supply voltage VDD1 to the eighth power supply voltage VDD8. The driver DR1B related to the bit line BL corresponding to the "Mid2" side supplies the third power supply voltage VDD3, which is next higher than the second power supply voltage VDD2 (VDD2<VDD3) among the first power supply voltage VDD1 to the eighth power supply voltage VDD8. The driver DR2B related to the bit line BL corresponding to the "Mid3" side supplies the fourth power supply voltage VDD4, which is next higher than the third power supply voltage VDD3 (VDD3<VDD4) among the first power supply voltage VDD1 to the eighth power supply voltage VDD8. The driver DR1C related to the bit line BL corresponding to the "Mid4" side supplies the fifth power supply voltage VDD5, which is next higher than the fourth power supply voltage VDD4 (VDD4<VDD5) among the first power supply voltage VDD1 to the eighth power supply voltage VDD8. The driver DR2C related to the bit line BL corresponding to the "Mid5" side supplies the sixth power supply voltage VDD6, which is next higher than the fifth power supply voltage VDD5 (VDD5<VDD6) among the first power supply voltage VDD1 to the eighth power supply voltage VDD8. The driver DR1D related to the bit line BL corresponding to the "Mid6" side supplies the seventh power supply voltage VDD7, which is next higher than the sixth power supply voltage VDD6 (VDD6<VDD7) among the first power supply voltage VDD1 to the eighth power supply voltage VDD8. The driver DR2D related to the bit line BL corresponding to the "Far" side supplies the eighth power supply voltage VDD8, which is the highest voltage (VDD7<VDD8) among the first power supply voltage VDD1 to the eighth power supply voltage VDD8.

It should be noted that the potential of the selected word line WL at the start of sensing does not necessarily increase or decrease in the above-mentioned arrangement order of the areas. Even in such a case, it is sufficient that the potential of the selected word line WL at the start of sensing is made to correspond to the charge voltage of the corresponding node SEN.

As described above, the voltage generation circuits 19A, 19B, 19C and 19D change the charge voltage of the node SEN and controls the first power supply voltage VDD1 to the eighth power supply voltage VDD8, in accordance with the potential of the selected word line WL at the start of sensing. Since the other operations are similar to those of the semiconductor memory device 10 of the first embodiment, a description of such operations will be omitted.

<1-6-3> Advantages of Modification 3 of First Embodiment

As described above, the semiconductor memory device 10 of modification 3 of the first embodiment uses smaller divided areas than those of the semiconductor memory device 10 of the first embodiment, so that the read operation can be performed at high speed and yet the charge voltage of the node SEN can be finely controlled.

<1-7> Modification 4 of First Embodiment

The semiconductor memory device 10 according to Modification 4 of the first embodiment divides row decoder module 12 into two regions (12A, 12B) and controls the blocks. A description will be given of the points in which the semiconductor memory device 10 according to modification 4 of the first embodiment differs from that according to the first embodiment.

Figure 18:
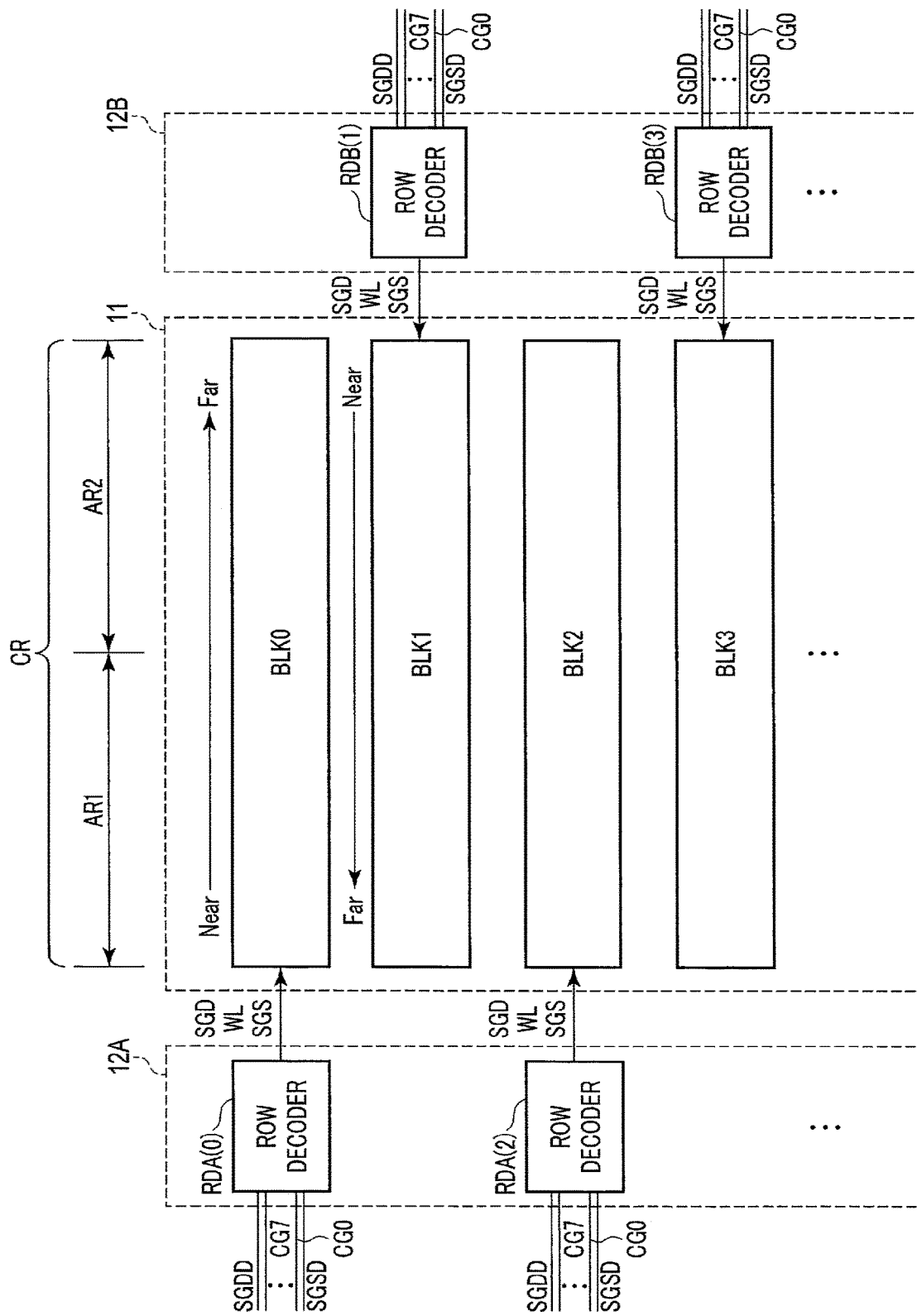
FIG. 18 is block diagram showing a configuration example of a row decoder module included in a semiconductor memory device according to modification 4 of the first embodiment.

FIG. 18 is a block diagram showing a detailed configuration example of row decoder modules 12A and 12B included in the semiconductor memory device 10 of modification 4 of the first embodiment, and illustrates how each of the blocks BLK included in the memory cell array 11 is related to the row decoder modules 12A and 12B. As shown in FIG. 18, the row decoder module 12A includes a plurality of row decoders RDA, and the row decoder module 12B includes a plurality of row decoders RDB.

The row decoders RDA are provided corresponding to even-numbered blocks (e.g., BLK0, BLK2, . . . ), and the row decoders RDB are provided corresponding to odd-numbered blocks (e.g., BLK1, BLK3, . . . ). Specifically, for example, different row decoders RDA(0) and RDA(2) are associated with blocks BLK0 and BLK2, and different row decoders RDB(1) and RDB(3) are associated with blocks BLK1 and BLK3.

The voltage supplied from the voltage generation circuit 19 is applied to each block BLK via either of the row decoders RDA and RDB. The row decoder RDA applies a voltage to the word lines WL of the even-numbered blocks from one side as viewed in the extending direction of word lines WL, and the row decoder RDB applies a voltage to the word lines WL of the odd-numbered blocks from the other side as viewed in the extending direction of the word lines. As shown in FIG. 18, the areas AR1 and AR2 are defined for the configuration described above.

In the description below, an area close to the region to which the row decoder RDA or RDB corresponding to each block BLK is connected will be referred to as "Near", and an area far away from that region will be referred to as "Far". That is, for example, in the block BLK0, the area AR1 corresponds to the Near side and the area AR2 corresponds to the Far side. Likewise, in the block BLK1, the area AR2 corresponds to the Near side, and the area AR1 corresponds to the Far side.

The read operation performed by the semiconductor memory device 10 according to modification 4 of the first embodiment is the same as the read operations of the first embodiment and modification 1 of the first embodiment. When an even-numbered block is selected, the row decoder module 12A executes the operation performed by the row decoder module 12 of the first embodiment or modification 1 of the first embodiment. When an odd-numbered block is selected, the row decoder module 12B executes the operation performed by the row decoder module 12 of the first embodiment or modification 1 of the first embodiment. Driver DR1 changes the magnitude of the first power supply voltage VDD1 between the case where an even-numbered block is selected and the case where an odd-numbered block is selected. Also, driver DR2 changes the magnitude of the second power supply voltage VDD2 between the case where an even-numbered block is selected and the case where an odd-numbered block is selected. Specifically, when an even-numbered block is selected, the first power supply voltage VDD1 may be higher than the second power supply voltage VDD2. In this case, the first power supply voltage VDD1 may be lower than the second power supply voltage VDD2 when the odd-numbered block is selected.

It should be noted that the potential of the selected word line WL at the start of sensing does not necessarily increase or decrease in the above-mentioned arrangement order of the areas. Even in such a case, it is sufficient that the potential of the selected word line WL at the start of sensing is made to correspond to the charge voltage of the corresponding node SEN.

As described above, the voltage generation circuit 19 controls the charge voltage of the node SEN in accordance with the magnitude of the potential of the selected word line WL at the start of sensing. Since the other operations are similar to those of the semiconductor memory device 10 of the first embodiment, a description of such operations will be omitted.

<1-8> Modification 5 of First Embodiment

The semiconductor memory device 10 according to modification 5 of the first embodiment is a combination of modification 2 of the first embodiment and modification 4 of the first embodiment. A description will be given of the points in which the semiconductor memory device 10 according to modification 5 of the first embodiment differs from that according to modification 2 the first embodiment and that according to modification 4 of the first embodiment.

Figure 19:
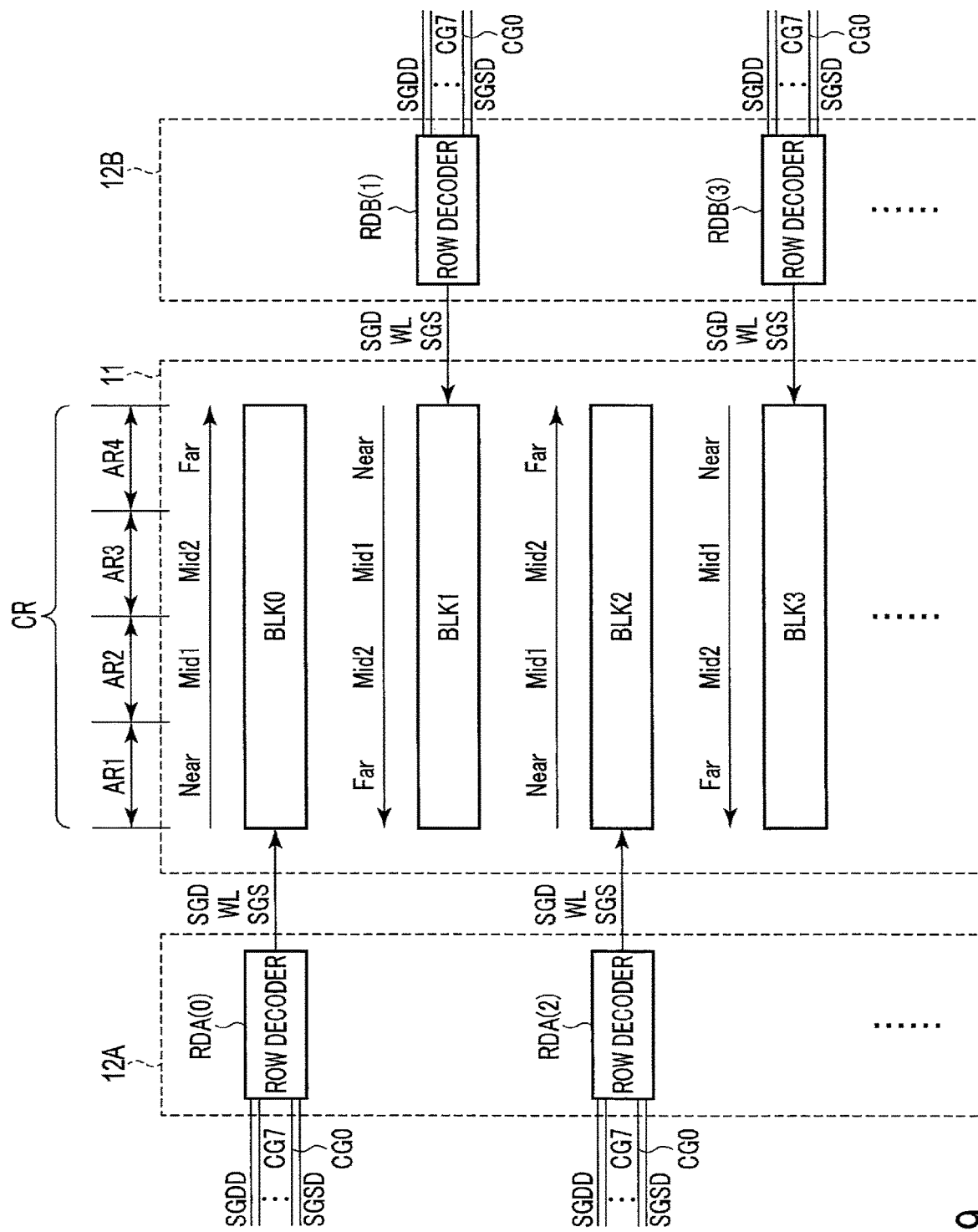
FIG. 19 is block diagram showing a configuration example of a row decoder module included in a semiconductor memory device according to modification 5 of the first embodiment.

FIG. 19 is a block diagram showing a detailed configuration example of the row decoder modules 12A and 12B included in the semiconductor memory device 10 of modification 5 of the first embodiment, and illustrates how each of the blocks BLK included in the memory cell array 11 is related to the row decoder modules 12A and 12B.

As shown in FIG. 19, the relationship between each block BLK included in the memory cell array 11 and the row decoder modules 12A and 12B is similar to the relationship described in connection with modification 4 of the first embodiment.

As shown in FIG. 19, the areas AR1 to AR4 are defined for the configuration described above.

In the description below, the areas in a direction away from the region to which the row decoder RDA or RDB corresponding to each block BLK is connected will be referred to as "Near", "Mid1", "Mid2", and "Far", That is, for example, in the block BLK0, the area AR1 corresponds to the Near side, the area AR2 corresponds to the Mid1 side, the area AR3 corresponds to the Mid2 side, and the area AR4 corresponds to the Far side. Likewise, in the block BLK1, the area AR1 corresponds to the Far side, the area AR2 corresponds to the Mid2 side, the area AR3 corresponds to the Mid1 side, and the area AR4 corresponds to the Near side.

The read operation performed by the semiconductor memory device 10 according to modification 5 of the first embodiment is the same as the first embodiment and modification 1 of the first embodiment. When an even-numbered block is selected, the row decoder module 12A executes the operation performed by the row decoder module 12 of the first embodiment or modification 1 of the first embodiment. When an odd-numbered block is selected, the row decoder module 12B executes the operation performed by the row decoder module 12 of the first embodiment or modification 1 of the first embodiment.

The driver DR1A and DR2B change the magnitudes of the first power supply voltage VDD1 to the fourth power supply voltage VDD4 between the case where an even-numbered block is selected and the case where an odd-numbered block is selected. The magnitudes of the first power supply voltage VDD1 to the fourth power supply voltage VDD4 correspond to the potential of selected the word line WL at the start of sensing.

As described above, the voltage generation circuit 19 controls the charge voltage of the node SEN in accordance with the magnitude of the potential of the selected word line WL at the start of sensing. Since the other operations are similar to those of the semiconductor memory device 10 of the first embodiment, a description of such operations will be omitted.

<1-9> Modification 6 of First Embodiment

The semiconductor memory device 10 according to modification 6 of the first embodiment is a combination of modification 3 of the first embodiment and modification 4 of the first embodiment. A description will be given of the points in which the semiconductor memory device 10 according to modification 6 of the first embodiment differs from that according to modification 3 the first embodiment and that according to modification 4 of the first embodiment.

FIG. 20 is a block diagram showing a detailed configuration example of the row decoder modules 12A and 12B included in the semiconductor memory device 10 of modification 6 of the first embodiment, and illustrates how each of the blocks BLK included in the memory cell array 11 is related to the row decoder modules 12A and 12B.

As shown in FIG. 20, the relationship between each block BLK included in the memory cell array 11 and the row decoder modules 12A and 12B is similar to the relationship described in connection with modification 4 of the first embodiment.

As shown in FIG. 20, the areas AR1 to AR8 are defined for the configuration described above.

In the description below, the areas in a direction away from the region to which the row decoder RDA or RDB corresponding to each block BLK is connected will be referred to as "Near", "Mid1", "Mid2", "Mid3", "Mid4", "Mid5", "Mid6", and "Far", That is, for example, in the block BLK0, the area AR1 corresponds to the Near side, the area AR2 corresponds to the Mid1 side, the area AR3 corresponds to the Mid2 side, the area AR4 corresponds to the Mid3 side, the area AR5 corresponds to the Mid4 side, AR6 corresponds to the Mid5 side, the area AR7 corresponds to the Mid6 side, and the area AR8 corresponds to the Far side. Likewise, in the block BLK1, the area AR1 corresponds to the Far side, the area AR2 corresponds to the Mid6 side, the area AR3 corresponds to the Mid5 side, the area AR4 corresponds to the Mid4 side, the area AR5 corresponds to the Mid3 side, the area AR6 corresponds to the Mid2 side, the area AR7 corresponds to the "Mid1" side, and the area AR8 corresponds to the "Near" side.

The read operation performed by the semiconductor memory device 10 according to modification 6 of the first embodiment is the same as modification 3 of the first embodiment. When an even-numbered block is selected, the row decoder module 12A executes the operation performed by the row decoder module 12 of modification 3 of the first embodiment. When an odd-numbered block is selected, the row decoder module 12B executes the operation performed by the row decoder module 12 of modification 3 of the first embodiment.

The read operation performed by the semiconductor memory device 10 according to modification 6 of the first embodiment is the same as the first embodiment and modification 1 of the first embodiment. When an even-numbered block is selected, the row decoder module 12A executes the operation performed by the row decoder module 12 of the first embodiment or modification 1 of the first embodiment. When an odd-numbered block is selected, the row decoder module 12B executes the operation performed by the row decoder module 12 of the first embodiment or modification 1 of the first embodiment.

The drivers DR1A to DR2D change the magnitudes of the first power supply voltage VDD1 to the eighth power supply voltage VDD8 between the case where an even-numbered block is selected and the case where an odd-numbered block is selected. The magnitudes of the first power supply voltage VDD1 to the eighth power supply voltage VDD8 correspond to the potential of the selected word line WL at the start of sensing.

As described above, the voltage generation circuit 19 controls the magnitude of the charge voltage of the node SEN in accordance with the magnitude of the potential of the selected word line WL at the start of sensing. Since the other operations are similar to those of the semiconductor memory device 10 of the first embodiment, a description of such operations will be omitted.

<1-10> Modification 7 of First Embodiment

In the semiconductor memory device 10 according to modification 7 of the first embodiment, the row decoder modules 12A and 12B drive the respective blocks BLK from both sides. A description will be given of the points in which the semiconductor memory device 10 according to modification 7 of the first embodiment differs from that according to the first embodiment, that according to modification 1 the first embodiment and that according to modification 4 of the first embodiment.

FIG. 21 is a block diagram showing a configuration example of a memory cell array 11 and a row decoder module 12 included in the semiconductor memory device 10 according to modification 7 of the first embodiment. The configuration differs from the configuration described in connection with modification 4 of the first embodiment in terms of the configurations of the row decoder modules 12A and 12B.

Specifically, as shown in FIG. 21, the row decoder module 12A of modification 7 of the first embodiment includes row decoders RDA(0) to RDA(n) corresponding to the blocks BLK0 to BLKn, and the row decoder module 12B includes decoders RDB(0) to RDB(n) corresponding to the blocks BLK0 to BLKn. That is, in modification 7 of the first embodiment, each block BLK is driven from both sides thereof by the row decoder modules 12A and 12B. More specifically, for example, the row decoder RDA supplies a voltage from one end side of the conductor 42 corresponding to the word line WL, and the row decoder RDB supplies a voltage from the other end side. In the description below, in each block BLK, areas close to the row decoders RDA and RDB will be referred to as "Near", and areas including the center portion of block BLK will be referred to as "Far". That is, the areas AR1 and AR4 correspond to the "Near" portions, and the areas AR2 and AR3 correspond to the "Far" portions.

The configuration of the voltage generation circuit 19 is similar to that described with reference to FIG. 15.

According to modification 7 of the first embodiment, the driver DR1A supplies the generated first power supply voltage VDD1 to the sense amplifier units SAU included in the segment SEG1A, and the driver DR2A supplies the generated second power supply voltage VDD2 to the sense amplifier units SAU included in the segment SEG2A.

The driver DR1B supplies the generated second power supply voltage VDD2 to the sense amplifier units SAU included in the segment SEG1B, and the driver DR2B supplies the generated first power supply voltage VDD1 to the sense amplifier units SAU included in the segment SEG2B.

In the read operation performed by the semiconductor memory device 10 according to modification 7 of the first embodiment, as well as in the read operation according to the above-described first embodiment, a first kick operation is performed on a selected word line WL, and sensing can be performed before the voltage of the word line WL stabilizes. When sensing is performed before the voltage of the selected word line WL stabilizes, the voltage of the word line WL on the "Far" side is lower than the voltage on the "Near" side, as in the first embodiment. Therefore, the drivers DR1A and DR2B related to the bit line BL corresponding to the "Near" side supply a high first power supply voltage VDD1. Also, the drivers DR2A and DR1B related to the bit line BL corresponding to the "Far" side supply a low second power supply voltage VDD2 (VDD2<VDD1).

In the read operation performed by the semiconductor memory device 10 according to modification 7 of the first embodiment, as well as in the read operation according to the above-described modifications of the first embodiment, a second kick operation is performed on a selected word line WL, and sensing can be performed before the voltage of word line WL stabilizes. When sensing is performed before the voltage of the selected word line WL stabilizes, the voltage of the word line WL on the "Far" side is higher than the voltage on the "Near" side, as in the modifications of the first embodiment. Therefore, the drivers DR1A and DR2B related to the bit line BL corresponding to the "Near" side supply a low first power supply voltage VDD1. Also, the drivers DR2A and DR1B related to the bit line BL corresponding to the "Far" side supply a high second power supply voltage VDD2 (VDD1<VDD2).

As described above, the voltage generation circuit 19 controls the magnitude of the charge voltage of the node SEN in accordance with the magnitude of the potential of the selected word line WL at the start of sensing. Since the other operations are similar to those of the semiconductor memory device 10 of the first embodiment, a description of such operations will be omitted.

<1-11> Modification 8 of First Embodiment

In the semiconductor memory device 10 according to modification 8 of the first embodiment, the row decoder modules 12A and 12B drive the respective blocks BLK from both sides. A description will be given of the points in which the semiconductor memory device 10 according to modification 8 of the first embodiment differs from modification 7 of the first embodiment.

FIG. 22 is a block diagram showing a configuration example of a memory cell array 11 and a row decoder module 12 included in the semiconductor memory device 10 according to modification 8 of the first embodiment. The configuration differs from the configuration described in connection with modification 7 of the first embodiment in terms of the manner in which areas are defined.

Specifically, as shown in FIG. 22, in each block BLK, areas are defined as "Near", "Mid1", "Mid2", "Far", in a direction away from the region close to the row decoders RDA and RDB. That is, the areas AR1 and AR8 correspond to the Near portions, the areas AR2 and AR7 correspond to the Mid1 portions, the areas AR3 and AR6 correspond to the Mid2 portions, and the areas AR4 and AR5 correspond to the Far portions.

The configuration of the voltage generation circuit 19 is similar to that described with reference to FIG. 17.

According to modification 8 of the first embodiment, the driver DR1A supplies the generated first power supply voltage VDD1 to the sense amplifier units SAU included in the segment SEG1A, and the driver DR2A supplies the generated second power supply voltage VDD2 to the sense amplifier units SAU included in the segment SEG2A.

The driver DR1B supplies generated the third power supply voltage VDD3 to the sense amplifier units SAU included in the segment SEG1B, and the driver DR2B supplies the generated fourth power supply voltage VDD4 to the sense amplifier units SAU included in the segment SEG2B.

The driver DR1C supplies the generated fourth power supply voltage VDD4 to the sense amplifier units SAU included in the segment SEG1C, and the driver DR2C supplies generated a sixth power supply voltage VDD3 to the sense amplifier units SAU included in the segment SEG2C.

The driver DR1D supplies the generated second power supply voltage VDD2 to the sense amplifier units SAU included in the segment SEG1D, and the driver DR2D supplies the generated first power supply voltage VDD1 to the sense amplifier units SAU included in the segment SEG2D.

In the read operation performed by the semiconductor memory device 10 according to modification 8 of the first embodiment, as well as in the read operation according to the above-described first embodiment, a first kick operation is performed on a selected word line WL, and sensing can be performed before the voltage of the word line WL stabilizes. Where sensing is performed before the voltage of the selected word line WL stabilizes, the charge voltage of the node SEN is controlled in accordance with the potential of the word line WL.

Specifically, at the start of sensing, the potential of the selected word line WL may decrease in the order of "Near", "Mid1", "Mid2", and "Far". In this case, the drivers DR1A and DR2D related to the bit line BL corresponding to the "Near" side supply the first power supply voltage VDD1, which is the highest voltage among the first power supply voltage VDD1 to the fourth power supply voltage VDD4. The drivers DR2A and DR1D related to the bit line BL corresponding to the "Mid1" side supply the second power supply voltage VDD2, which is next lower than the first power supply voltage VDD1 (VDD2<VDD1) among the first power supply voltage VDD1 to the fourth power supply voltage VDD4. The drivers DR1B and DR2C related to the bit line BL corresponding to the "Mid2" side supply the third power supply voltage VDD3, which is next lower than the second power supply voltage VDD2 (VDD3<VDD2) among the first power supply voltage VDD1 to the fourth power supply voltage VDD4. The drivers DR2B and DR1C related to the bit line BL corresponding to the "Far" side supply the fourth power supply voltage VDD4, which is the lowest voltage (VDD4<VDD3) among the first power supply voltage VDD1 to the fourth power supply voltage VDD4.

In the read operation performed by the semiconductor memory device 10 according to modification 8 of the first embodiment, as well as in the read operation according to modification 1 of the above-described first embodiment, a second kick operation is performed on a selected word line WL, and sensing can be performed before the voltage of the word line WL stabilizes. Where sensing is performed before the voltage of the selected word line WL stabilizes, the charge voltage of the node SEN is controlled in accordance with the potential of the word line WL.

Specifically, at the start of sensing, the potential of the selected word line WL may increase in the order of "Near", "Mid1", "Mid2", and "Far". In this case, the drivers DR1A and DR2D related to the bit line BL corresponding to the "Near" side supply the first power supply voltage VDD1, which is the lowest voltage among the first power supply voltage VDD1 to the fourth power supply voltage VDD4. The drivers DR2A and DR1D related to the bit line BL corresponding to the "Mid1" side supply the second power supply voltage VDD2, which is next higher than the first power supply voltage VDD1 (VDD1<VDD2) among the first power supply voltage VDD1 to the fourth power supply voltage VDD4. The drivers DR1B and DR2C related to the bit line BL corresponding to the "Mid2" side supply the third power supply voltage VDD3, which is next higher than the second power supply voltage VDD2 (VDD2<VDD3) among the first power supply voltage VDD1 to the fourth power supply voltage VDD4. The drivers DR2B and DR1C related to the bit line BL corresponding to the "Far" side supply the fourth power supply voltage VDD4, which is the highest voltage (VDD3<VDD4) among the first power supply voltage VDD1 to the fourth power supply voltage VDD4.

As described above, the voltage generation circuit 19 controls the magnitude of the charge voltage of the node SEN in accordance with the magnitude of the potential of the selected word line WL at the start of sensing. Since the other operations are similar to those of the semiconductor memory device 10 of the first embodiment, a description of such operations will be omitted.

<2> Second Embodiment

In the second embodiment, a semiconductor memory device 10 having a plurality of planes and performing a read operation to the planes asynchronously will be described. A description will be given of the points in which the semiconductor memory device 10 according to the second embodiment differs from that according to the first embodiment.

<2-1> Overall Configuration of Semiconductor Memory Device 10

FIG. 23 is a block diagram showing an example of an overall configuration of a semiconductor memory device 10 according to the second embodiment. As shown in FIG. 23, the semiconductor memory device 10 includes plane <0>, plane <1>, sense amplifier modules 130 and 131, an input/output circuit 14, registers 15, a logic controller 16, a sequencer 17, a ready/busy control circuit 18, and voltage generation circuits 190 and 191.

Plane <0> and plane <1> are similar to the above-mentioned memory cell array 11 and row decoder module 12, respectively.

The sense amplifier module 130 can supply data DAT read from plane <0> to the external controller via the input/output circuit 14. Also, the sense amplifier module 130 can transfer write data DAT received from an external controller via the input/output circuit 14 to plane <0>.

The sense amplifier module 131 can supply data DAT read from plane <1> to the external controller via the input/output circuit 14. Also, the sense amplifier module 131 can transfer write data DAT received from the external controller via the input/output circuit 14 to plane <1>.

The registers 15 include a status register 15A0, an address register 15B0 and a command register 15C0 which correspond to plane <0>. The registers 15 also include a status register 15A1, an address register 15B1 and a command register 15C1 which correspond to plane <1>.

Status register 15A0 holds, for example, status information STS on a first sequencer 170 corresponding to plane <0>, and transfers the status information STS to the input/output circuit 14 based on an instruction from the first sequencer 170.

The status register 15A1 holds, for example, status information STS on a second sequencer 171 corresponding to plane <1>, and transfers the status information STS to the input/output circuit 14 based on an instruction from the second sequencer 171.

The address register 15B0 holds address information ADD on plane <0> transferred from the input/output circuit 14.

The address register 15B1 holds address information ADD on plane <1> transferred from the input/output circuit 14.

The command register 15C0 holds command CMD on plane <0> transferred from the input/output circuit 14.

The command register 15C1 holds command CMD on plane <1> transferred from the input/output circuit 14.

The sequencer 17 includes a first sequencer 170, a second sequencer 171 and a control circuit 172.

The first sequencer 170 can control the operation of plane <0> based on the command CMD stored in the command register 15C0. The first sequencer 170 controls the sense amplifier module 130, the voltage generation circuit 190 and the like to execute various operations such as a write operation and a read operation.

The second sequencer 171 can control the operation of plane <1> based on the command CMD stored in the command register 15C1. The second sequencer 171 controls the sense amplifier module 131, the voltage generation circuit 191 and the like to execute various operations such as a write operation and a read operation.

The control circuit 172 controls the first sequencer 170 and the second sequencer 171.

The ready/busy control circuit 18 can generate ready/busy signals RBn based on the operation state of the sequencer 17. Signals RBn include a signal representing the operating state of the first sequencer 170 and a signal representing the operating state of the second sequencer 171.

Voltage generation circuit 190 can generate a desired voltage under the control of the first sequencer 170 and supply the generated voltage to plane <0>, the sense amplifier module 130, and the like. For example, voltage generation circuit 190 applies desired voltages to a signal line corresponding to a selected word line and a signal line corresponding to an unselected word line, respectively, based on a page address held in the address register 15B0.

Voltage generation circuit 191 can generate a desired voltage under the control of the second sequencer 171 and supply the generated voltage to plane <1>, the sense amplifier module 131, and the like. For example, voltage generation circuit 191 applies desired voltages to a signal line corresponding to a selected word line and a signal line corresponding to an unselected word line, respectively, based on a page address held in the address register 15B1.

In the first embodiment, the voltage generation circuit 19 changes the power supply voltage for charging the node SEN, for the respective areas of a block. However, voltage generation circuits 190 and 191 do not change the power supply voltage for charging the node SEN, without reference to the areas of the blocks BLK included in plane <0> and plane <1>.

<2-2> Operation

In the semiconductor memory device 10 according to the second embodiment, each plane can perform a read operation independently. However, if a predetermined operation (for example, output of data) is performed in a plane when a read operation is being performed in another plane, voltage fluctuations in signal line CG (e.g., signal line CG shown in FIG. 3) may cause noise, and the read operation performed in the other plane may be affected. According to the second embodiment, therefore, the control circuit 172 monitors the status from the first sequencer 170 or the second sequencer 171, thereby reducing noise which may affect the plane that is performing the read operation. Line CG is a wiring connected to the word line WL via a row decoder and is, for example, an uppermost wiring layer.

Hereinafter, a method for reducing noise to the plane that is performing a read operation will be described.

FIG. 24 shows an example of waveforms at the time of the read operation performed by the semiconductor memory device 10 of the second embodiment. FIG. 24 shows an example of the waveform of plane <1> that performs the read operation and the waveform of plane <0> that affects the read operation of plane <1>. More specifically, with respect to plane <1> that performs the read operation, FIG. 24 shows an example of waveforms of a ready/busy signal, clock CLK indicating the read period, the control signals BLC, XXL, LPC and BLQ, the bit line BL, current ISA flowing through transistor Tblc, and the node SEN. FIG. 24 also shows an example of waveforms of what may affect the read operation of plane <1>, including a ready/busy signal of plane <0>, CG line, and clock CLK.

Referring to FIG. 24, when a read operation is performed by plane <1>, the control circuit 172 monitors the operation in plane <0>. If the control circuit 172 determines that the operation in plane <0> affects plane <1>, the control circuit 172 controls the read operation performed by plane <1>.

As shown in FIG. 24, in plane <1> before the start of a read operation, namely, before time T20, the ready/busy signal indicates a ready state. In plane <1>, for example, the voltage of the control signal BLC is set to voltage VSS, the voltages of control signals XXL, LPC and BLQ are set to the "L" level, and the voltage of the bit line BL is set to voltage VSS.

When the read operation for plane <1> is started at time T20, the second sequencer 171 outputs a ready/busy signal indicating that plane <1> is busy via the ready/busy control circuit 18.

At time T21, the second sequencer 171 sets the voltage of the control signal BLC to the voltage VBLC. Accordingly, current ISA is supplied from the sense amplifier module 13 to the bit line BL, and the voltage of the bit line BL rises to voltage VBL. In FIG. 24, only the current ISA related to "ON CELL" is shown for simplicity.

At time T22, the second sequencer 171 sets control signals LPC and BLQ to the "H" level. When control signals LPC and BLQ rise to the "H" level, transistors 33 and Tblq are turned on, and the node SEN is charged to voltage VDD, for example.

Where, at time T23, the second sequencer 171 enters a period in which the influence by another plane is not desired (e.g., a charge waiting time of the bit line BL), the second sequencer 171 supplies an "H" level clock CLKV indicative of this fact to the control circuit 172. By receiving the "H" level clock CLKV from the second sequencer 171, the control circuit 172 can recognize that plane <1> has entered a period in which the influence by another plane is not desired.

Where, at time T24, plane <0> enters a period in which it may influence the operation of another plane <1>, the first sequencer 170 supplies an "H" level clock CLKA to the control circuit 172. By receiving the "H" level clock CLKA from the first sequencer 170, the control circuit 172 can recognize that plane <0> has entered a period in which it influences the operation of another plane <1>.

Figure 25:
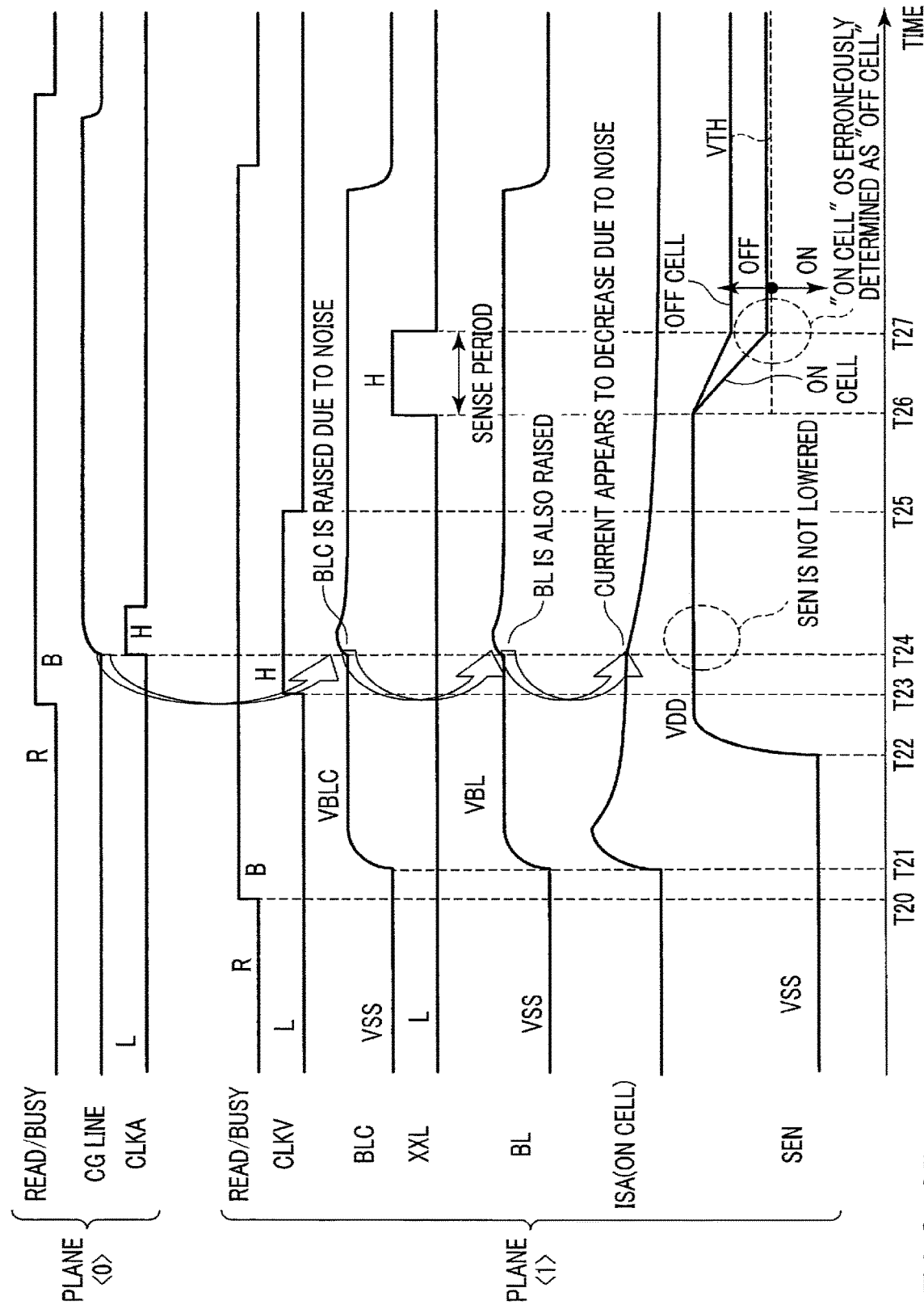
FIG. 25 is a diagram showing an example of waveforms in a read operation performed by a semiconductor memory device according to a comparative example of the second embodiment.

With reference to FIG. 25, a description will be given of the case where plane <0> enters a period in which it can influence the operation of plane <1>, during the period in which plane <1> should not be influenced by another plane.

If the voltage of the CG line of plane <0> rises, the control signal BLC of plane <1> may rise due to coupling. As a result, the potential of the bit line BL may rise and current ISA may decrease. If sensing is performed in this state, the voltage of the node SEN related to ON CELL may not become lower than a threshold voltage VTH (see SEN at time T27).

Therefore, as shown in FIG. 24, when the control circuit 172 of the present embodiment determines that clock CLKA of the first sequencer 170 is the "H" level and clock CLKV of the second sequencer 171 is the "H" level, the control circuit 172 controls the voltage generation circuit 191 such that the first sequencer 170 lowers the charge voltage of the node SEN to voltage VDDx, which is lower than voltage VDD.

As a result, in the sense period from time T26 to time T27, the potential of the node SEN related to ON CELL can be set to an appropriate potential. That is, the potential of the node SEN related to the ON CELL falls below the threshold voltage VTH.

Assuming that the voltage of the node SEN related to ON CELL becomes higher when noise is received than when no noise is received, the present embodiment intentionally lowers the potential of the node SEN. Therefore, even if noise is received from another plane, the voltage of the node SEN can be properly adjusted.

In the above description, reference was made to the case where plane <1> performs a read operation, and the charge voltage of the node SEN of plane <1> is changed based on the operation of plane <0>, but this is not restrictive. For example, plane <0> may perform a read operation, and the charge voltage of the node SEN of plane <0> may be changed based on the operation of plane <1>. In this case, the operations of first sequencer 170 and the second sequencer 171 are switched from each other.

Although reference was made to the case where the semiconductor memory device includes two planes, this is not restrictive. For example, the semiconductor memory device may be provided with three or more planes. In this case, a status register, an address register, a command register, a sequencer, a voltage generation circuit and a sense module are provided for each of the planes. Even to such a case, the above-described embodiment is applicable.

<2-3> Advantages

According to the embodiment described above, in one semiconductor memory device (chip) having a plurality of planes and capable of performing a read operation asynchronously, each plane senses noise in another plane. The sequencer, which controls the read operation, senses the noise and controls the charge voltage of the node SEN.

Even if a plane receives noise from another plane during the read operation, data can be determined appropriately.

According to the above-described embodiment, the potential of the node SEN is intentionally lowered on the assumption that noise is received. However, the voltage which the node SEN related to ON CELL has when noise is received may be lower than the voltage which the node SEN related to ON CELL has when no noise is received. In such a case, the potential of the node SEN may be intentionally raised.

<3> Third Embodiment

In the semiconductor memory device 10 according to the first embodiment, the charge voltage of the node SEN of the segment SEG1 corresponding to the memory cells on the Near side is set to be higher than the charge voltage of the node SEN of segment SEG2 corresponding to the memory cells on the Far side. In contrast, in the semiconductor memory device 10 according to the third embodiment, the sense period in the segment SEG1 corresponding to the memory cells on the Near side is set to be shorter than the sense period in the segment SEG2 corresponding to the memory cells on the Far side. A description will be given of the points in which the semiconductor memory device 10 according to the third embodiment differs from that according to the first embodiment.

<3-1> Configurations of Sense Amplifier Module 13 and Sequencer 17

FIG. 26 is a block diagram showing a detailed configuration example of the sense amplifier module 13 and sequencer 17 included in a semiconductor memory device according to the third embodiment. As shown in FIG. 26, the sense amplifier module 13 includes a plurality of sense amplifier units SAU.

In the third embodiment, the configurations of the sense amplifier module 13 and the sequencer 17 are different from those of the first embodiment. Specifically, in the semiconductor memory device 10 of the third embodiment, the sequencer 17 is configured such that it can individually supply control signals LPC, BLQ, XXL and STB to the sense amplifier segment SEG1 (i.e., a set of sense amplifier units SAU that are connected to the bit line BL corresponding to the NAND string NS provided in the area AR1) and sense amplifier segment SEG2 (i.e., a set of sense amplifier units SAU that are connected to the bit line BL corresponding to the NAND string NS provided in the area AR2) of the sense amplifier module 13, as shown in FIG. 26. In particular, the sequencer 17 can individually supply the control signal XXL, which defines the sense period, to the segments SEG1 and SEG2.

In the first embodiment, the first power supply voltage VDD1 generated by driver DR1 is supplied to the node of the power supply voltage VDD for the sense amplifier units SAU included in the segment SEG1, and the second power supply voltage VDD2 generated by driver DR2 is supplied to the node of the power supply voltage VDD for the sense amplifier units SAU included in the segment SEG2. In the third embodiment, in contrast, the node SEN is charged by the same power supply voltage VDD in both the segment SEG1 and the segment SEG2.

<3-2> Operation

Similarly to the semiconductor memory device 10 of the first embodiment, the semiconductor memory device 10 of the third embodiment also performs a first kick operation in the read operation. The first kick operation is a voltage application method in which the drive voltage of a driver is temporarily set to a value higher than a target voltage value and is decreased to the target voltage value after the elapse of a predetermined period of time. FIG. 27 shows an example of waveforms at the time of the read operation performed by the semiconductor memory device 10 of the third embodiment. In FIG. 27, the waveforms at the Near side portion of the word line WL are indicated by solid lines and the waveforms at the Far side portion of the word line WL are indicated by broken lines. In FIG. 27, the control signal XXL supplied to the sense amplifier units SAU corresponding to the Near side portion of the word line WL is indicated by solid lines, and the control signal XXL supplied to the sense amplifier units SAU corresponding to the Far side portion of the word line WL is indicated by broken lines.

[Before Time T30]

As shown in FIG. 27, in the initial state before time T30, for example, the voltage of the word line WL and the control signal BLC is set to the voltage VSS, the voltage of control signals LPC, BLQ, XXL and STB is set to the "L" level, and the voltage of the bit line BL is set to voltage VSS.

[Time T30 to Time T31]

When a read operation is started at time T30, the row decoder module 12 performs a first kick operation on a selected word line. As a result, for example, the first kick voltage VCGRVK higher than a desired voltage appears on the Near side of the selected word line WL, while an RC delay of the wiring occurs on the Far side of the selected word line WL, so that the voltage rises to the voltage VCGRVK that does not exceed the voltage VCGRV.

The row decoder module 12 applies, for example, a read pass voltage VREAD to an unselected word line WL.

The sequencer 17 sets the voltage of the control signal BLC to the voltage VBLC. Accordingly, a current is supplied from the sense amplifier module 13 to the bit line BL, and the voltage of the bit line BL rises to voltage VBL.

Further, the sequencer 17 sets control signals LPC and BLQ to the "H" level. When control signals LPC and BLQ are at the "H" level, transistors 33 and Tblq are turned on, and the node SEN is charged thereby. When the charging of the node SEN is completed, the sequencer 17 sets control signals LPC and BLQ to the "L" level.

[Time T31 to Time T33]

At time T31, the sequencer 17 sets the control signal XXL to the "H" level. When the control signal XXL is at the "H" level, the potential of node SEN varies based on the state of a selected memory cell. Note that time T31 is a time before the voltage of the selected word line WL stabilizes to VCGRV.

The sequencer 17 sets the control signal XXL(SEG1) supplied to the segment SEG1 to the "L" level at time T32 and sets the control signal XXL(SEG2) supplied to segment SEG2 to the "L" level at subsequent time T33. In addition, the sequencer 17 sets control signal STB supplied to the segment SEG1 and segment SEG2 to the "H" level at time T33, determines the threshold voltage of the selected memory cell based on the state of the node SEN, and holds a determination result in the latch circuit of the sense amplifier unit SAU.

After the determination result is held in the latch circuit of the sense amplifier unit SAU, the row decoder module 12 and the sequencer 17 return the word line WL and the control signal BLC to the initial state, thereby completing the read operation for the page.

<3-3> Advantages

As described in connection with the comparative example shown in FIG. 11, if sensing is started at time T1, which is before the voltage of the selected word line WL stabilizes to VCGRV, the voltage at the Near side portion of the word line WL becomes higher than the voltage VCGRV, so that the cell current Icell flowing to the memory cells increases, while the voltage at the Far side portion of the word line WL becomes lower than the voltage VCGRV, so that the cell current Icell flowing to the memory cells decreases. Therefore, a determination of whether a memory cell is turned on or off may be made erroneously.

According to the third embodiment, therefore, the sequencer 17 sets the control signal XXL to the "H" level at time T31, which is a time before the voltage of the selected word line WL stabilizes to VCGRV. After the sense period is started, the sequencer 17 sets the control signal XXL (SEG1) supplied to the segment SEG1 to the "L" level at time T32, and sets the control signal XXL(SEG2) supplied to segment SEG2 to the "L" level at time T33. Accordingly, the sense period in the segment SEG1 where the cell current Icell increases is ended earlier than the sense period in the segment SEG2 where the cell current Icell decreases.

As a result, irrespective of the segment SEG1 and the segment SEG2, the potential of the node SEN in the corresponding sense amplifier units SAU is lower than the determination voltage VTH when a memory cell is turned on (ON CELL), and the potential of the node SEN in the corresponding sense amplifier units SAU is higher than the determination voltage VTH when the memory cell is turned off (OFF CELL).

Therefore, like the semiconductor memory device 10 of the first embodiment, the semiconductor memory device 10 of the third embodiment can speed up the read operation while avoiding erroneous determination.

<3-4> Modification 1 of Third Embodiment

<3-4-1> Operation

A description will be given as to how a read operation is performed according to modification 1 of the third embodiment.

The semiconductor memory device 10 according to modification 1 of the third embodiment executes a second kick operation in a read operation.

Figure 28:
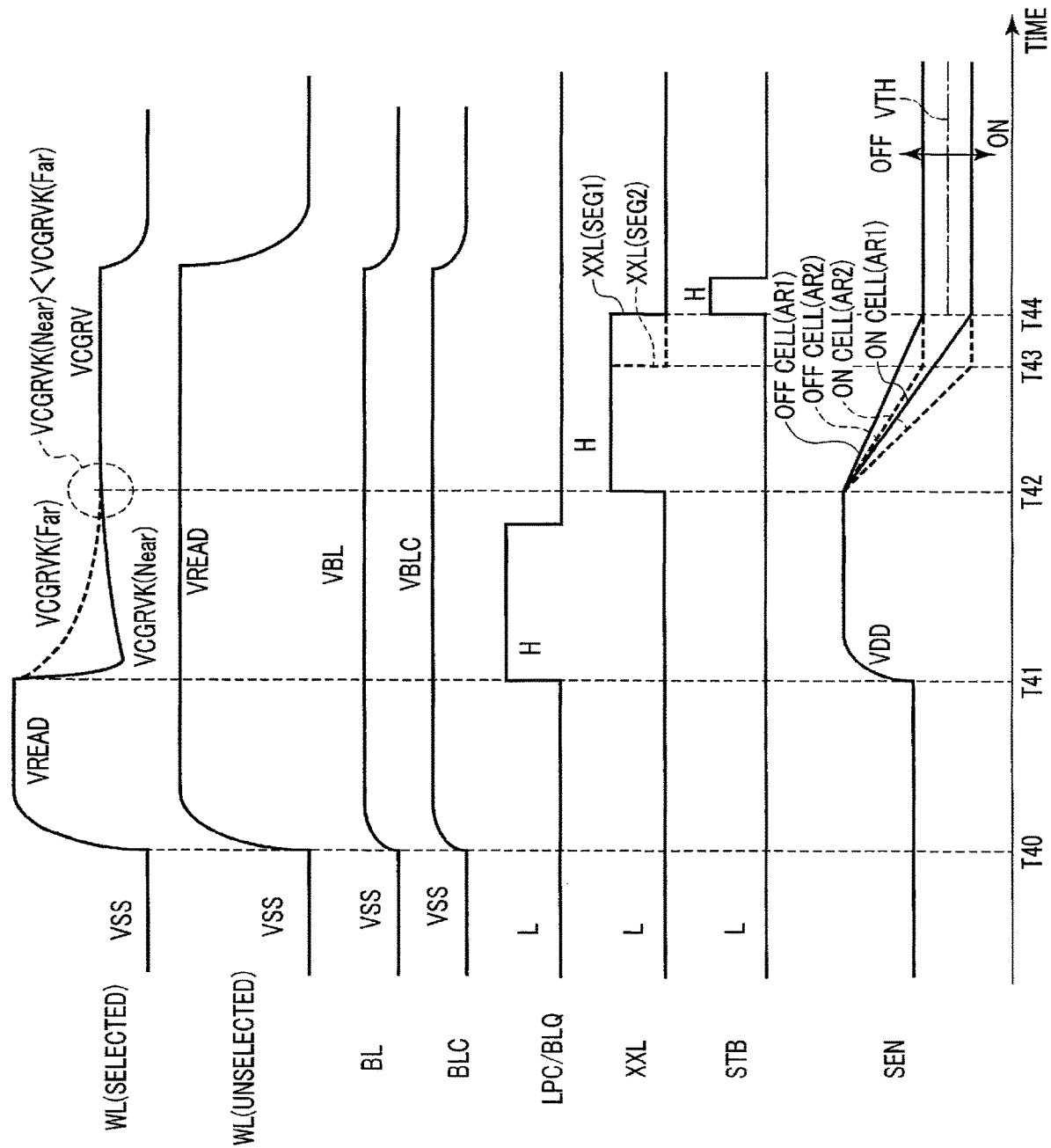
FIG. 28 is a diagram showing an example of waveforms in a read operation performed by the semiconductor memory device according to modification 1 of the third embodiment.

FIG. 28 shows an example of waveforms at the time of the read operation performed by the semiconductor memory device 10 of the third embodiment. FIG. 28 shows an example of how waveforms of the word lines WL, the waveform of the bit line BL and the waveforms of various control signals are on the Near side and the Far side.

[Before Time T40]

As shown in FIG. 28, in the initial state before time T40, for example, the voltage of the word line WL and the control signal BLC is set to the voltage VSS, the voltage of control signals LPC, BLQ, XXL and STB is set to the "L" level, and the voltage of the bit line BL is set to voltage VSS.

[Time T40 to Time T41]

When a read operation is started at time T40, the row decoder module 12 applies, for example, a read pass voltage VREAD to the word line WL.

The sequencer 17 sets the voltage of the control signal BLC to the voltage VBLC. Accordingly, a current is supplied from the sense amplifier module 13 to the bit line BL, and the voltage of the bit line BL rises to voltage VBL.

[Time T41 to Time T42]

When a read operation is started at time T41, the row decoder module 12 performs a second kick operation on a selected word line.

Further, the sequencer 17 sets control signals LPC and BLQ to the "H" level. When control signals LPC and BLQ are at the "H" level, transistors 33 and Tblq are turned on, and the node SEN is charged thereby. When the charging of the node SEN is completed, the sequencer 17 sets control signals LPC and BLQ to the "L" level.

In the sense amplifier units SAU included in the segment SEG1, the node SEN is charged to the second power supply voltage VDD2. In the sense amplifier units SAU included in the segment SEG2, the node SEN is charged to the first power supply voltage VDD.

[Time T42 to Time T44]

At time T42, the sequencer 17 sets the control signal XXL to the "H" level. When the control signal XXL is at the "H" level, the potential of the node SEN varies based on the state of a selected memory cell. Note that time T42 is a time before the voltage of the selected word line WL stabilizes to VCGRV.

The sequencer 17 sets the control signal XXL(SEG2) supplied to segment SEG2 to the "L" level at time T43 and sets the control signal XXL(SEG1) supplied to the segment SEG1 to the "L" level at subsequent time T44. In addition, the sequencer 17 sets control signal STB supplied to the segment SEG1 and the segment SEG2 to the "H" level at time T44, determines the threshold voltage of the selected memory cell based on the state of the node SEN, and holds a determination result in the latch circuit of the sense amplifier unit SAU.

After the determination result is held in the latch circuit of the sense amplifier unit SAU, the row decoder module 12 and the sequencer 17 return the word line WL and the control signal BLC to the initial state, thereby completing the read operation for the page.

<3-4-2> Advantage

Like the semiconductor memory device 10 of the third embodiment, the semiconductor memory device 10 of modification 1 of the third embodiment described above can speed up the read operation while avoiding erroneous determination.

<3-5> Modification 2 of the Third Embodiment

In the semiconductor memory device 10 according to modification 2 of the third embodiment, the sense amplifier module 13 is divided into four areas, and the control signal XXL is controlled for each of these areas. A description will be given of the points in which the semiconductor memory device 10 according to modification 2 of the third embodiment differs from that according to the third embodiment.

<3-5-1> Configuration

The method for dividing the memory cell array 11 is similar to that described with reference to FIG. 14.

A detailed configuration example of the sense amplifier modules 13 (13A and 13B) and the sequencer 17 included in the semiconductor memory device 10 according to modification 2 of the third embodiment will be described with reference to FIG. 29.

In modification 2 of the third embodiment, the configurations of the sense amplifier modules 13 and the sequencer 17 are different from those of modification 2 of the first embodiment. More specifically, in the semiconductor memory device 10 according to modification 2 of the third embodiment, as shown in FIG. 29, the sequencer 17 is configured to individually supply control signals LPC, BLQ, XXL and STB to sense amplifier the segment SEG1A (a set of sense amplifier units SAU connected to the bit line BL corresponding to the NAND string NS provided in the area AR1), the sense amplifier segment SEG2A (a set of sense amplifier units SAU connected to the bit line BL corresponding to the NAND string NS provided in the area AR2), a sense amplifier segment SEG1B (a set of sense amplifier units SAU connected to the bit line BL corresponding to the NAND string NS provided in the area AR3),and a sense amplifier segment SEG2B (a set of sense amplifier units SAU connected to the bit line BL corresponding to the NAND string NS provided in the area AR4) of the sense amplifier modules 13. In particular, the sequencer 17 can individually supply the control signal XXL, which defines the sense period, to the segments SEG1A, SEG2A, SEG1B and SEG2B.

In modification 2 of the first embodiment, the first power supply voltage VDD1 generated by the driver DR1A is supplied to the node of power supply voltage VDD in the sense amplifier units SAU included in the segment SEG1A, the second power supply voltage VDD2 generated by the driver DR2A is supplied to the node of power supply voltage VDD in the sense amplifier units SAU included in the segment SEG2A, the third power supply voltage VDD3 generated by a driver DR3 is supplied to the node of power supply voltage VDD in the sense amplifier units SAU included in the segment SEG1B, and the fourth power supply voltage VDD4 generated by the driver DR2B is supplied to the node of power supply voltage VDD in the sense amplifier units SAU included in the segment SEG2B. In modification 2 of the third embodiment, however, the nodes SEN are charged with the same power supply voltage VDD irrespective of the segment SEG1A, the segment SEG2A, the segment SEG1B and the segment SEG2B.

<3-5-2> Operation

The read operation performed by the semiconductor memory device 10 according to modification 2 of the third embodiment is basically the same as the read operation described with reference to FIGS. 27 and 28.

In the read operation performed by the semiconductor memory device 10 according to modification 2 of the third embodiment, as well as in the read operation according to the above-described third embodiment, a first kick operation is performed on a selected word line WL, and sensing can be performed before the voltage of the word line WL stabilizes (at the rise timing of signal XXL). Where sensing is performed before the voltage of the selected word line WL stabilizes, the charge voltage of the node SEN is controlled in accordance with the potential of the word line WL.

Specifically, at the start of sensing, the potential of the selected word line WL may decrease in the order of "Near", "Mid1", "Mid2", and "Far". In this case, the sequencer 17 sets control signals XXL to the "L" level from time T31 to time T33 shown in FIG. 27, in the order of the control signal XXL(SEG1A) supplied to the segment SEG1A, the control signal XXL(SEG2A) supplied to the segment SEG2A, the control signal XXL(SEG1B) supplied to the segment SEG1B, and the control signal XXL(SEG2B) supplied to the segment SEG2B.

In the read operation performed by the semiconductor memory device 10 according to modification 2 of the third embodiment, as well as in the read operation according to above-mentioned modification 1 of the third embodiment, a second kick operation is performed on a selected word line WL, and sensing can be performed before the voltage of the word line WL stabilizes. Where sensing is performed before the voltage of the selected word line WL stabilizes, the charge voltage of the node SEN is controlled in accordance with the potential of the word line WL.

Specifically, at the start of sensing, the potential of the selected word line WL may increase in the order of "Near", "Mid1", "Mid2", and "Far". In this case, the sequencer 17 sets control signals XXL to the "L" level from time T42 to time T44 shown in FIG. 28, in the order of the control signal XXL(SEG2B) supplied to the segment SEG2B, the control signal XXL(SEG1B) supplied to the segment SEG1B, the control signal XXL(SEG2A) supplied to the segment SEG2A, and the control signal XXL(SEG1A) supplied to the segment SEG1A.

It should be noted that the potential of the selected word line WL at the start of sensing does not necessarily increase or decrease in the above-mentioned arrangement order of the areas. Even in such a case, it is sufficient that the potential of the selected word line WL at the start of sensing is made to correspond to the timing at which the corresponding control signal XXL is set to the "L" level.

<3-5-3> Advantages of Modification 2 of First Embodiment

As described above, the semiconductor memory device 10 of modification 2 of the third embodiment uses smaller divided areas than those of the semiconductor memory device 10 of the third embodiment, so that the read operation can be performed at high speed and yet the charge voltage of the node SEN can be finely controlled.

<3-6> Modification 3 of the Third Embodiment

In the semiconductor memory device 10 according to modification 3 of the third embodiment, the sense amplifier module 13 is divided into eight areas, and the charge voltage of the nodes SEN is controlled for each of these areas. A description will be given of the points in which the semiconductor memory device 10 according to modification 3 of the third embodiment differs from that according to the third embodiment.

<3-6-1> Configuration

The method for dividing the memory cell array 11 is similar to that described with reference to FIG. 16.

Figure 30:
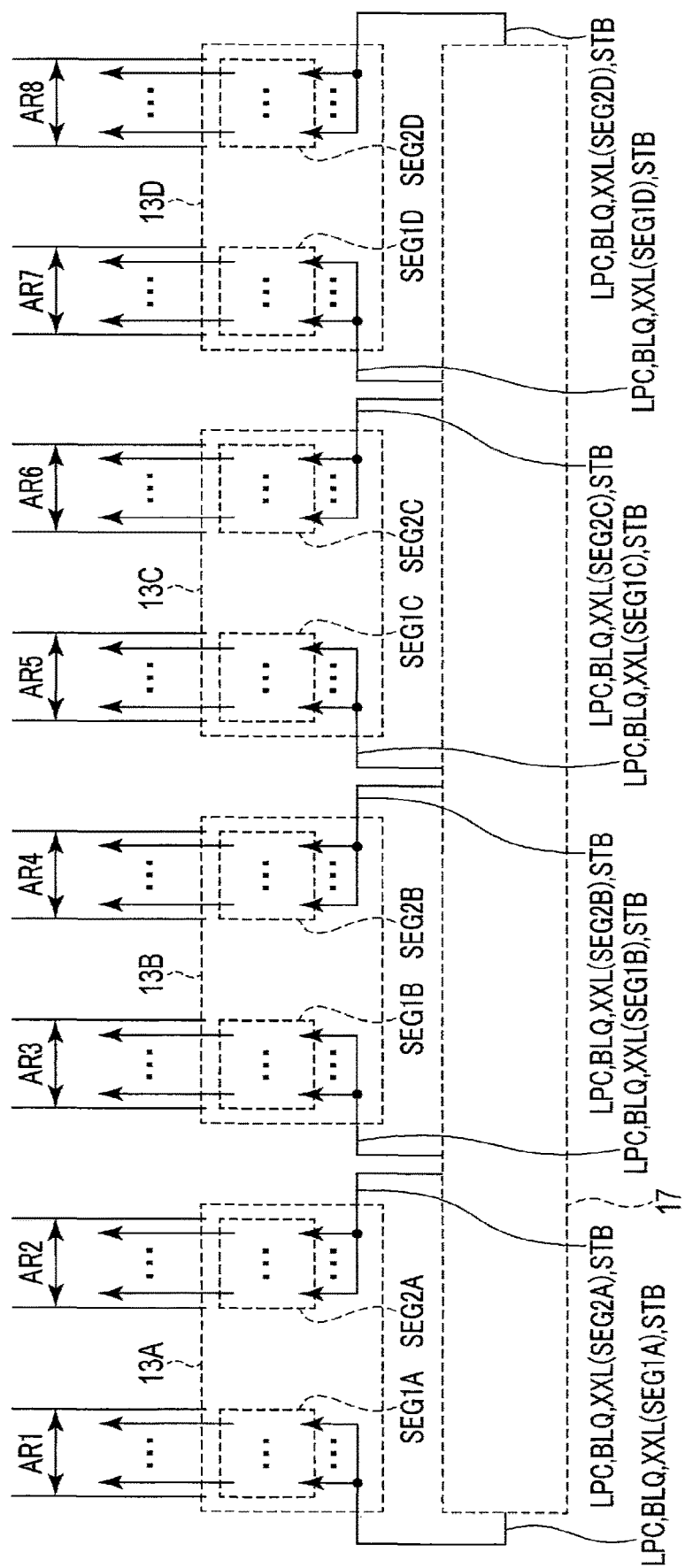
FIG. 30 is a block diagram showing a configuration example of a sense amplifier module and a sequencer included in a semiconductor memory device according to modification 3 of the third embodiment.

A detailed configuration example of the sense amplifier modules 13 (13A, 13B, 13C and 13D) and the sequencer 17 included in the semiconductor memory device 10 according to modification 3 of the third embodiment will be described with reference to FIG. 30.

In modification 3 of the third embodiment, the configurations of the sense amplifier modules 13 and the sequencer 17 are different from those of modification 3 of the first embodiment. Specifically, in the semiconductor memory device 10 of modification 3 of the third embodiment, as shown in FIG. 30, the sequencer 17 is configured to individually supply control signals LPC, BLQ, XXL and STB to the sense amplifier segment SEG1A (a set of sense amplifier units SAU connected to the bit line BL corresponding to the NAND string NS provided in the area AR1), the sense amplifier segment SEG2A (a set of sense amplifier units SAU connected to the bit line BL corresponding to the NAND string NS provided in the area AR2), the sense amplifier segment SEG1B (a set of sense amplifier units SAU connected to the bit line BL corresponding to the NAND string NS provided in the area AR3), the sense amplifier segment SEG2B (a set of sense amplifier units SAU connected to the bit line BL corresponding to the NAND string NS provided in the area AR4), the sense amplifier segment SEG1C (a set of sense amplifier units SAU connected to the bit line BL corresponding to the NAND string NS provided in the area AR5), the sense amplifier segment SEG2C (a set of sense amplifier units SAU connected to the bit line BL corresponding to the NAND string NS provided in the area AR6), the sense amplifier segment SEG1D (a set of sense amplifier units SAU connected to the bit line BL corresponding to the NAND string NS provided in the area AR7), and the sense amplifier segment SEG2D (a set of sense amplifier units SAU connected to the bit line BL corresponding to the NAND string NS provided in the area AR8) of the sense amplifier modules 13. In particular, the sequencer 17 can individually supply the control signal XXL, which defines the sense period, to the segment SEG1A, the segment SEG2A, the segment SEG1B, the segment SEG2B, the segment SEG1C, the segment SEG2C, the segment SEG1D and the segment SEG2D.

<3-6-2> Operation

The read operation performed by the semiconductor memory device 10 according to modification 3 of the third embodiment is basically the same as the read operation described with reference to FIGS. 27 and 28.

In the read operation performed by the semiconductor memory device 10 according to modification 3 of the third embodiment, as well as in the read operation according to the above-described third embodiment, a first kick operation is performed on a selected word line WL, and sensing can be performed before the voltage of the word line WL stabilizes (at the rise timing of signal XXL). Where sensing is performed before the voltage of the selected word line WL stabilizes, the charge voltage of the node SEN is controlled in accordance with the potential of the word line WL.

Specifically, at the start of sensing, the potential of the selected word line WL may decrease in the order of "Near", "Mid1", "Mid2", "Mid3", "Mid4", "Mid5", "Mid6", and "Far". In this case, the sequencer 17 sets control signals XXL to the "L" level from time T31 to time T33 shown in FIG. 27, in the order of the control signal XXL(SEG1A) supplied to segment SEG1A, the control signal XXL (SEG2A) supplied to the segment SEG2A, the control signal XXL(SEG1B) supplied to the segment SEG1B, the control signal XXL(SEG2B) supplied to the segment SEG2B, the control signal XXL(SEG1C) supplied to the segment SEG1C, the control signal XXL(SEG2C) supplied to the segment SEG2C, the control signal XXL(SEG1D) supplied to the segment SEG1D, and the control signal XXL (SEG2D) supplied to the segment SEG2D.

In the read operation performed by the semiconductor memory device 10 according to modification 3 of the third embodiment, as well as in the read operation according to above-mentioned modification 1 of the third embodiment, a second kick operation is performed on a selected word line WL, and sensing can be performed before the voltage of the word line WL stabilizes. Where sensing is performed before the voltage of the selected word line WL stabilizes, the charge voltage of the node SEN is controlled in accordance with the potential of the word line WL.

Specifically, at the start of sensing, the potential of the selected word line WL may increase in the order of "Near", "Mid1", "Mid2", "Mid3", "Mid4", "Mid5", "Mid6", and "Far". In this case, the sequencer 17 sets control signals XXL to the "L" level from time T42 to time T44 shown in FIG. 28, in the order of the control signal XXL(SEG2D) supplied to the segment SEG2D, the control signal XXL (SEG1D) supplied to the segment SEG1D, the control signal XXL(SEG2C) supplied to the segment SEG2C, the control signal XXL(SEG1C) supplied to the segment SEG1C, the control signal XXL(SEG2B) supplied to the segment SEG2B, the control signal XXL(SEG1B) supplied to the segment SEG1B, the control signal XXL(SEG2A) supplied to the segment SEG2A, and the control signal XXL (SEG1A) supplied to the segment SEG1A.

It should be noted that the potential of the selected word line WL at the start of sensing does not necessarily increase or decrease in the above-mentioned arrangement order of the areas. Even in such a case, it is sufficient that the potential of the selected word line WL at the start of sensing is made to correspond to the timing at which the corresponding control signal XXL is set to the "L" level.

<3-6-3> Advantages of Modification 3 of First Embodiment

As described above, the semiconductor memory device 10 of modification 3 of the third embodiment uses smaller divided areas than those of the semiconductor memory device 10 of the third embodiment, so that the read operation can be performed at high speed and yet the charge voltage of the node SEN can be finely controlled.

<4> Modifications

In connection with the above embodiment, reference was made to the case where a read operation is performed on all bit lines BL, but this is not restrictive. For example, the semiconductor memory device 10 may be configured such that the read operation is executed, with the bit lines being divided into odd-numbered bit lines and even-numbered bit lines. In this case, the sense amplifier modules 13 are provided such that one of them corresponds to the odd-numbered bit lined and the other corresponds to the even-numbered bit lines. For example, different control signals BLC are respectively supplied to the sense amplifier modules 13 corresponding to the odd-numbered bit lines and even-numbered bit lines. The above embodiments are also applicable to the semiconductor memory device 10 having this configuration.

In connection with the above embodiments, reference was made to an example in which the row decoder module 12 is provided under the memory cell array 11, but this is not restrictive. For example, a memory cell array 11 may be formed on a semiconductor substrate, and the row decoder modules 12A and 12B may be arranged in such a manner as to sandwich the memory cell array 11. Even in this case, the operations described in connection with the above embodiments can be executed.

In connection with the above embodiments, reference was made to the case where the semiconductor memory device 10 reads data in units of one page, but this is not restrictive. For example, the semiconductor memory device 10 may collectively read the data of a plurality of bits stored in the memory cells. Even in such a case, a kick operation may be applied when a read operation is performed, so that the operations described in connection with the above embodiments are applicable to the semiconductor memory device 10.

In connection with the above embodiments, reference was made to the case where the memory cells are formed of an MONOS film, but this is not restrictive. For example, even when a memory cell using a floating gate is employed, the same advantages can be obtained by executing the read operation and the write operation described in connection with the above embodiments.

In the above embodiments, reference was made to the case where a via contact VC to which the conductors 42 are electrically connected passes through these conductors 42, but this is not restrictive. For example, a via contact VC corresponding to the conductors 42 may be connected to the corresponding diffusion region 52 by passing it through conductor 40 from the conductors 42 of a different wiring layer. Further, in the above description, reference was made to the case where via contacts BC, VC, HU, and TRC are formed by one pillar, but this is not restrictive. For example, these via contacts may be formed by connecting two or more pillars. Where two or more pillars are connected, different conductors may be used therebetween.

In the embodiments described above, the memory cell array 11 may have another configuration. A different configuration of a memory cell array 11 is described, for example, in U.S. patent application Ser. No. 12/407,403 filed on Mar. 19, 2009 and entitled "THREE-DIMENSIONALLY STACKED NONVOLATILE SEMICONDUCTOR MEMORY". A similar configuration is also described in U.S. patent application Ser. No. 12/406,524 filed on Mar. 18, 2009 and entitled "THREE-DIMENSIONALLY STACKED NONVOLATILE SEMICONDUCTOR MEMORY", U.S. patent application Ser. No. 12/679,991 filed on Mar. 25, 2010 and entitled "NONVOLATILE SEMINCONDUCTOR MEMORY DEVICE AND MANUFACTURING METHOD THEREOF", and U.S. patent application Ser. No. 12/532,030 filed on Mar. 23, 2009 and entitled "SEMICONDUCTOR MEMORY AND MANUFACTURING METHOD THEREOF". The entire contents of these applications are incorporated herein by reference.

The memory cell array 11 need not have a three-dimensional arrangement configuration and may have another configuration. A configuration of the memory cell array 11 is described, for example, in U.S. patent application Ser. No. 12/397,711 filed on Mar. 3, 2009 and entitled "SEMICONDUCTOR MEMORY DEVICE HAVING PLURALITY OF TYPES OF MEMORIES INTEGRATED ON ONE CHIP". The configuration of the memory cell array 110 is also described in U.S. patent application Ser. No. 13/451,185 filed on Apr. 19, 2012 and entitled "SEMICONDUCTOR MEMORY DEVICE INCLUDING STACKD GATE HAVING CHARGE ACCUMULATION LAYER AND CONTROL GATE AND METHOD OF WRITING DATA TO SEMICONDUCTOR MEMORY DEVICE", U.S. patent application Ser. No. 12/405,626 filed on Mar. 17, 2009 and entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", and U.S. patent application Ser. No. 09/956,986 filed on Sep. 21, 2001 and entitled "NONVOLATILE SEMICONDUCTOR MEMORY DEVICE HAVING ELEMENT ISOLATING REGION OF TRENCH TYPE AND METHOD OF MANUFACTURING THE SAME". The entire contents of these applications are incorporated herein by reference.

In connection with the above embodiments, reference was made to the case where the block BLK is an erase unit of data, but this is not restrictive. Other erase operations are described in U.S. patent application Ser. No. 13/235,389 filed on Sep. 18, 2011 and entitled "NONVOLATILE SEMICONDUCTOR MEMORY DEVICE" and U.S. patent application Ser. No. 12/694,690 filed on Jan. 27, 2010 and entitled "NONVOLATILE SEMICONDUCTOR MEMORY DEVICE". The entire contents of these applications are incorporated herein by reference.

In the present specification, the term "connection" means that elements are electrically connected and another element may be interposed therebetween. In addition, in the present specification, "shut off" means that the related switch is in the OFF state, and does not exclude that a minute current such as a leak current of a transistor flows.

In each of the above embodiments, (1) In a read operation, the voltage applied to the word line selected by an "A" level read operation is, for example, between 0 and 0.55V. This is not restrictive, and any one of the ranges of 0.1 to 0.24V, 0.21 to 0.31V, 0.31 to 0.4V, 0.4 to 0.5V, and 0.5 to 0.55V may be used.

The voltage applied to the word line selected by a "B" level read operation is, for example, between 1.5 and 2.3V. This is not restrictive, and any one of the ranges of 1.65 to 1.8V, 1.8 to 1.95V, 1.95 to 2.1V, and 2.1 to 2.3V may be used.

The voltage applied to the word line selected by a "C" level read operation is, for example, between 3.0V and 4.0V. This is not restrictive, and any one of the ranges 3.0 to 3.2V, 3.2 to 3.4V, 3.4 to 3.5V, 3.5 to 3.6V, and 3.6 to 4.0V may be used.

The time (tRead) of a read operation may be, for example, between 25 and 38 µs, between 38 and 70 µs, and between 70 and 80 µs.

(2) A write operation includes a program operation and a verify operation, as described above. The voltage initially applied to the word line selected during the program operation is, for example, between 13.7 and 14.3V. This is not restrictive, and any one of the ranges of 13.7 to 14.0V and 14.0 to 14.6V may be used. The voltage applied to an unselected word line during a program operation may be, for example, between 6.0 and 7.3V. This is not restrictive, and the voltage range of 7.3 to 8.4V or the voltage range of not higher than 6.0V may be used.

In a write operation, the voltage initially applied to a selected word line when odd-numbered word lines are selected, and the voltage initially applied to a selected word line when even-numbered word lines are selected may be different from each other. In a write operation, the applied pass voltage may be changed depending on whether the unselected word line is an odd-numbered word line or an even-numbered word line.

The step-up width of the program voltage applied where the program operation is an ISPP (Incremental Step Pulse Program) is about 0.5V, for example.

The time (tRead) of a read operation may be, for example, between 1700 and 1800 μs, between 1800 and 1900 μs, and between 1900 and 2000 μs.

(3) In an erase operation, the voltage initially applied to a well which is formed in an upper portion of a semiconductor substrate and above which memory cells are arranged is in the voltage range between 12.0V and 13.6V. This is not restrictive, and the voltage may be in the ranges of, for example, 13.6 to 14.8V, 14.8 to 19.0V, 19.0 to 19.8V, and 19.8 to 21.0V.

The erase operation time (tErase) may be, for example, between 3000 to 4000 μs, 4000 to 5000 μs, and 4000 to 9000 μs.

(4) Memory cells have a structure wherein a charge storage layer is arranged on a semiconductor substrate (silicon substrate), with a tunnel insulating film having a film thickness of 4 to 10 nm interposed. The charge storage layer can have a laminated structure including an insulating film formed of SiN or SiON and having a thickness of 2 to 3 nm and a polysilicon layer having a film thickness of 3 to 8 nm. Further, a metal such as Ru may be added to the polysilicon layer. An insulating film is provided on the charge storage layer. This insulating film includes, for example, a silicon oxide film having a film thickness of 4 to 10 nm and sandwiched between a lower-layer High-k film having a film thickness of 3 to 10 nm and an upper-layer High-k film having a film thickness of 3 to 10 nm. An example of the High-k films is HfO or the like. The film thickness of the silicon oxide film can be made greater than the film thickness of the High-k films. On the insulating film, a control electrode having a film thickness of 30 to 70 nm is formed via a material having a film thickness of 3 to 10 nm. The material mentioned here is a metal oxide film such as TaO, or a metal nitride film such as TaN. The control electrode may be formed of W or the like. An air gap may be provided between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   first and second memory cells;
   a first word line connected to gates of the first and second memory cells;
   a first bit line connected to the first memory cell;
   a second bit line connected to the second memory cell;
   a first sense amplifier having a first sense node connected to the first bit line;
   a second sense amplifier having a second sense node connected to the second bit line; and
   a voltage generation circuit having a first driver connected to the first sense amplifier and a second driver connected to the second sense amplifier;
   wherein
   in a read operation,
   the first driver supplies a first voltage to the first sense node, the second driver supplies a second voltage lower than the first voltage to the second sense node.

2. The semiconductor memory device according to claim 1, further comprising a first row decoder connected to the first word line,
   wherein
   the first memory cell locates closer to the first row decoder than the second memory cell.

3. The semiconductor memory device according to claim 1, further comprising a first row decoder supplying a third voltage to the first word line,
   wherein
   a sense period of the first and the second sense amplifiers starts before the third voltage of the first word line stabilizes.

4. The semiconductor memory device according to claim 1, wherein the first sense node is connected to the first bit line via a first transistor in the first sense amplifier, and the first transistor receives high level control signal during a sense period.

5. The semiconductor memory device according to claim 1, further comprising:
   a memory cell array divided in an extending direction of the first word line, into a first and a second areas respectively including the first and second memory cells; and
   a first row decoder connected to the first word line,
   wherein
   the first area locates closer to the first row decoder than the second area.

6. The semiconductor memory device according to claim 1, further comprising:
   a memory cell array including the first and second memory cells; and
   a first row decoder provided under the memory cell array.

7. The semiconductor memory device according to claim 1, further comprising:
   a first conductor extending in a first direction and functioning as the first word line;
   first and second pillars provided to pass through the first conductor, the first and second pillars respectively functioning as first and second memory cells at intersections with the first conductor; and
   a third pillar provided on the first conductor and electrically connected to the first conductor,
   wherein an interval between the third pillar and the first pillar, as viewed in the first direction, is shorter than an interval between the third pillar and the second pillar, as viewed in the first direction.

8. A semiconductor memory device comprising:
   first and second memory cells;
   a first word line connected to gates of the first and second memory cells;
   a first bit line connected to the first memory cell;
   a second bit line connected to the second memory cell;
   a first sense amplifier having a first transistor, and a first sense node connected to the first bit line;
   a second sense amplifier having a second transistor, and a second sense node connected to the second bit line; and a voltage generation circuit connected to the first sense node via the first transistor, and connected to the second sense node via the second transistor;

wherein in a read operation, the first transistor transfers a first voltage supplied from the voltage generation circuit to the first sense node, the second transistor transfers a second voltage supplied from the voltage generation circuit to the second sense node, magnitude of control signal of the first transistor is higher than magnitude of control signal of the second transistor.

9. The semiconductor memory device according to claim 8, further comprising a first row decoder connected to the first word line, wherein the first memory cell locates closer to the first row decoder than the second memory cell.

10. The semiconductor memory device according to claim 8, further comprising a first row decoder supplying a third voltage to the first word line, wherein a sense period of the first and the second sense amplifiers starts before the third voltage of the first word line stabilizes.

11. The semiconductor memory device according to claim 8, wherein the first sense node is connected to the first bit line via a third transistor in the first sense amplifier, and the third transistor receives high level control signal during a sense period.

12. The semiconductor memory device according to claim 8, further comprising:

a memory cell array divided in an extending direction of the first word line, into a first and a second areas respectively including the first and second memory cells; and a first row decoder connected to the first word line, wherein the first area locates closer to the first row decoder than the second area.

13. The semiconductor memory device according to claim 8, further comprising:

a memory cell array including the first and second memory cells; and a first row decoder provided under the memory cell array.

14. The semiconductor memory device according to claim 8, further comprising:

a first conductor extending in a first direction and functioning as the first word line;

first and second pillars provided to pass through the first conductor, the first and second pillars respectively functioning as first and second memory cells at intersections with the first conductor; and a third pillar provided on the first conductor and electrically connected to the first conductor, wherein an interval between the third pillar and the first pillar, as viewed in the first direction, is shorter than an interval between the third pillar and the second pillar, as viewed in the first direction.

15. A semiconductor memory device comprising:

first and second memory cells;

a first word line connected to gates of the first and second memory cells;

a first bit line connected to the first memory cell;

a second bit line connected to the second memory cell;

a first sense amplifier connected to the first bit line; and a second sense amplifier connected to the second bit line, wherein in a read operation, a first sense period in the first amplifier is shorter than a second sense period in the second amplifier.

16. The semiconductor memory device according to claim 15, further comprising a first row decoder connected to the first word line, wherein the first memory cell locates closer to the first row decoder than the second memory cell.

17. The semiconductor memory device according to claim 15, further comprising a first row decoder supplying a first voltage to the first word line, wherein the first and the second sense periods start before the first voltage of the first word line stabilizes.

18. The semiconductor memory device according to claim 15, wherein the first sense node is connected to the first bit line via a first transistor in the first sense amplifier, and the first transistor receives high level control signal during the sense period.

19. The semiconductor memory device according to claim 15, further comprising:

a memory cell array divided in the extending direction of the first word line, into a first and a second areas respectively including the first and second memory cells; and a first row decoder connected to the first word line, wherein the first area locates closer to the first row decoder than the second area.

20. The semiconductor memory device according to claim 15, further comprising:

a memory cell array including the first and second memory cells; and a first row decoder provided under the memory cell array.

21. The semiconductor memory device according to claim 15, further comprising:

a first conductor extending in a first direction and functioning as the first word line;

first and second pillars provided to pass through the first conductor, the first and second pillars respectively functioning as first and second memory cells at intersections with the first conductor; and a third pillar provided on the first conductor and electrically connected to the first conductor, wherein an interval between the third pillar and the first pillar, as viewed in the first direction, is shorter than an interval between the third pillar and the second pillar, as viewed in the first direction.

* * * * *